United States Patent
Furukawa et al.

(10) Patent No.: US 12,424,348 B2
(45) Date of Patent: Sep. 23, 2025

(54) TRANSPARENT ELECTRODE AND ELECTRONIC DEVICE EQUIPPED WITH SAME

(71) Applicant: Konica Minolta, Inc., Tokyo (JP)

(72) Inventors: Shun Furukawa, Sagamihara (JP); Shinya Otsu, Koganei (JP)

(73) Assignee: KONICA MINOLTA, INC., Tokyo (JP)

( * ) Notice: Subject to any disclaimer, the term of this patent is extended or adjusted under 35 U.S.C. 154(b) by 805 days.

(21) Appl. No.: 17/603,802

(22) PCT Filed: Apr. 13, 2020

(86) PCT No.: PCT/JP2020/016330
§ 371 (c)(1),
(2) Date: Oct. 14, 2021

(87) PCT Pub. No.: WO2020/218067
PCT Pub. Date: Oct. 29, 2020

(65) Prior Publication Data
US 2022/0208412 A1 Jun. 30, 2022

(30) Foreign Application Priority Data
Apr. 26, 2019 (JP) ................................. 2019-084978

(51) Int. Cl.
| | |
|---|---|
| *H01B 1/22* | (2006.01) |
| *B32B 15/04* | (2006.01) |
| *C23C 14/00* | (2006.01) |
| *H10K 50/816* | (2023.01) |
| *H10K 85/10* | (2023.01) |
| *H01B 5/14* | (2006.01) |
| *H10K 102/00* | (2023.01) |

(52) U.S. Cl.
CPC ............ *H01B 1/22* (2013.01); *H10K 50/816* (2023.02); *H10K 85/111* (2023.02); *H10K 85/141* (2023.02); *H10K 85/151* (2023.02); *H01B 5/14* (2013.01); *H10K 2102/331* (2023.02)

(58) Field of Classification Search
None
See application file for complete search history.

(56) References Cited

U.S. PATENT DOCUMENTS

2015/0096610 A1* 4/2015 Okubo .................. H10K 30/50
136/263

FOREIGN PATENT DOCUMENTS

| | | |
|---|---|---|
| CN | 203930742 U | 11/2014 |
| EP | 1965438 A2 | 9/2008 |
| JP | 2014-032792 A | 2/2014 |
| WO | 2013/151141 A1 | 10/2013 |
| WO | 2013/172225 A1 | 11/2013 |

OTHER PUBLICATIONS

Office Action dated Jul. 25, 2023 for the corresponding Chinese application No. 202080031204.5, English translation, 11 pages.
An Office Action dated Dec. 5, 2022 for the corresponding Chinese application No. 202080031204.5, with English translation.
JPO, Japanese Office Action mailed May 14, 2024 for the related Japanese application No. 2021-516006, with English Machine translation, 6 pages.
Office Action dated Apr. 17, 2023 for the corresponding Chinese application No. 202080031204.5, with English translation.
PCT, Written Opinion of ISA for the corresponding application No. PCT/JP2020/016330, dated Jul. 7, 2020, with English translation.
PCT, International Search Report for the corresponding application No. PCT/JP2020/016330, dated Jul. 7, 2020, with English translation.
Office Action mailed on Apr. 29, 2021 in the corresponding Taiwanese Patent Application No. 109113434, with English translation.

* cited by examiner

*Primary Examiner* — Sheeba Ahmed
(74) *Attorney, Agent, or Firm* — LUCAS & MERCANTI, LLP

(57) ABSTRACT

A transparent electrode has at least a conductive material layer on a transparent substrate. The conductive material layer is a metal nanowire layer. The transparent electrode has an organic layer containing a nitrogen-containing aromatic heterocyclic compound having a structure represented by the following Formula (1) adjacent to the metal nanowire layer,

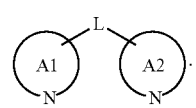

Formula (1)

In Formula (1), A1 and A2 represent a reside that forms a 6-membered nitrogen-containing aromatic heterocycle together with a nitrogen atom, and the 6-membered nitrogen-containing aromatic heterocycle may form a fused ring, L represents a single bond or a linking group derived from an aromatic hydrocarbon ring, an aromatic heterocycle or an alkyl group.

11 Claims, 1 Drawing Sheet

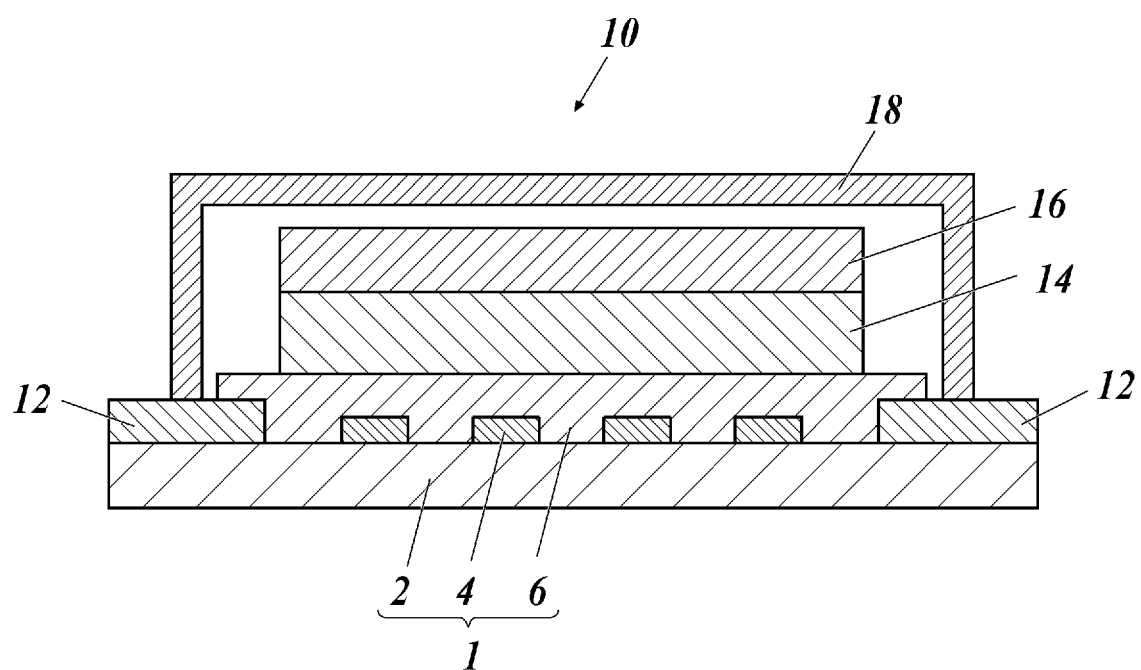

TRANSPARENT ELECTRODE AND ELECTRONIC DEVICE EQUIPPED WITH SAME

CROSS REFERENCE TO RELATED APPLICATION

This Application is a 371 of PCT/JP2020/016330 filed on Apr. 13, 2020, which claims priority of Japanese patent application no. 2019-084978 filed on Apr. 26, 2019, and the above applications are incorporated herein by reference.

TECHNICAL FIELD

The present invention relates to a transparent electrode. More specifically, the present invention relates to a transparent electrode having both low resistance and high light transmittance and excellent storage stability, and an electronic device provided with the transparent electrode.

BACKGROUND

In recent years, as smartphones and tablets have become widespread, information terminals that require an operation using a touch panel have been increasing. Further, the information terminal is required to have added value such as thinness, lightness, and flexibility, and there is a concern that an electrode or a touch panel made of a conventional metal oxide may be cracked or broken.

As one of the means for solving the above problems, an electrode using a metal nanowire such as silver has been proposed. However, since the metal nanowire causes aggregation (migration) by moisture, ionic source, or an electric field, there is a problem that it is difficult to form a high-definition wiring pattern. When the electrode is formed with a silver nanowire, adjacent electrodes may be connected and short-circuited, or one nanowire may elute and break. Further, the formation of aggregation causes turbidity of the thin film due to the scattering component, and it is difficult to maintain the characteristics as a transparent electrode.

Patent Document 1 discloses an electrode having an anti-reflection layer and an anti-glare layer for improving transmittance. This is a technique for realizing a high light transmittance by optical adjustment. Although it is expected to improve the transmittance to some extent by reducing the reflection of the silver nanowire, since the absorption depending on the amount of silver nanowire does not change, it is not possible to achieve both low resistance and high light transmittance.

Patent Document 2 discloses a technique in which an optical adjustment layer is provided adjacent to a silver nanowire in order to improve the transmittance, and high light transmittance is realized by optical adjustment. However, no mention is made of materials that have the function of preventing aggregation of metal nanowires.

Therefore, there is a high demand for a technology that uses a metal nanowire to prevent the aggregation of metals, thereby forming a high-definition wiring pattern, achieving both low resistance and high light transmittance, and providing a transparent electrode with excellent storage stability.

PRIOR ART DOCUMENTS

Patent Documents

Patent Document 1: European Patent No. 1965438
Patent Document 2: Chinese Application for a utility model No. 203930742

SUMMARY OF THE INVENTION

Problems to be Solved by the Invention

The present invention was made in view of the above problems and status. An object of the present invention is to provide a transparent electrode having both low resistance and high light transmittance and excellent storage stability, and an electronic device provided with the same.

Means to Solve the Problems

In order to solve the above-mentioned problems, the present inventor has found the following in the process of examining the causes of the above-mentioned problems. That is, it has been found that a transparent electrode having a layer containing a nitrogen-containing aromatic heterocyclic compound having a specific structure adjacent to a metal nanowire layer may interact with a metal in the metal nanowire layer to suppress diffusion of the metal, and as a result, a transparent electrode having both low resistance and high light transmittance and excellent storage stability may be obtained.

In other words, the above problem according to the present invention is solved by the following means.

1. A transparent electrode having at least a conductive material layer on a transparent substrate,
    wherein the conductive material layer is a metal nanowire layer, and
    the transparent electrode has an organic layer containing a nitrogen-containing aromatic heterocyclic compound having a structure represented by the following Formula (1) adjacent to the metal nanowire layer.

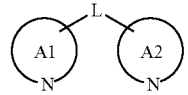

Formula (1)

In Formula (1), A1 and A2 represent a residue that forms a 6-membered nitrogen-containing aromatic heterocycle together with a nitrogen atom, and the 6-membered nitrogen-containing aromatic heterocycle may form a fused ring. L represents a single bond or a linking group derived from an aromatic hydrocarbon ring, an aromatic heterocycle or an alkyl group.

2. The transparent electrode described in item 1, wherein the metal nanowire layer comprises a silver nanowire.

3. The transparent electrode described in item 1 or 2, wherein a wire length of the metal nanowire layer is 1.0 μm or more.

4. The transparent electrode described in any one of items 1 to 3, wherein a wire diameter of the metal nanowire layer is 100 nm or less.

5. The transparent electrode described in any ore of items 1 to 4, wherein an aspect ratio of the wire of the metal nanowire layer is 100 or more.

6. The transparent electrode described in any one of items 1 to 5, wherein the nitrogen-containing aromatic heterocyclic compound has a structure represented by the following Formula (2).

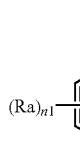

Formula (2)

In Formula (2), Ra, Rb and Rc each independently represents a hydrogen atom or a substituent. n1 represents an integer of 1 to 4. Provided that a linking position with the linking group L in the above Formula (I) is a substitutable position on a substituent represented by Ra, Rb and Rc, or a substitutable position other than a position where Ra, Rb and Rc are present as a substituent in a quinazoline ring.

7. The transparent electrode described in any ore of items 1 to 5, wherein the nitrogen-containing aromatic heterocyclic compound has a structure represented by the following Formula (3).

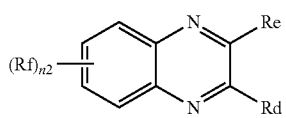

Formula (3)

In Formula (3), Re, Rd and Rf each independently represents a hydrogen atom or a substituent. n2 represents an integer of 1 to 4. Provided that a linking position with the linking group L in the above Formula (1) is a substitutable position on a substituent represented by Re, Rd and Rf. or a substitutable position other than a position where Re, Rd and Rf are present as a substituent in a quinoxaline ring.

8. The transparent electrode described in any ore of items 1 to 5, wherein the nitrogen-containing aromatic heterocyclic compound has a structure represented by the following Formula (4).

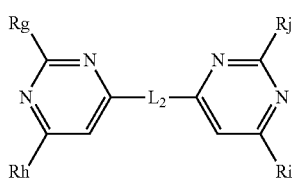

Formula (4)

In Formula (4), Rg, Rh, Ri and Rj each independently represents a hydrogen atom or a substituent. At least one of Rg, Rh, Ri or Rj represents a 6-membered aromatic heterocycle, and the 6-membered aromatic heterocycle may forma fused ring. $L_2$ represents a single bond or a linking group derived from an aromatic hydrocarbon ring, an aromatic heterocycle or an alkyl group.

9. The transparent electrode described in any one of items 1 to 5, wherein the nitrogen-containing aromatic heterocyclic compound has a structure represented by the following Formula (5).

Ar—(Rk)$_{n3}$   Formula (5)

In Formula (5), Ar represents a residue of carbazole, dibenzofuran, azadibenzofuran, dibenzothiophene, azadibenzothiophene, azacarbazole, naphthalene, anthracene, phenanthrene or fluorene. Rk represents a hydrogen atom or a substituent. At least 2 of Rks represent a 6-membered aromatic heterocycle, and the 6-membered aromatic heterocycle may form a fused ring. n3 represents 2 or more.

10. The transparent electrode described in any one of items 1 to 5, wherein the nitrogen-containing aromatic heterocyclic compound has a structure represented by the following Formula (6).

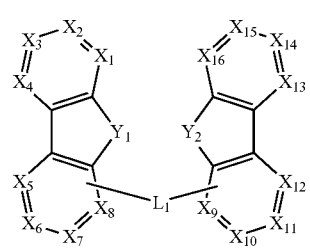

Formula (6)

$Y_1$ and $Y_2$ represent O, S or N—$R_1$. $X_1$ to $X_{16}$ represent C—$R_2$ or N. At least 2 of $X_1$ to $X_{16}$ represent N. $L_1$ represents a single bond, an aromatic hydrocarbon ring, an aromatic heterocycle or an alkyl group. $R_1$ and $R_2$ represent an aromatic hydrocarbon ring, an aromatic heterocycle or an alkyl group.

11. An electronic device comprising the transparent electrode described in any ore of items 1 to 10.

Effects of the Invention

According to the above-mentioned means of the present invention, it is possible to provide a transparent electrode having both low resistance and high light transmittance and excellent storage stability, and an electronic device provided with the same.

The expression mechanism or action mechanism of the effect of the present invention is not clarified, but is inferred as follows.

In order to produce a transparent electrode having sufficiently low resistance and high light transmission by a metal nanowire layer containing a metal as a conductive material, particularly silver or an alloy containing silver as a main component, since the formation of a uniform thin layer in which the metal nanowire layer acts as an electrode is required, it is necessary to set conditions under which the formation of a non-uniform thin layer due to aggregation does not occur.

However, the bonding forme between metal atoms is said to be correlated with the enthalpy of sublimation. Since the enthalpy of sublimation of silver is very high, about 285 kJ/mol, it has a strong bonding force between silver atoms. Therefore, since migration and aggregation of a silver nanowire also occur easily, it is difficult to obtain a transparent electrode having excellent stability and having both low resistance and high light transmittance.

However, according to the transparent electrode of the present invention, it has been found that, by interacting with an organic compound containing a nitrogen atom that constitutes an organic layer adjacent to a silver atom, the diffusion distance of silver atoms on the surface of the organic layer is reduced, and the aggregation action of silver atoms may be suppressed. Therefore, it is presumed that, as a result of suppressing the occurrence of migration of silver atoms and making it possible to form a nanowire layer having excellent stability, a transparent electrode having sufficiently low resistance and high light transmittance was obtained.

Since the compound having a structure represented by the above Formula (1) has an aromatic heterocycle containing a nitrogen atom in the molecule, it interacts with a metal and fixes the metal. That is, diffusion of metal may be suppressed.

Here, in a general aromatic heterocyclic compound containing a nitrogen atom, an interaction with a metal is weak, and an effect of suppressing diffusion of a metal is weak. Therefore, as a result of extensive studies by the inventors, it has been found that a strong effect may be obtained mainly in the case of compounds that form the following two interactions (compounds having the following structure A and structure B).

A: When a nitrogen (N) atom is present at the ortho position of the fused ring structure.

B: When there are many freely rotating nitrogen (N) atoms in the molecule, the two molecules interact with each other.

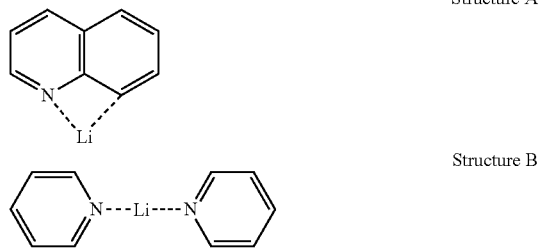

Therefore, in the case of the compound having the structure represented by the above Formulas (2), (3) and (6) as the compound having the above structure A or in the case of the compound having the structure represented by the above Formulas (4) and (5) as the compound having the above structure B, it is inferred that the diffusion of a metal may be surely suppressed, and as a result, a transparent electrode having both low resistance and high light transmittance and excellent storage stability may be obtained.

BRIEF DESCRIPTION OF THE DRAWINGS

The FIGURE is a cross-sectional view showing an example of an organic EL element having a transparent electrode of the present invention.

EMBODIMENTS TO CARRY OUT THE INVENTION

The transparent electrode of the present invention is a transparent electrode having at least a conductive material layer on a transparent substrate, wherein the conductive material layer is a metal nanowire layer, and the transparent electrode has an organic layer containing a nitrogen-containing aromatic heterocyclic compound having a structure represented by Formula (1) adjacent to the metal nanowire layer. This feature is a technical feature common to or corresponding to the embodiments described below.

According to an embodiment of the present invention, from the viewpoint of expressing the effect of the present invention, it is preferable that the metal nanowire layer is a silver nanowire, the wire length of the metal nanowire is 1.0 μm or more, the wire diameter is 100 nm or less, and the aspect ratio is 100 or more in the point of obtaining a transparent electrode having a lower resistance, high light transmission, and excellent storage stability.

It is preferable that the nitrogen-containing aromatic heterocyclic compound having a structure represented by the above Formula (1) has a structure represented by the above Formulas (2), (3), (4), (5) and (6) from the viewpoint of obtaining a transparent electrode having lower resistance and high light transmittance and excellent storage stability.

By providing the transparent electrode of the present invention, the electronic device of the present invention can provide an electronic device having low resistance, high light transmission, and excellent storage stability.

Hereinafter, the present invention, its constituent elements, and configurations and embodiments for carrying out the present invention will be described in detail. In the present application, "to" is used in the meaning that the numerical values described before and after "to" are included as a lower limit value and an upper limit value.

<<Outline of Transparent Electrode of the Present Invention>>

The transparent electrode of the present invention is a transparent electrode having at least a conductive material layer on a transparent substrate, wherein the conductive material layer is a metal nanowire layer, and the transparent electrode has an organic layer containing a nitrogen-containing aromatic heterocyclic compound having a structure represented by the following Formula (1) adjacent to the metal nanowire layer.

<Ion Migration and Effect of Nitrogen-Containing Aromatic Heterocyclic Compound>

There are various theories about the mechanism of ion migration of metals such as silver, and it has not been completely clarified. It is generally considered to progress in stages. Specifically, first, the penetration of moisture into the electrodes is started, and ionization occurs due to the potential difference between the electrodes and the presence of water. In this case, in particular, silver or copper is easily reacted with sulfur or chlorine, and therefore, it is considered that ionization is more promoted in the presence. Next, the ionized metal ions move from the anode to the cathode, and the diffused metal ions are reduced by the cathode and precipitated, thereby growing the metal deposition from the cathode to the anode.

It is considered that by providing the electrode layer composed of the adjacent organic layer having the nitrogen-containing aromatic heterocyclic compound aid the metal nanowire layer, the metal atoms constituting the electrode layer interact with the compound containing the nitrogen atoms that constitutes the organic layer, the diffusion distance of the metal atoms at the interface of the functional layer is reduced, and the aggregation and diffusion of silver are suppressed.

The adjacent organic layer containing the nitrogen-containing aromatic heterocyclic compound is hereinafter simply referred to as an "organic layer". The organic layer may be adjacent to the upper portion of the metal nanowire layer, it may be adjacent to the lower portion, and also it may be configured to be provided on both sides and sandwiched. In the case where the organic layer is provided at the lower portion, when forming the metal nanowire layer, the metal nanowires diffuse to the organic layer side, since the distance between the metal nanowires is shortened, it is possible to reduce the inter-wire resistance. As a result, it is possible to reduce the amount of metal nanowires, it is possible to achieve both high light transmittance and low resistance of the electrode. In the case where the organic layer is provided on the upper portion, the nitrogen-containing aromatic heterocyclic compound is disposed so as to penetrate into the gap of the metal nanowire, whereby the stabilization of the metal nanowire may be effectively promoted.

Thus, the configuration of the transparent electrode of the present invention is exemplified by: a transparent substrate/organic layer/metal nanowire layer; or a transparent substrate/metal nanowire layer/organic layer, or a transparent substrate/organic layer/metal nanowire layer/organic layer.

The transparent electrode of the present invention may have yet other functional layers adjacent to each of the above layers. Examples of the other functional layer include a smoothing layer, a gas barrier layer, an antistatic layer, an easy-adhesion layer, an antireflective layer, a light scattering layer, a hard coat layer or an overcoat layer. Among them, it is preferable that the electrode has an overcoat layer. In this case, configurations such as a transparent substrate/organic layer/metal nanowire layer/overcoat layer, a transparent substrate/metal nanowire layer/organic layer/overcoat layer, or a transparent substrate/organic layer/metal nanowire layer/organic layer/overcoat layer may be exemplified. Further, the organic layer and the overcoat layer may be combined, and for example, a layer in which the overcoat material and the nitrogen-containing aromatic heterocyclic compound are mixed may be formed.

The term "transparent" as used in the "transparent electrode" of the present invention means that the light transmittance at a wavelength of 500 nm is 50% or more. It is more preferable that the light transmittance is 60% or more, and it is more preferable that the light transmittance is 65% or more. The optical transmittance may be measured according to JIS K-7375 to a sample humidified in an air-conditioned room at 23° C. and 55% RH for 24 hours.

Hereinafter, the configuration of the transparent electrode of the present invention will be described in detail.

[1] Transparent Substrate

The transparent substrate is a plate-like body capable of carrying a metal nanowire layer. In order to obtain a transparent electrode, a substrate having a total light transmittance of 80% or more in the visible light wavelength region measured by the method according to the test method conforming to JIS K 7361-1: 1997 (Test method of total light transmittance of plastic-transparent materials) is preferably used.

The transparent substrate may be a glass substrate made of alkali-free glass, low alkali glass, or soda-lime glass, but is preferably a resin substrate for flexibility and weight reduction.

As the resin substrate, for example, a resin film is suitably cited, and it is preferable to use a transparent resin film from the viewpoint of productivity and performance such as lightness and flexibility. The transparent resin film refers to a transparent resin film having a total light transmittance of 60% or more, preferably 80% or more in the visible-light wavelength range measured by a method conforming to JIS K 7361-1: 1997 (Test method of total light transmittance of plastic-transparent materials).

There is no particular limitation on the transparent resin film which may be used, and the material, shape, structure, and thickness thereof may be appropriately selected from known ones.

Examples thereof include: polyester-based resin films made of polyethylene terephthalate (PET), polyethylene naphthalate, and modified polyester, polyolefin-based resin films made of polyethylene (PE), polypropylene (PP), polystyrene, and cyclic olefin resin; vinyl-based resin films made of polyvinyl chloride and polyvinylidene chloride, a polyetheretherketone (PEEK) resin film, a polysulphone (PSF) resin film, a polyethersulphone (PES) resin film, a polycarbonate (PC) resin film, a polyamide resin film, a polyimide resin film, an acrylic resin film, and triacetyl cellulose (TAC) resin film.

As long as it is a transparent resin film having a total light transmittance of 80% or more described above, it is preferably used as a resin substrate used in the present invention. Among them, from the viewpoint of transparency, heat resistance, ease of handling, strength and cost, a biaxially oriented polyethylene terephthalate film, a biaxially oriented polyethylene naphthalate film, a polyether sulfone film, or a polycarbonate film is preferred, and a biaxially oriented polyethylene terephthalate film or a biaxially oriented polyethylene naphthalate film is more preferred.

In order to ensure wettability and adhesion of the coating liquid, the resin substrate used in the present invention may be subjected to surface treatment or may be provided with an easy-adhesion layer. Conventional known techniques may be used for the surface treatment and the easy-adhesion layer.

For example, as the surface treatment, a surface activation treatment such as a corona discharge treatment, a flame treatment, an ultraviolet treatment, a high frequency treatment, a glow discharge treatment, an active plasma treatment, or a laser treatment may be mentioned.

Further, examples of the substance of the easy-adhesion layer include polyester, polyamide, polyurethane, vinyl copolymer, butadiene copolymer, acrylic copolymer, vinylidene copolymer, and epoxy copolymer. The easy-adhesion layer may be a single layer, but may have a configuration of 2 or more layers in order to improve adhesion.

A gas barrier layer made of a coating of an inorganic substance or an organic substance, or a hybrid coating of both of them may be formed on the front surface or the back surface of the film substrate.

The barrier film preferably has a barrier function of a water vapor permeability of $1 \times 10^{-3}$ g/m$^2$·24 h or less (at 25±0.5° C., and 90±2% RH) determined based on JIS K 7129-1992. Further, high barrier films are preferred to have an oxygen permeability of $1 \times 10^{-3}$ ml/m$^2$·24 h·atm or less determined based on JIS K 7126-1987, and a water vapor permeability of $1 \times 10^{-3}$ g/m$^2$·24 h or less (at 25±0.5° C., and 90±2% RH).

The material for forming the barrier film formed on the front surface or the back surface of the film substrate in order to obtain a high barrier film may be a material having a function of suppressing infiltration of a material that causes deterioration of elements such as moisture and oxygen. For example, it is possible to employ silicon oxide, silicon dioxide, and silicon nitride. Further, in order to improve the brittleness of the aforesaid film, it is more preferable to achieve a laminated layer structure of inorganic layers and organic layers. The laminating order of the inorganic layer and the organic layer is not particularly limited, but it is preferable that both are alternatively laminated a plurality of times.

<<Gas Barrier Layer>>

When a transparent electrode is applied to an organic electronic device such as an organic electroluminescent (EL) element, if a trace amount of moisture or oxygen exists inside the element, performance deterioration may occur. In order to prevent moisture and oxygen from diffusing into the element through the resin substrate, it is effective to form a gas barrier layer having a high shielding ability against moisture and oxygen on the resin substrate.

Gas barrier film forming methods are not particularly limited. Examples of employable methods include a vacuum deposition method, a sputtering method, a reactive sputtering method, a molecular beam epitaxy method, a cluster ion beam method, an ion plating method, a plasma polymerization method, a plasma CVD method, a laser CVD method, a thermal CVD method, and a coating method. The methods by an atmospheric pressure plasma polymerization method as described in JP-A 2004-48143 are also preferred. Also preferred is a method in which the polysilazane compound containing liquid is applied and dried by a wet coating method, and the formed coating film is irradiated with vacuum ultraviolet light (VUV light) having a wavelength of 200 nm or less to perform a modification treatment on the formed coating film to form a gas barrier layer.

The thickness of the gas barrier layer is preferably within a range of 1 to 500 mu, and more preferably within a range of 10 to 300 nm. When the thickness of the gas barrier layer is 1 m or more, desired gas barrier performance may be exhibited, and when it is 500 nm or less, degradation of film quality such as generation of cracks in a dense silicon oxynitride film may be prevented.

The polysilazane compound is a polymer having a silicon-nitrogen bond, and is a ceramic-precursor inorganic polymer such as a $SiO_2$, $Si_3N_4$ made of Si—N, Si—H, or N—H bond, and an intermediate solid solution of both having a structure $SiO_xN_y$.

The application method of the polysilazane compound may be selected from any suitable method, for example, in addition to various printing methods such as a roll coating method, a bar coating method, a dip coating method, a spin coating method, a casting method, a die coating method, a blade coating method, a curtain coating method, a spray coating method, and a doctor coating method, various application methods such as a gravure printing method, a flexographic printing method, an offset printing method, a screen printing method, and an inkjet printing method may be used.

When it is preferable to form the gas barrier layer in a pattern shape, it is preferable to use a gravure printing method, a flexographic printing method, an offset printing method, a screen printing method, or an inkjet printing method.

<<Hard Coat Layer>>

When the resin substrate has a hard coat layer on its surface, durability and smoothness are improved. It is preferable that the hard coat layer is formed of a curable resin.

Examples of the curable resin include thermosetting resins such as an epoxy resin, a cyanate ester resin, a phenol resin, a bismaleimide-triazine resin, a polyimide resin, an acrylic resin, and a vinylbenzyl resin, and active energy ray-curable resins such as an ultraviolet curable urethane acrylate-based resin, an ultraviolet curable polyester acrylate-based resins, an ultraviolet curable epoxy acrylate-based resin, an ultraviolet curable polyol acrylate-based resin, and an ultraviolet curable epoxy resin.

Further, in order to adjust the scratch resistance and the refractive index, the following substances may be added to the hard coat layer: fine particles of inorganic compounds such as silicon oxide, titanium oxide, aluminum oxide, zirconium oxide, or magnesium oxide, or an ultraviolet curable resin composition such as a polymethylacrylate resin powder, an acrylic styrene-based resin powder, a poly methylmethacrylate resin powder, a silicone-based resin powder, a polystyrene-based resin powder, a polycarbonate resin powder, a benzoguanamine-based resin powder, a melamine-based resin powder, a polyolefin-based resin powder, a polyester-based resin powder, a polyamide-based resin powder, a polyimide-based resin powder, or a polyfluorinated ethylene-based resin powder.

In addition, in order to enhance the heat resistance of the hard coat layer, an antioxidant which does not suppress the photocuring reaction may be selected and used. Further, the hard coat layer may contain a silicone-based surfactant, a polyoxyether compound, and a fluorine-siloxane graft polymer.

Examples of an organic solvent contained in a coating liquid for forming a hard coat layer include hydrocarbons (e.g., toluene and xylene), alcohols (e.g., methanol, ethanol, isopropanol, butanol, and cyclohexanol), ketones (e.g., acetone, methyl ethyl ketone, and methyl isobutyl ketone), esters (e.g., methyl acetate, ethyl acetate, and methyl lactate), glycol ether, and other organic solvents. These may be appropriately selected or mixed and used.

Further, it is preferable that the curable resin content contained in the coating liquid is within a range of, for example, 5 to 80% by mass.

The hand coat layer may be coated by a known wet coating method such as a gravure coater, a dip coater, a reverse coater, a wire bar coater, a die coater, and an inkjet method using the above coating liquid.

The layer thickness of the coating liquid is preferably within a range of, for example, 0.1 to 30 μm. Further, before coating the coating liquid on the resin substrate, it is preferable to perform a surface treatment such as vacuum ultraviolet irradiation on the substrate in advance.

A coating film formed by coating a coating liquid is irradiated with active energy rays such as ultraviolet rays to cure a resin. Thus, a hard coat layer is formed.

Examples of the light source used for curing include a low-pressure mercury lamp, a medium-pressure mercury lamp, a high-pressure mercury lamp, an ultra-high-pressure mercury lamp, a carbon arc lamp, a metal halide lamp, and a xenon lamp. Irradiation conditions are preferably within the range of, for example, 50 to 2000 $mJ/cm^2$.

[2] Organic Layer

The transparent electrode of the present invention is characterized in that it has an organic layer containing a nitrogen-containing aromatic heterocyclic compound having a structure represented by the following Formula (1) adjacent to a metal nanowire layer, and since the compound has an aromatic heterocycle containing a nitrogen atom in the molecule, it interacts with a metal and fixes the metal. That is, diffusion of the metal may be suppressed.

Examples of a method for forming the organic layer include a method using a wet process such as a coating method, an inkjet printing method, a coating method, or a dip method, and a method using a dry process such as an evaporation method (a resistance heating method, or an EB method), a sputtering method, or a CVD method. Among them, an inkjet printing method or an evaporation method is preferably applied.

[2.1] Compound Having a Structure Represented by Formula (1)

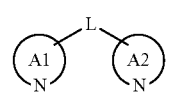

Formula (1)

In Formula (t), A1 and A2 represent a 6-membered nitrogen-containing aromatic heterocycle together with a nitrogen atom, and the 6-membered nitrogen-containing aromatic heterocycle may forma fused ring. L represents a single bond or a linking group derived from an aromatic hydrocarbon ring, an aromatic heterocycle or an alkyl group.

In Formula (1), examples of the 6-membered aromatic heterocycle formed together with a nitrogen atom represented by A1 and A2 include pyridine, pyrimidine, pyrazine, and triazine. Examples of the 6-membered nitrogen-containing aromatic heterocycle having a fused ring include quinazoline, quinoline, isoquinoline, azadibenzofuran, azacarbazole, azadibenzothiophene, benzimidazole ring, benzoquinoline ring, and benzoisoquinoline ring.

Examples of the aromatic hydrocarbon ring used as a linking group represented by L include a benzene ring (a phenyl ring), a biphenyl ring, a terphenyl ring, a naphthalene ring, an anthracene ring, a phenylene ring and a fluorene ring. Examples of the aromatic heterocycle include a carbazole ring, a dibenzofuran ring, an azadibenzofuran ring, a dibenzothiophene ring, an azadibenzothiophene ring, and an azacarbazol ring. Examples of the alkyl group include a methyl group, an ethyl group, an isopopyl group, a propyl group, a butyl group, a t-butyl group, and a hexyl group.

Further, it is preferable that the compound having a structure represented by the above Formula (1) is a compound having a structure represented by any one of the following Formulas (2) to (6).

<Compound Having a Structure Represented by Formula (2)>

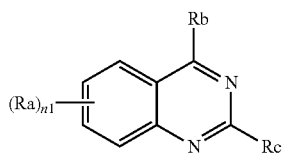

Formula (2)

In Formula (2), Ra, Rb and Rc each independently represents a hydrogen atom or a substituent. n1 represents an integer of 1 to 4. Provided that a linking position with the linking group L in the above Formula (1) is a substitutable position on a substituent represented by Ra, Rb and Rc, or a substitutable position other than a position where Ra, Rb and Rc are present as a substituent in a quinazoline ring.

In Formula (2), examples of the substituent represented by Ra, Rb and Rc include an aromatic hydrocarbon ring, an aromatic heterocycle, an alkyl group, a cyano group, and a halogen atom. Further, the 6-membered aromatic heterocycle represented by at least one of Ra, Rb or Rc is the same as that mentioned in A1 and A2 of the above Formula (1).

<Compound Having a Structure Represented by Formula (3)>

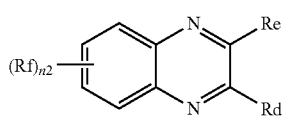

Formula (3)

In Formula (3), Re, Rd and Rf each independently represents a hydrogen atom or a substituent. n2 represents an integer of 1 to 4. Provided that a linking position with the linking group L in the above Formula (1) is a substitutable position on a substituent represented by Re, Rd and Rf. or a substitutable position other than a position where Re, Rd and Rf are present as a substituent in a quinoxaline ring.

In Formula (3), the substituent represented by Re. Rd and Rf is the same as the substituent represented by Ra, Rb and Rc in Formula (2) described above. Further, the 6-membered aromatic heterocycle represented by at least one of Re, Rd or Rf is the same as that mentioned in A1 and A2 of the above Formula (1).

<Compound Having a Structure Represented by Formula (4)>

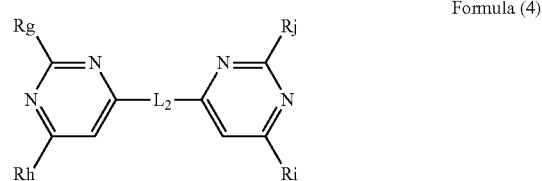

Formula (4)

In Formula (4), Rg, Rh, Ri and Rj each independently represents a hydrogen atom or a substituent. At least one of Rg, Rh, Ri or Rj represents a 6-membered aromatic heterocycle, and the 6-membered aromatic heterocycle may form a fused ring. $L_2$ represents a single bond or a linking group derived from an aromatic hydrocarbon ring, an aromatic heterocycle or an alkyl group.

In Formula (4), the substituent represented by Rg, Rh, Ri and Rj is the same as the substituent represented by Ra, Rb and Rc in Formula (2) described above. Further, the 6-membered aromatic heterocycle represented by at least one of Rg, Rh, Ri or Rj is the same as that mentioned in A1 and A2 of the above Formula (1).

Further, the aromatic hydrocarbon ring, the aromatic heterocycle, and the alkyl group represented by $L_2$ are the same as those mentioned in L of the above Formula (1), respectively.

<Compound Having a Structure Represented by Formula (5)>

Ar—(Rk)$_{n3}$                  Formula (5)

In Formula (5), Ar represents a residue of carbazole, dibenzofuran, azadibenzofuran, dibenzothiophene, azadibenzothiophene, azacarbazole, naphthalene, anthracene, phenanthrene or fluorene. Rk represents a hydrogen atom or a substituent. At least 2 of Rks represent a 6-membered aromatic heterocycle, and the 6-membered aromatic heterocycle may form a fused ring. n3 represents 2 or more.

In Formula (5), the substituent represented by Rk is the same as the substituent represented by Ra. Rb and Rc in Formula (2) described above. Further, the 6-membered aromatic heterocycle represented by Rk is the same as that mentioned in A1 and A2 of the above Formula (1).

<Compound Having a Structure Represented by Formula (6)>

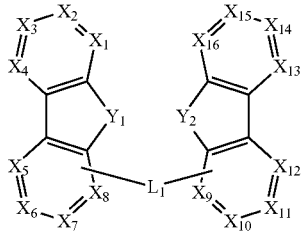

Formula (6)

In Formula (6), $Y_1$ and $Y_2$ represent O, S or N—$R_1$. $X_1$ to $X_{16}$ represent C—$R_2$ or N. At least 2 of $X_1$ to $X_{16}$ is represent N. $L_1$ represents a single bond, an aromatic hydrocarbon ring, an aromatic heterocycle or an alkyl group. $R_1$ and $R_2$ represent an aromatic hydrocarbon ring, an aromatic heterocycle or an alkyl group.

In Formula (6), the aromatic hydrocarbon ring, the aromatic heterocycle, and the alkyl group represented by $L_1$ are the same as those mentioned in L of the above Formula (1), respectively.

Exemplified compounds having the structures represented by the above Formulas (2) to (6) will be described below, but the present invention is not limited thereto.

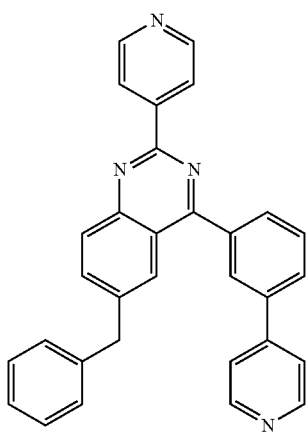

(2)-1

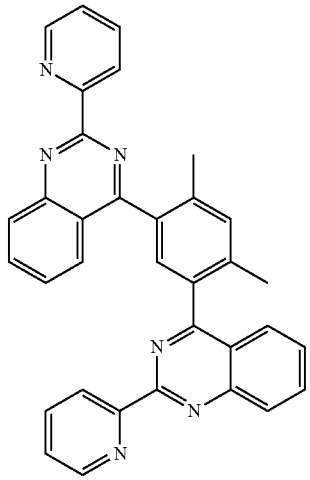

(2)-2

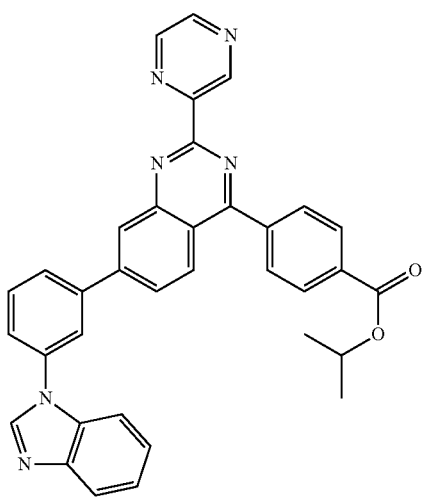

(2)-3

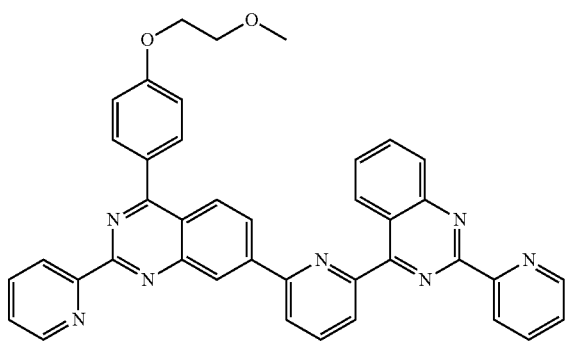

(2)-4

-continued
(2)-5
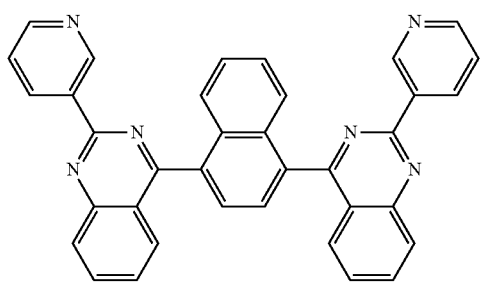
(2)-6
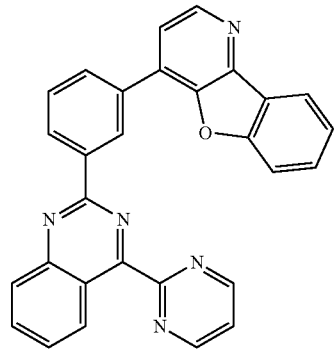
(2)-7
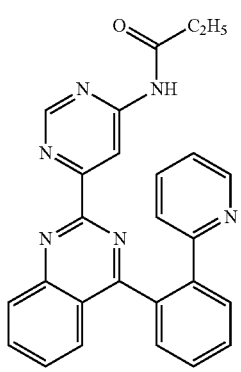
(2)-8
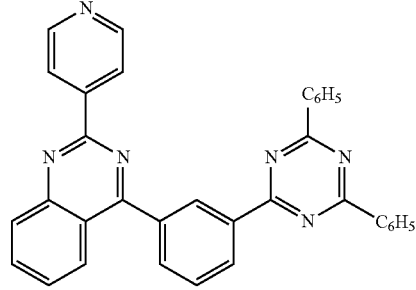
(2)-9
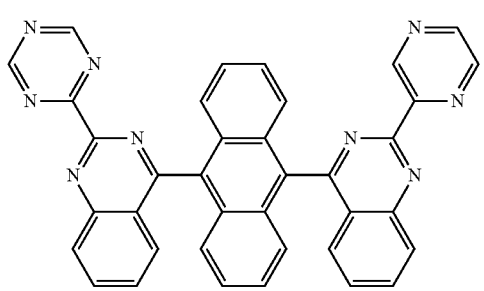
(2)-10
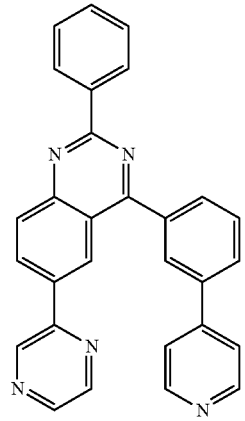

-continued
(2)-11
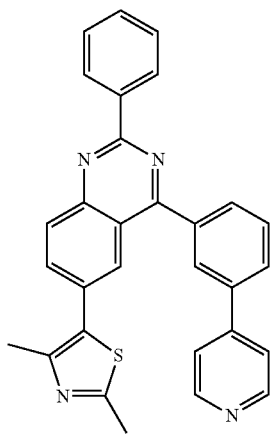
(2)-12
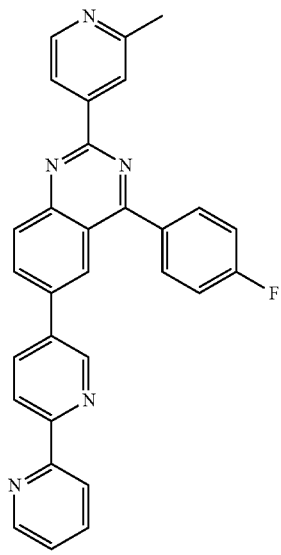
(2)-13
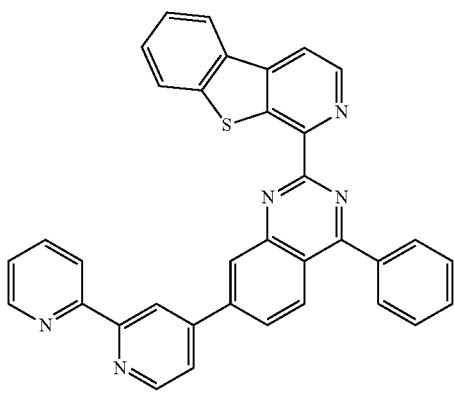
(2)-14
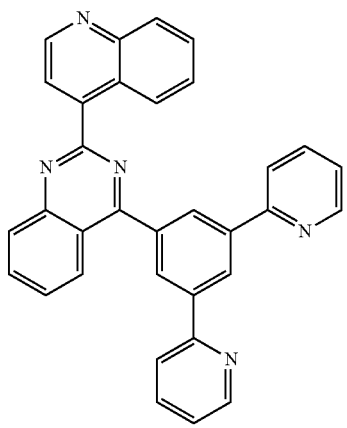
(2)-15
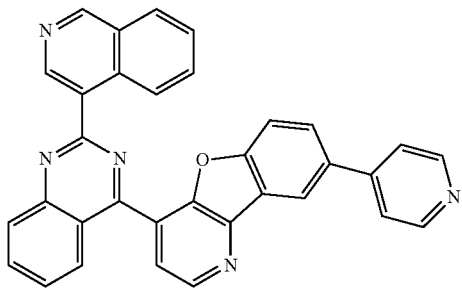
(2)-16
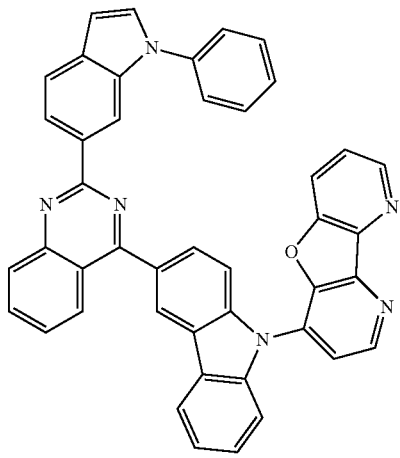

-continued
(2)-17
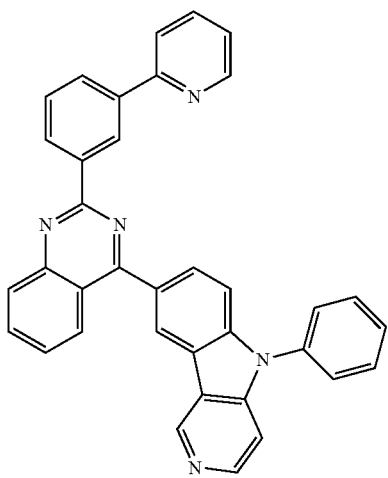
(2)-18
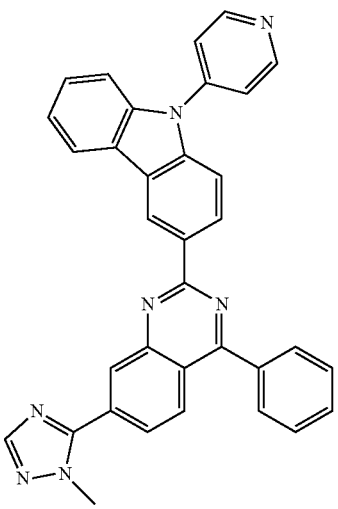
(2)-19
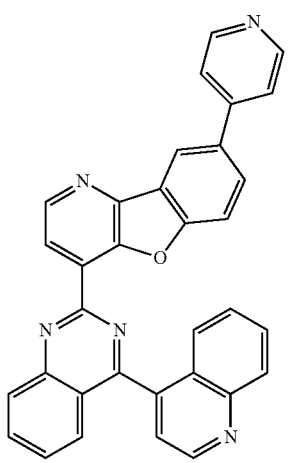
(2)-20
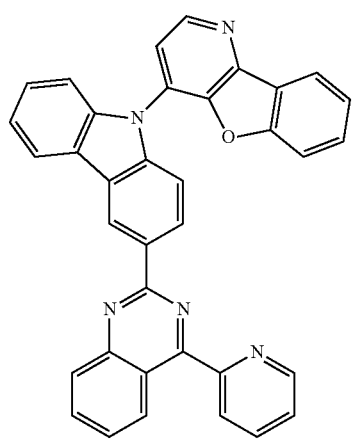
(2)-21
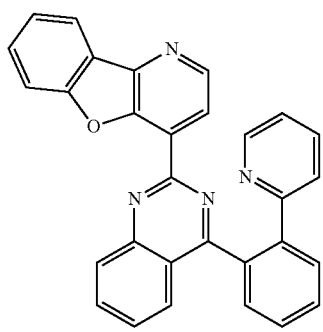
(2)-22
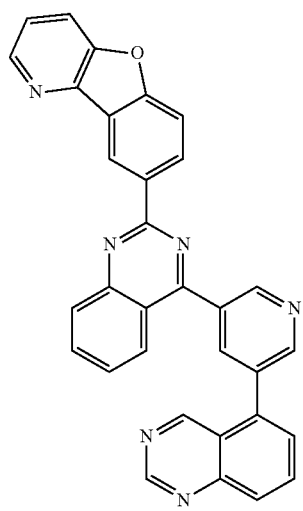

-continued
(2)-23
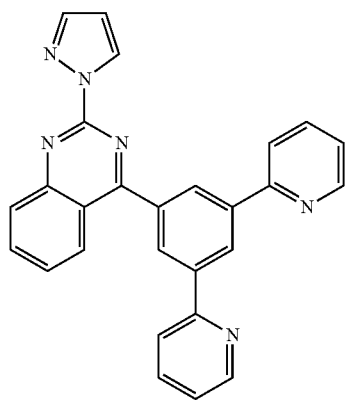
(2)-24
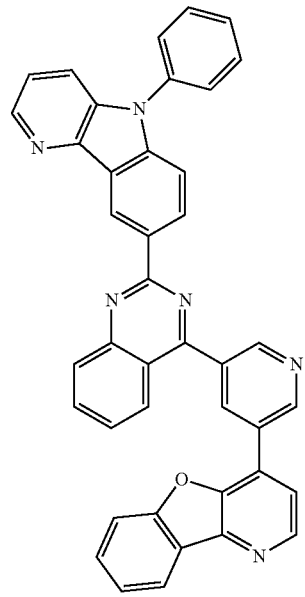
(2)-25
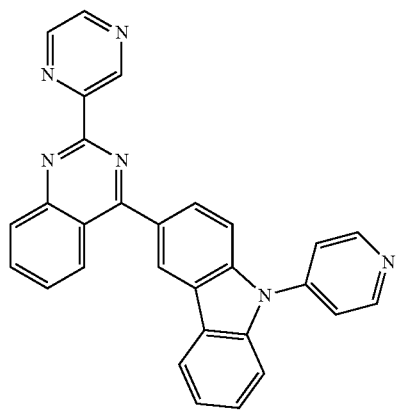
(2)-26
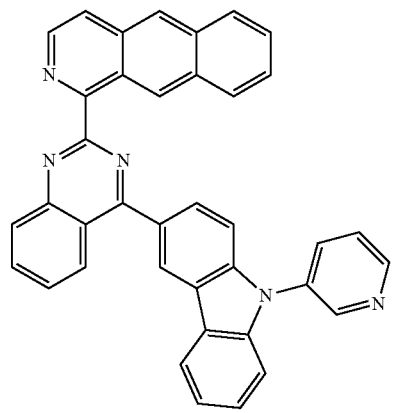
(2)-27
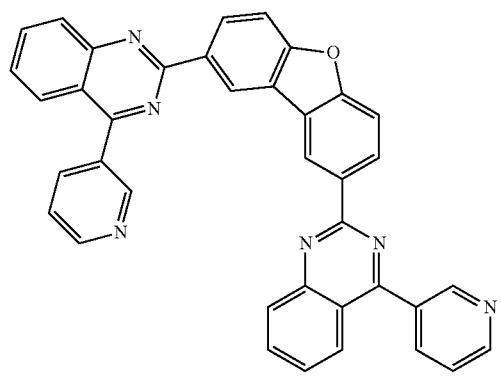
(2)-28
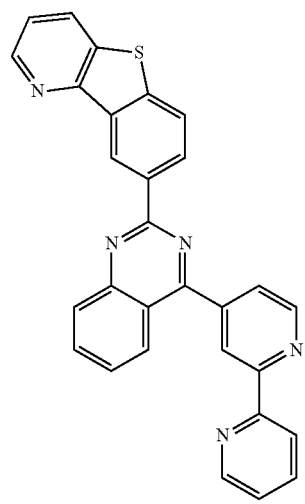

(2)-29
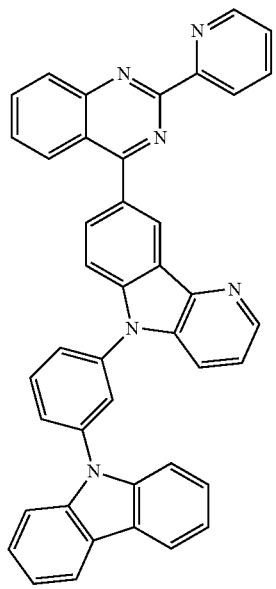
(2)-30
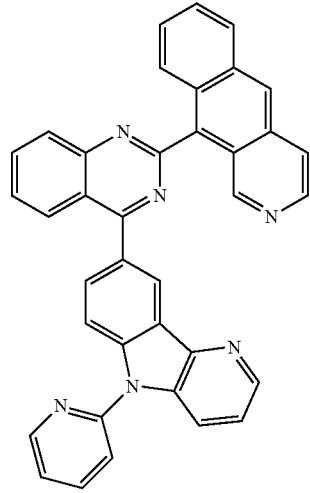
(2)-31
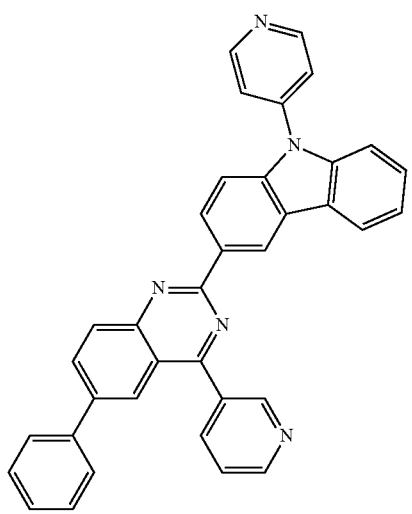
(2)-32
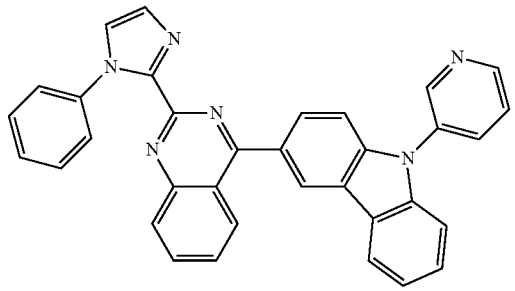
(2)-33
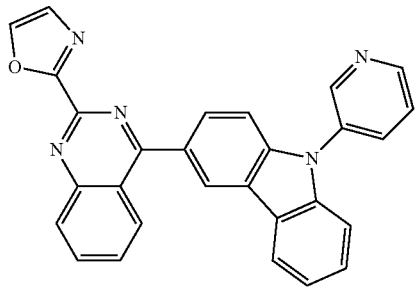
(2)-34
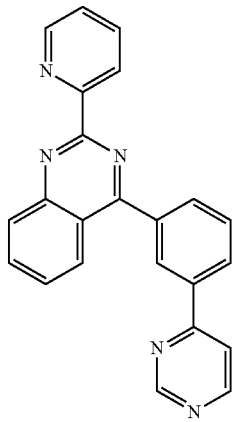

-continued
(2)-35
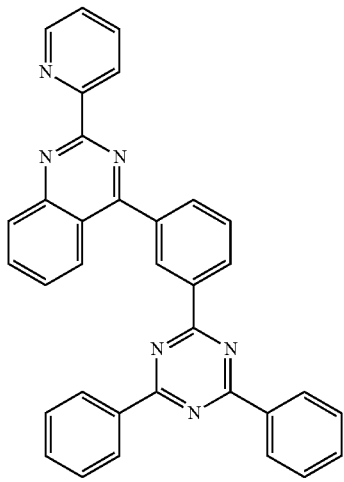
(2)-36
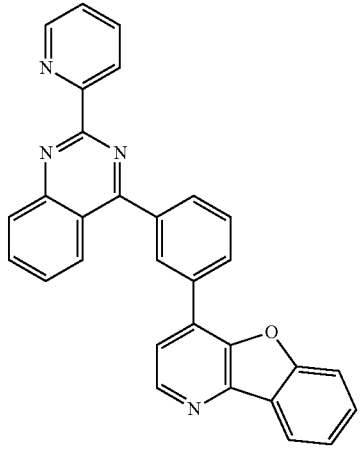
(2)-37
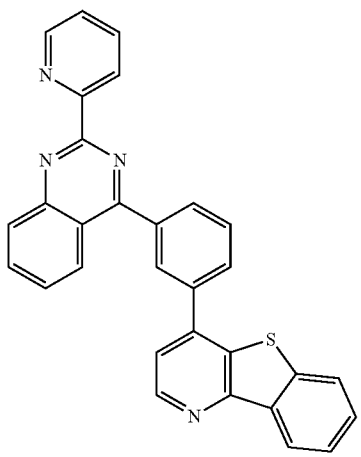
(2)-38
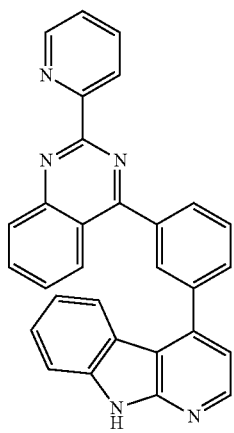
(2)-39
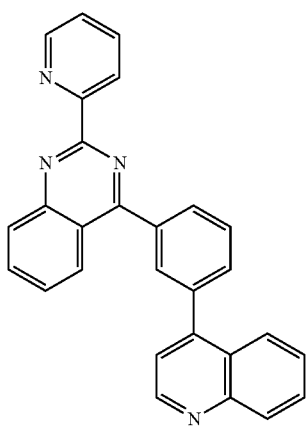
(2)-40
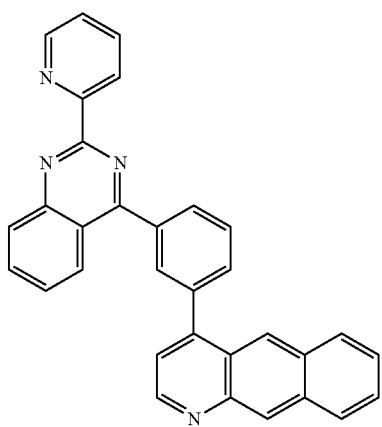

-continued
(2)-41
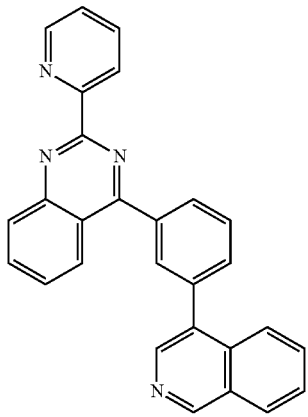
(2)-42
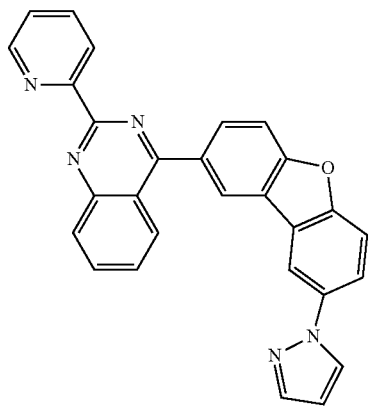
(2)-43
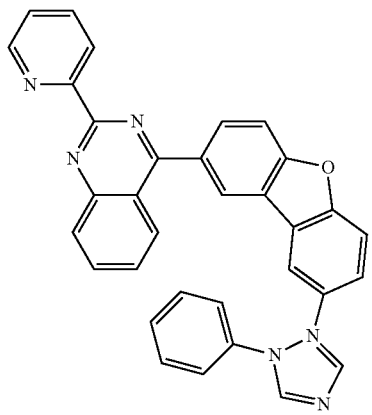
(2)-44
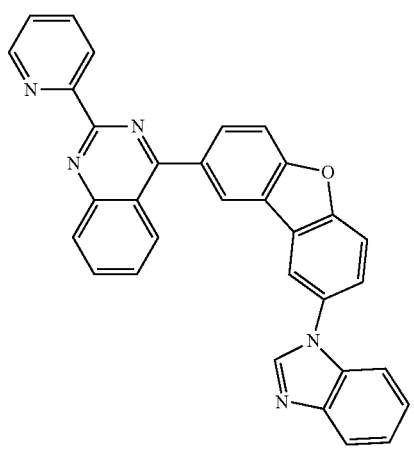
(2)-45
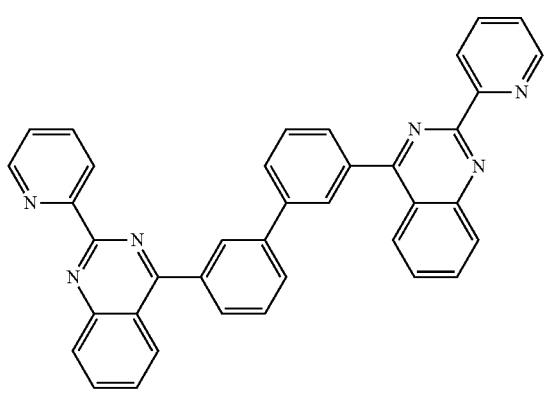
(2)-46
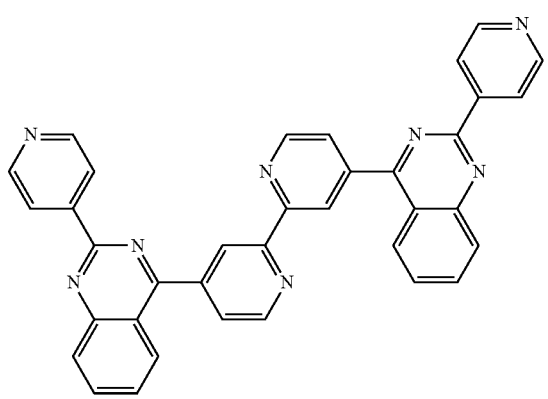
(2)-47
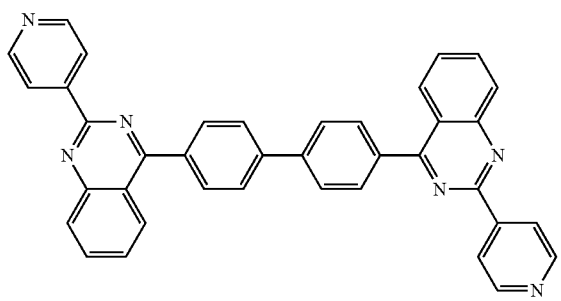
(2)-48
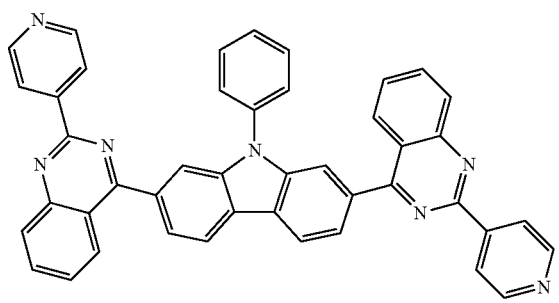

-continued
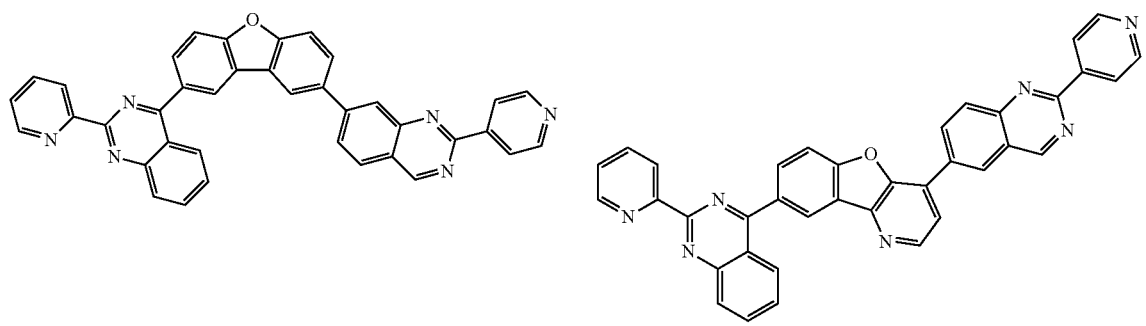
(2)-49
(2)-50
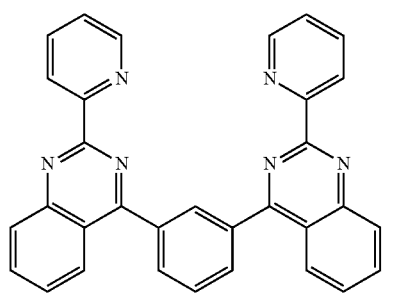
(2)-51
(2)-52
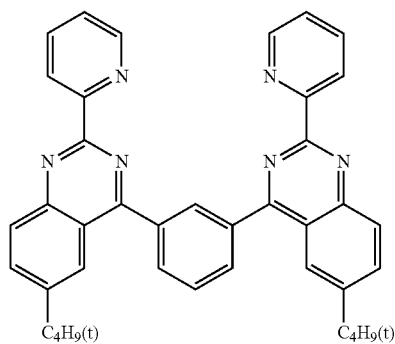
(2)-53
(2)-54
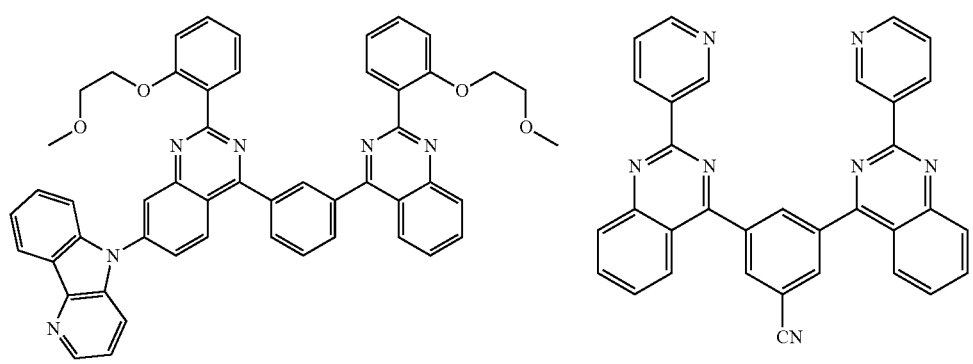
(2)-55
(2)-56

-continued
(2)-57
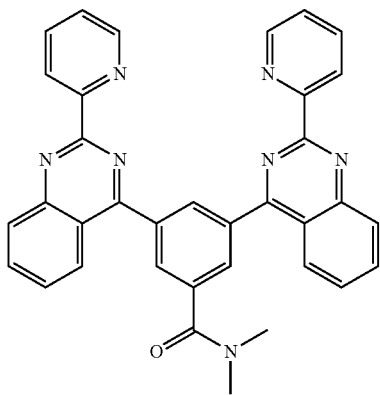
(2)-58
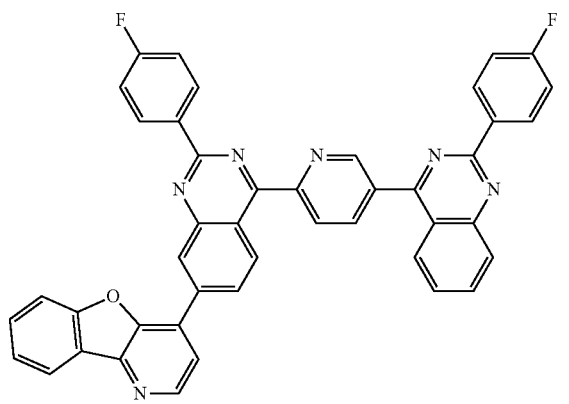
(2)-59
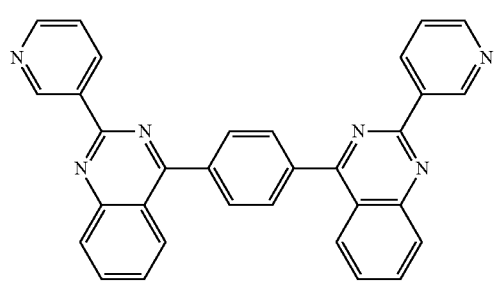
(2)-60
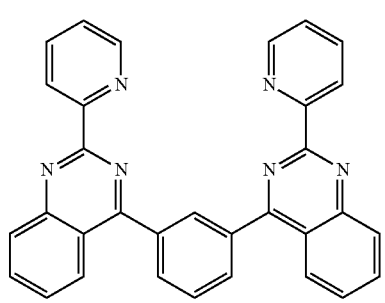
(2)-61
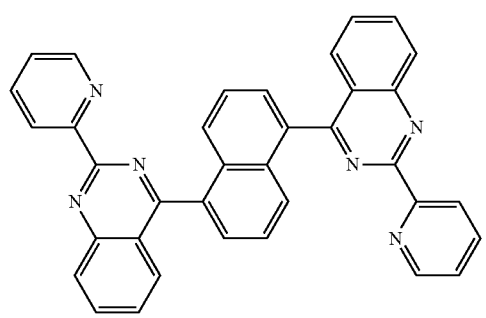
(2)-62
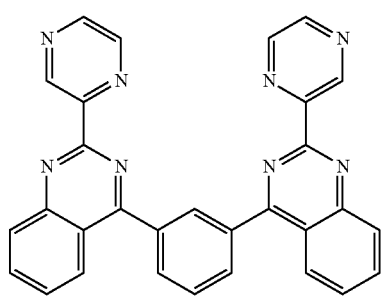
(2)-63
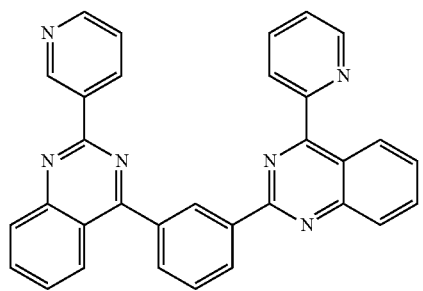
(2)-64
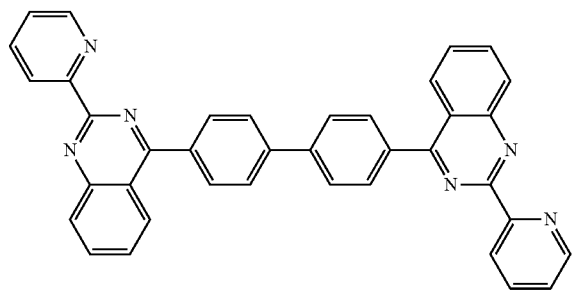

-continued
(2)-65
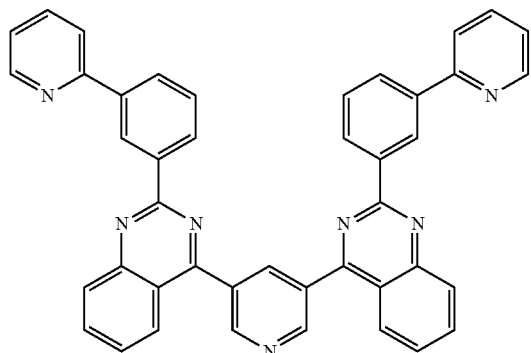
(2)-66
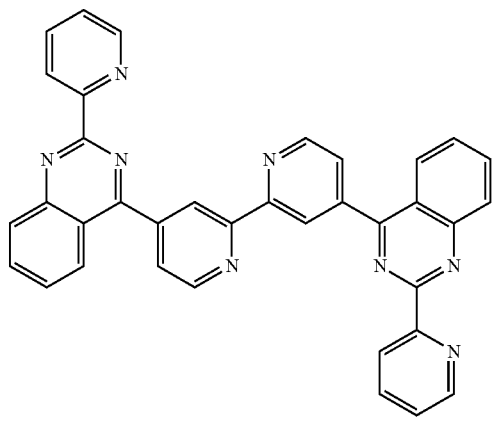
(2)-67
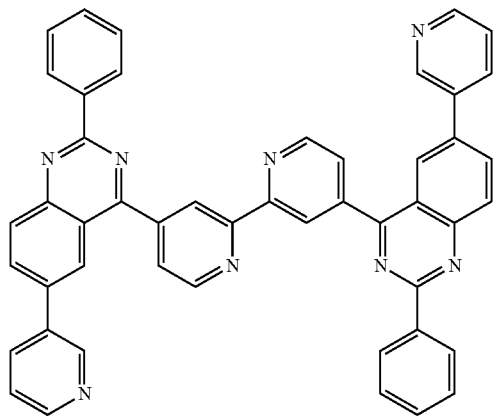
(2)-68
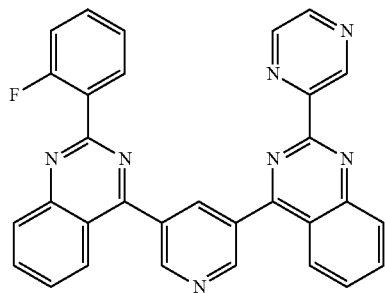
(2)-69
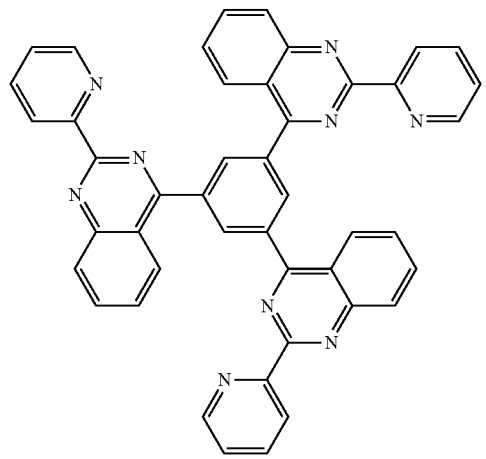
(2)-70
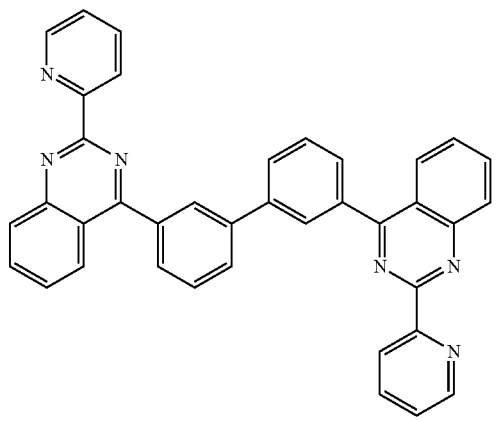

-continued
(2)-71
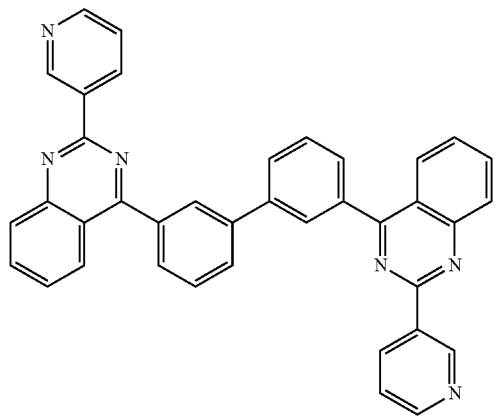
(2)-72
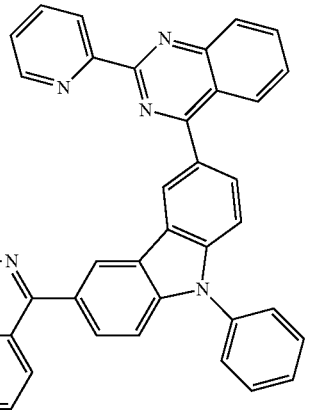
(2)-73
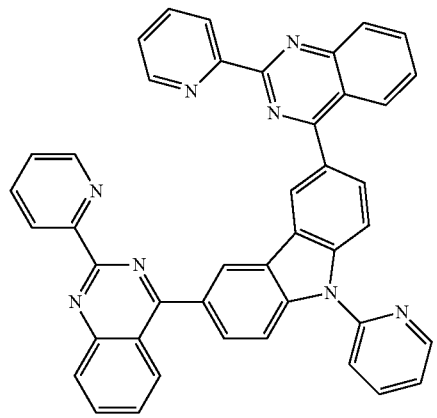
(2)-74
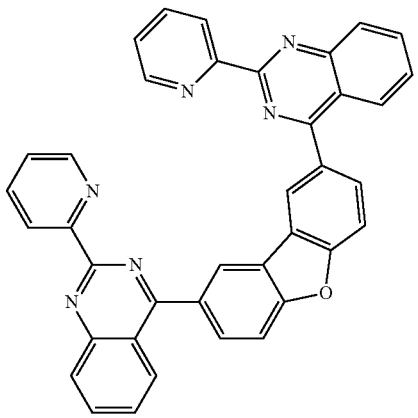
(2)-75
(2)-76
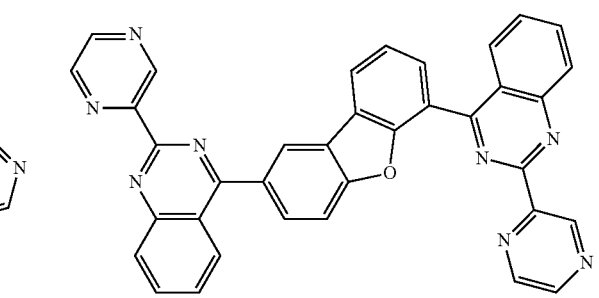
(2)-77
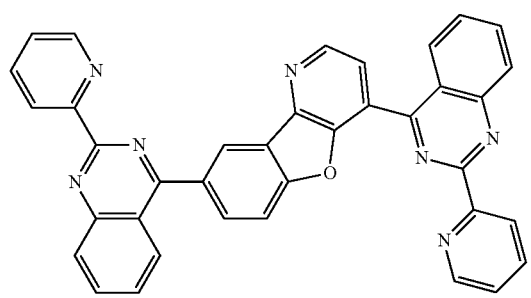
(2)-78
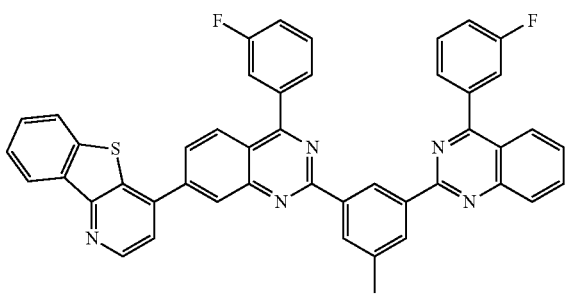

-continued
(2)-79
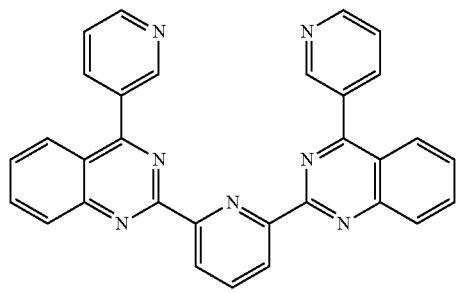
(2)-80
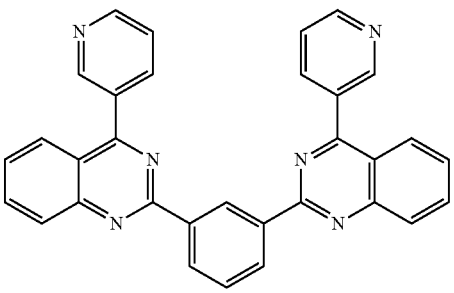
(2)-81
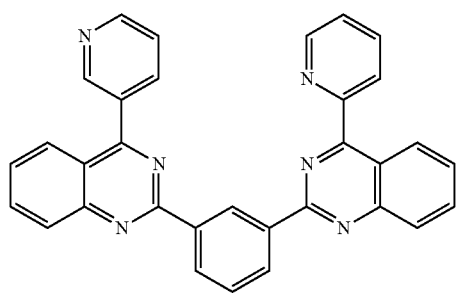
(2)-82
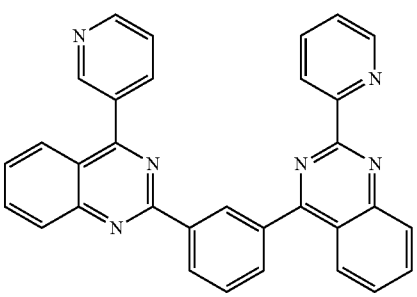
(2)-83
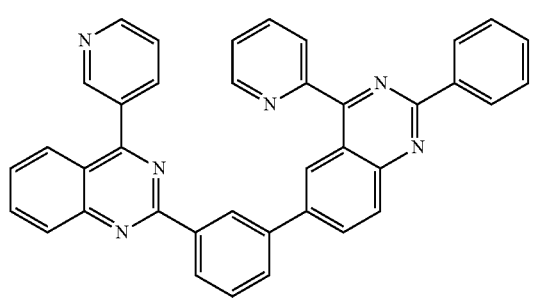
(2)-84
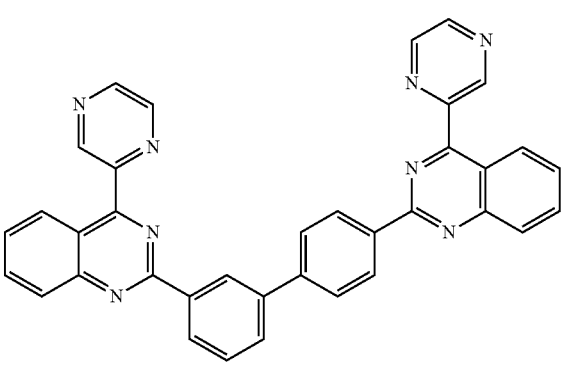
(2)-85
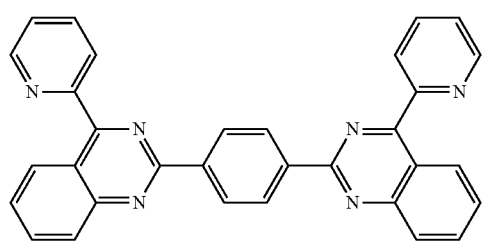
(2)-86
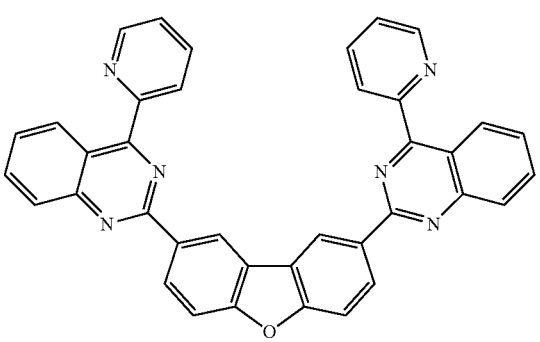
(2)-87
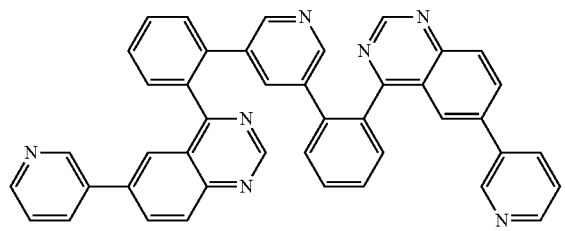
(2)-88
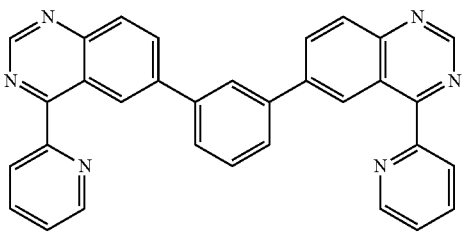

-continued
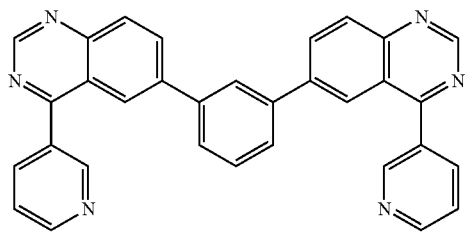
(2)-89
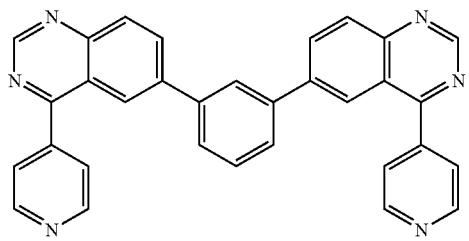
(2)-90
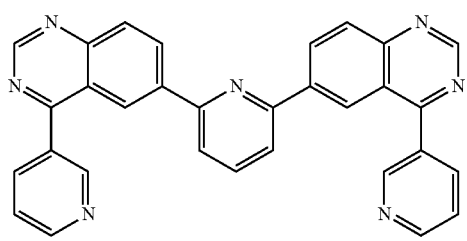
(2)-91
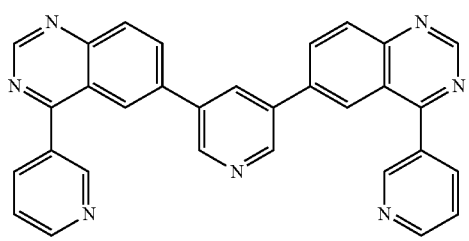
(2)-92
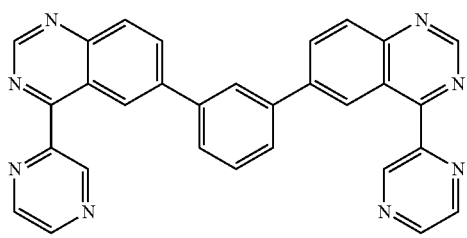
(2)-93
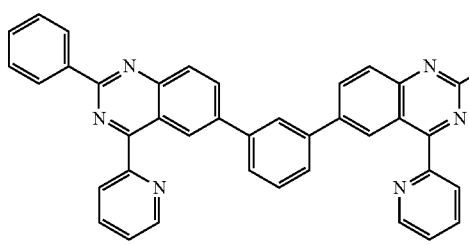
(2)-94
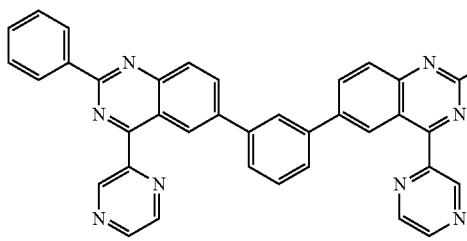
(2)-95
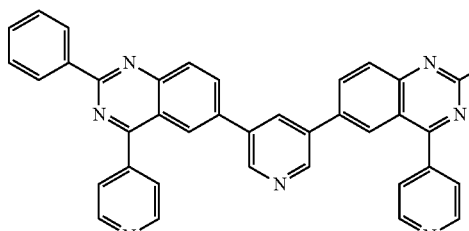
(2)-96
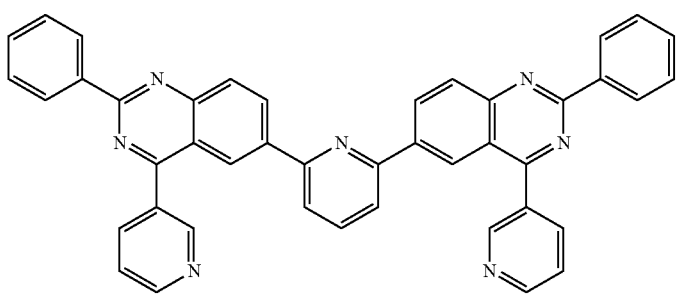
(2)-97
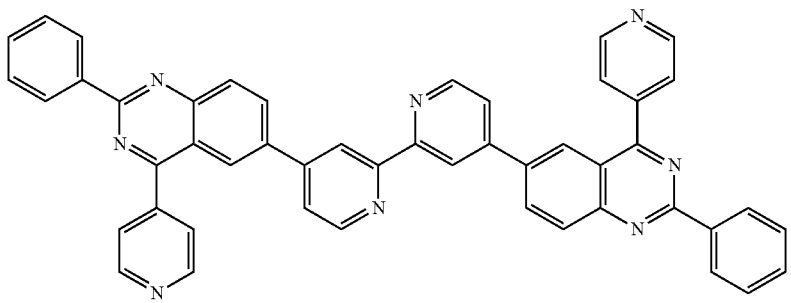
(2)-98

-continued
(2)-99
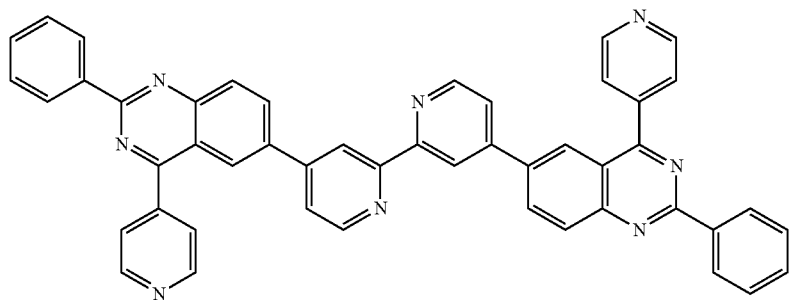
(2)-100 (2)-101
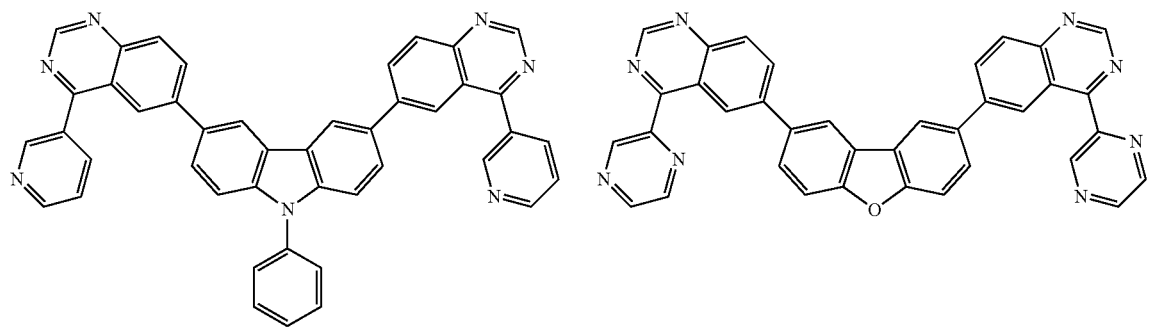
(2)-102 (2)-103
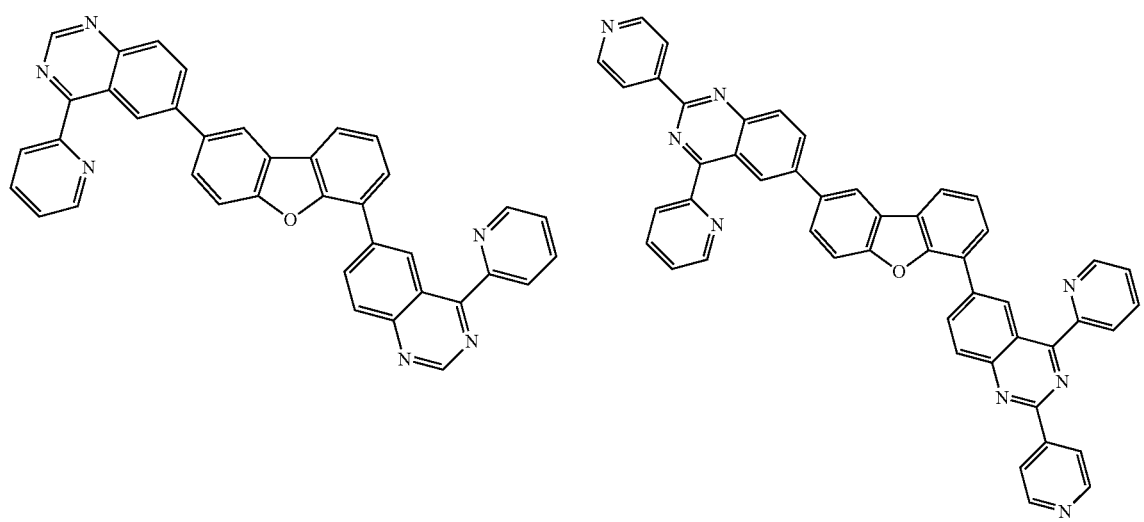

(2)-104
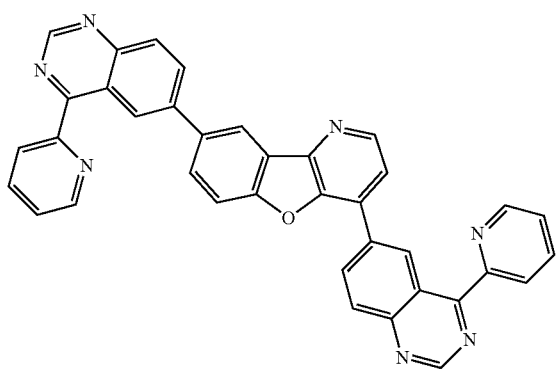
(2)-105
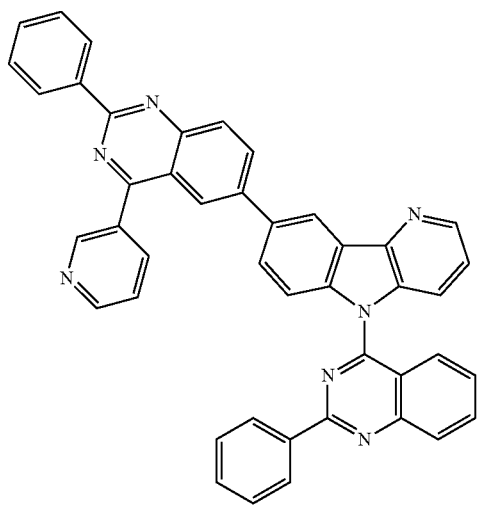
(2)-106
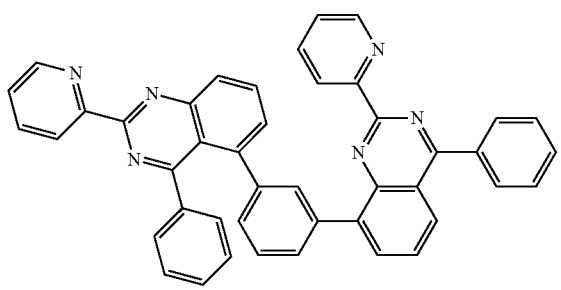
(2)-107
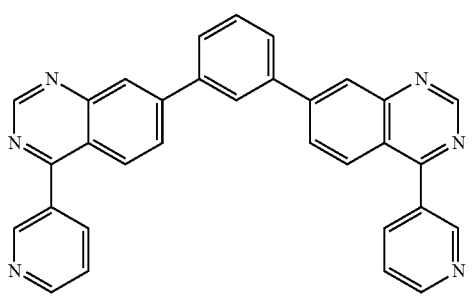
(2)-108
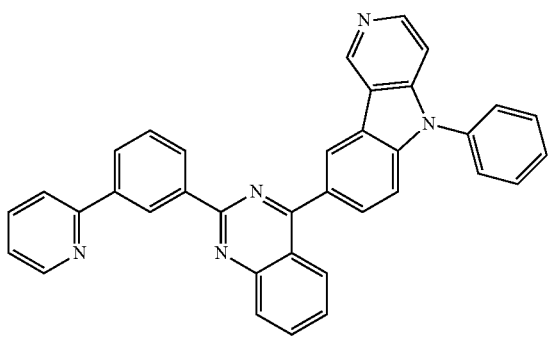
(3)-1
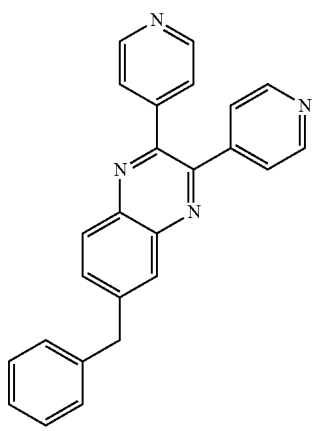

-continued
(3)-2
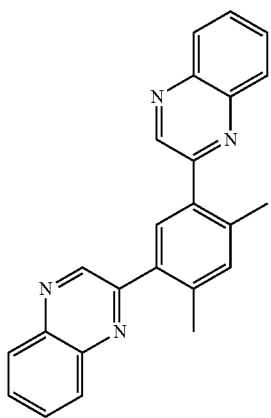
(3)-3
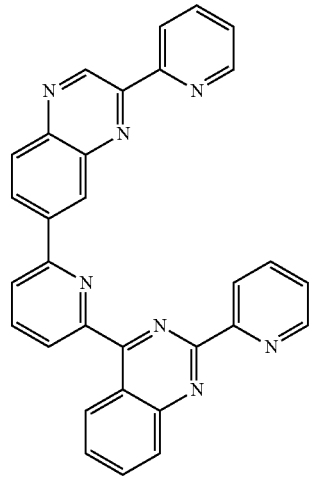
(3)-4
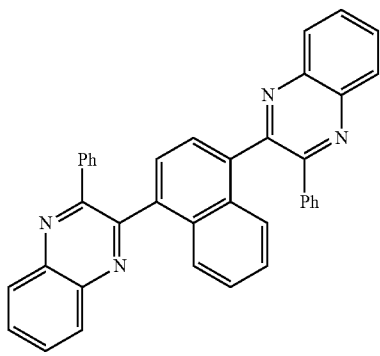
(3)-5
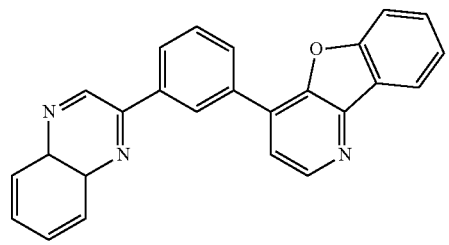
(3)-6
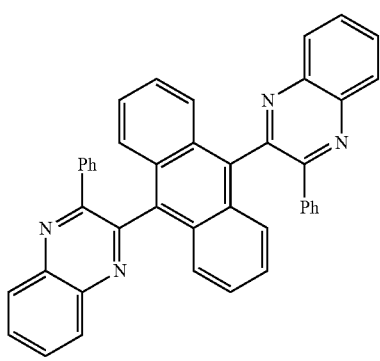
(3)-7
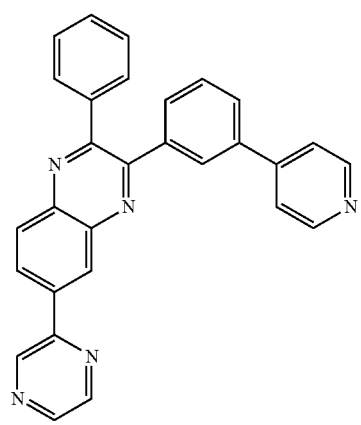

(3)-8
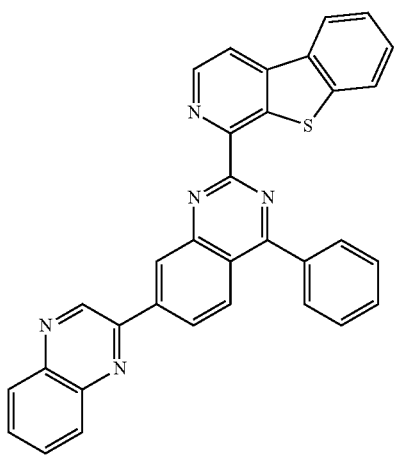
(3)-9
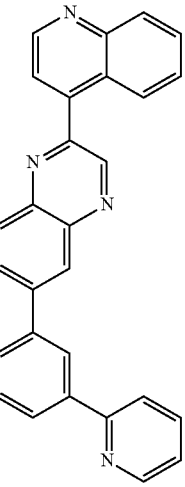
(3)-10
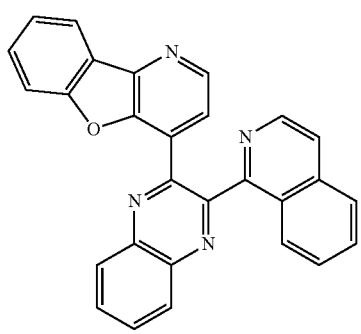
(3)-11
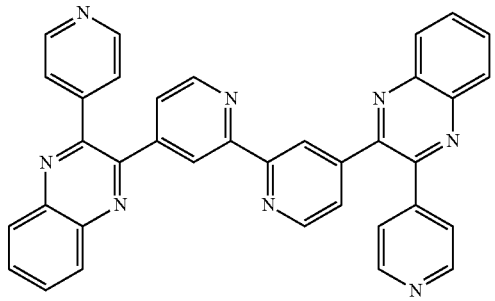
(3)-12
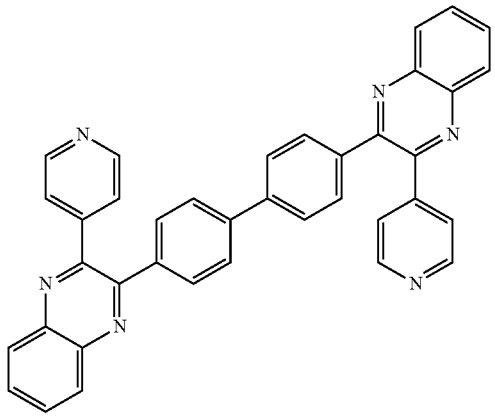
(3)-13
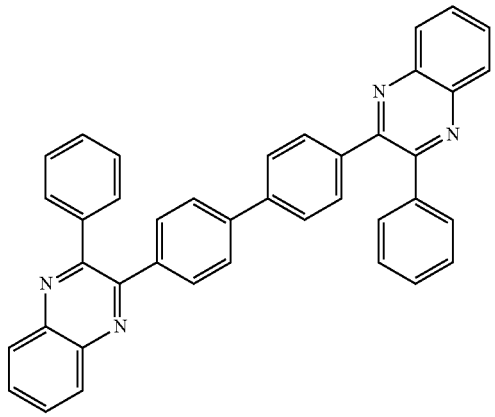
(3)-14
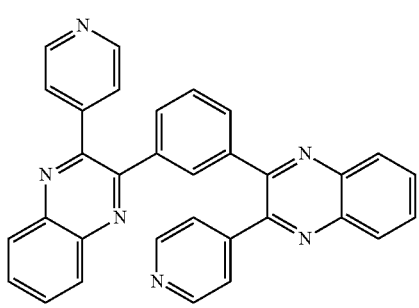
(4)-1
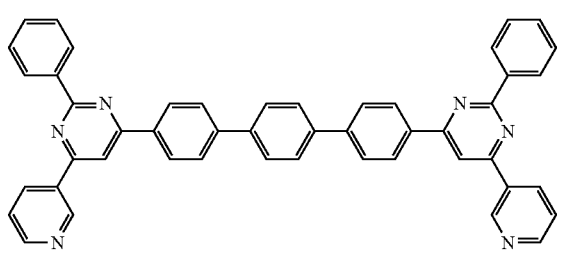

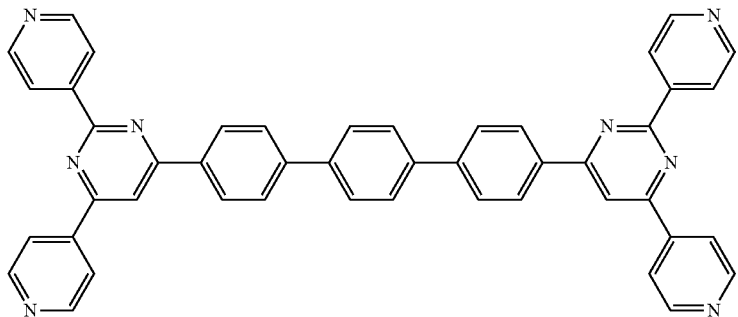
(4)-2
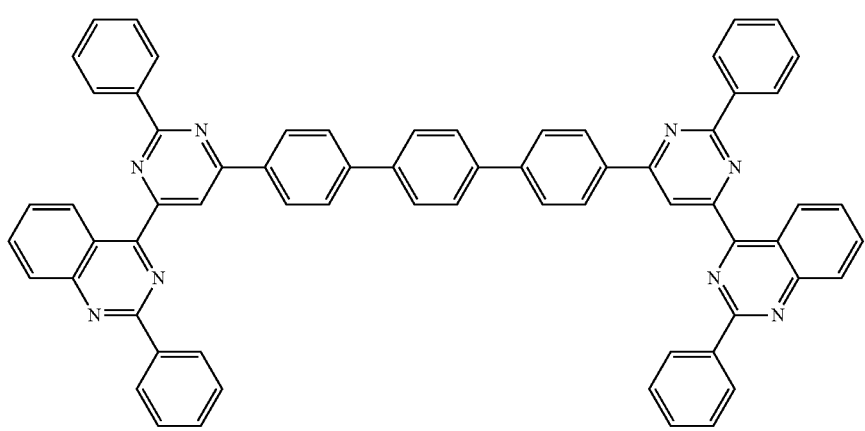
(4)-3
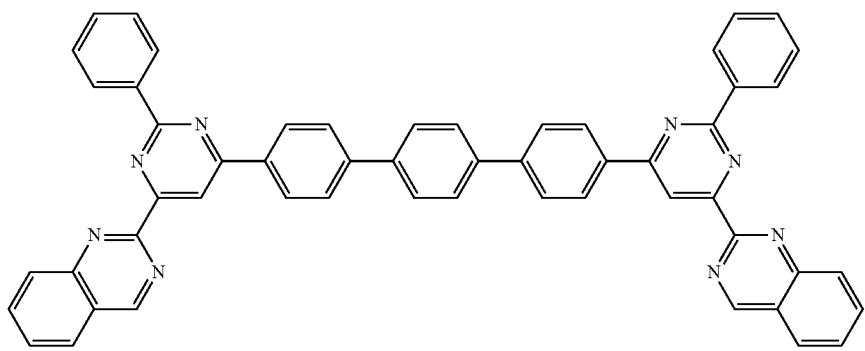
(4)-4
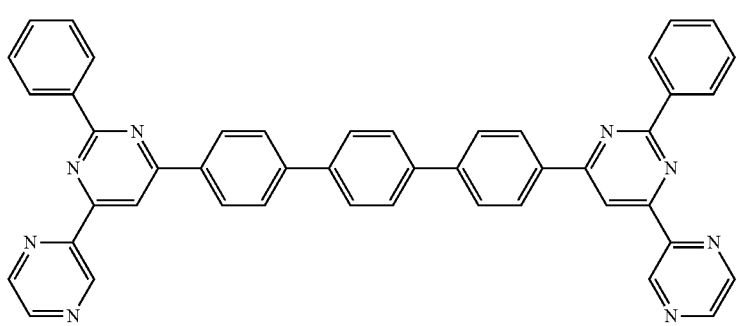
(4)-5

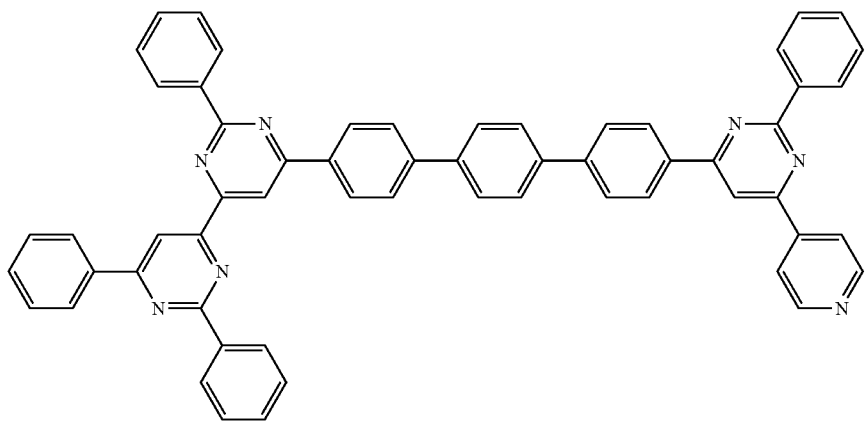
(4)-6
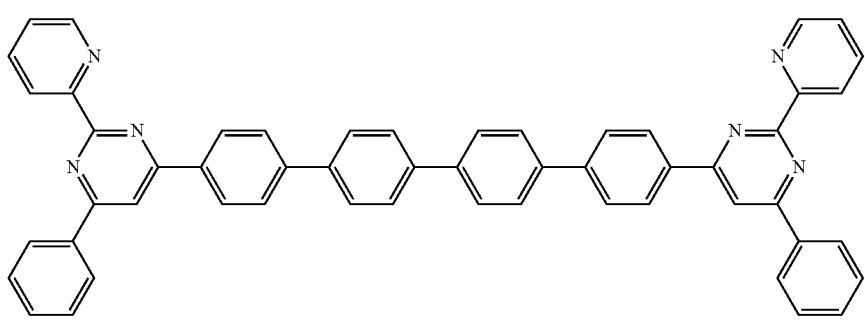
(4)-7
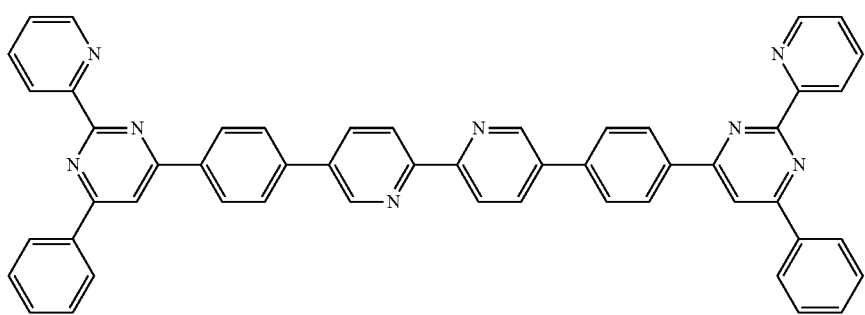
(4)-8
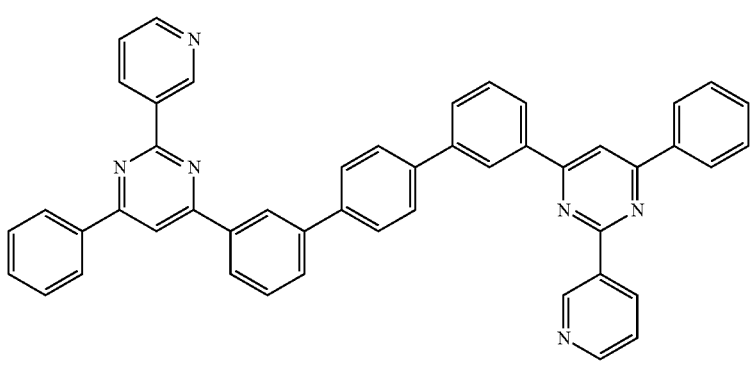
(4)-9

-continued
(4)-10
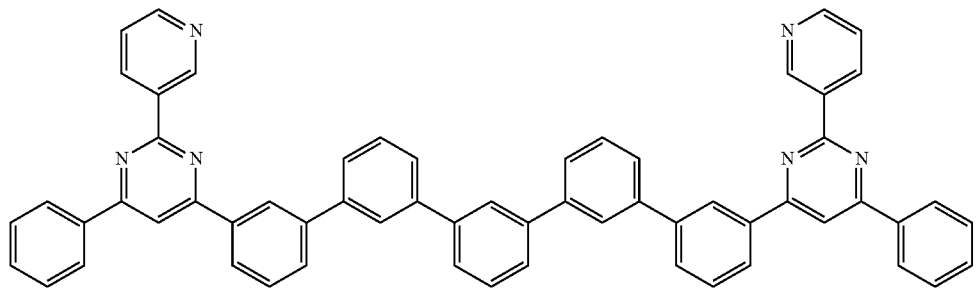
(4)-11
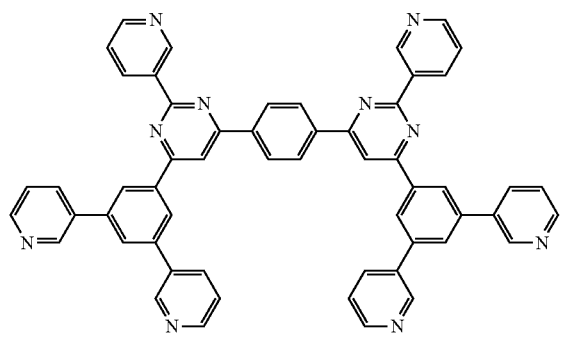
(4)-12
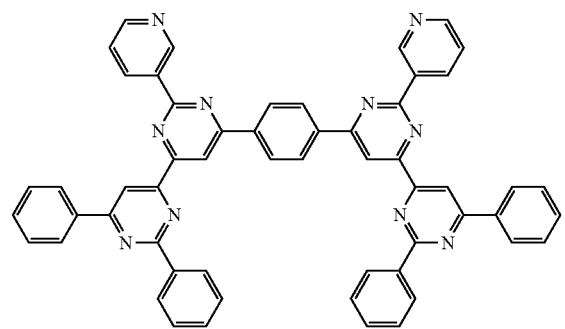
(4)-13
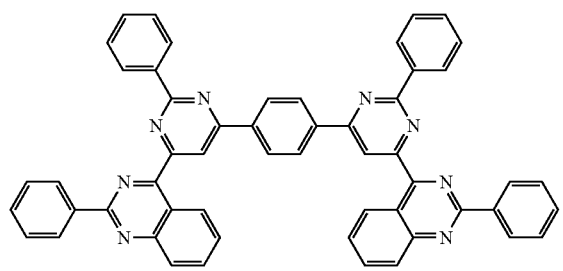
(4)-14
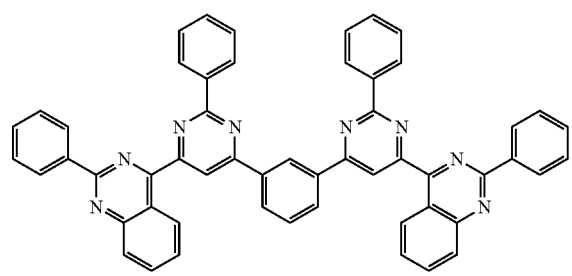
(4)-15
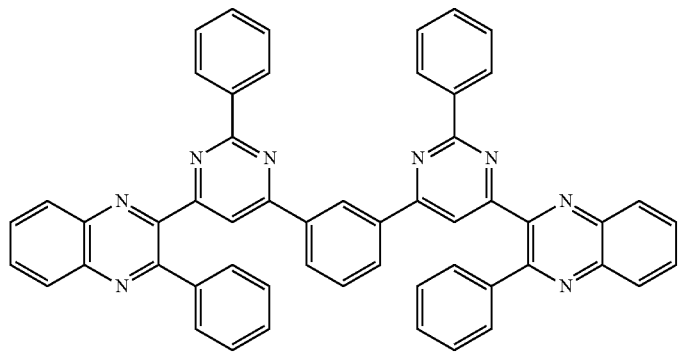
(4)-16
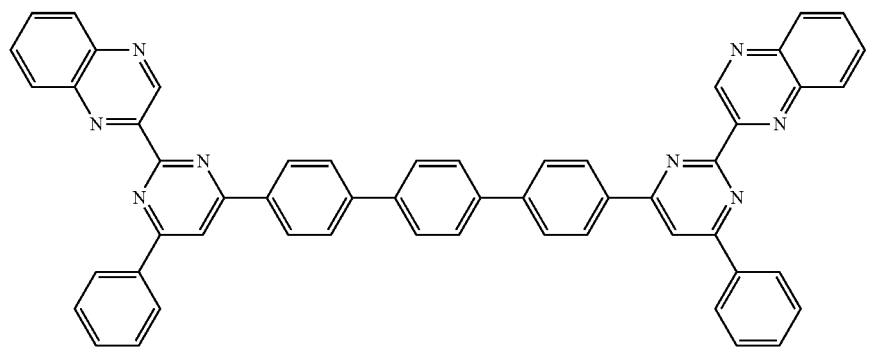

-continued
(4)-17
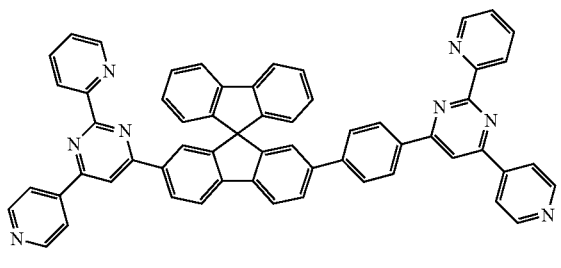
(4)-18
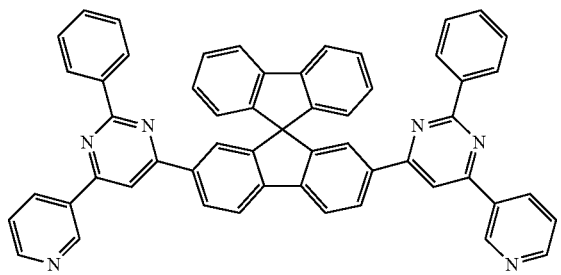
(4)-19
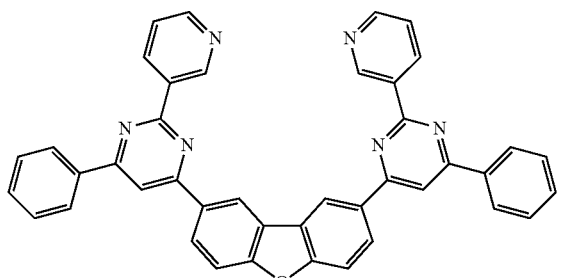
(4)-20
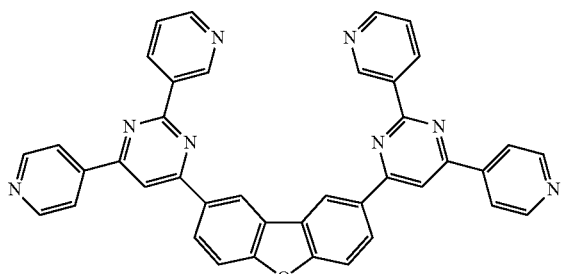
(4)-21
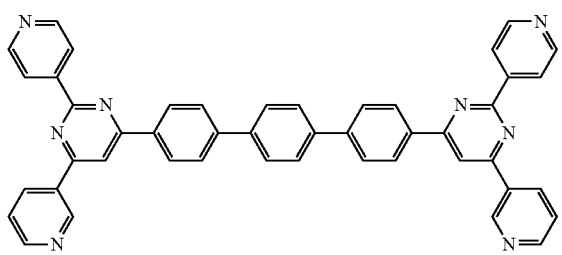
(4)-22
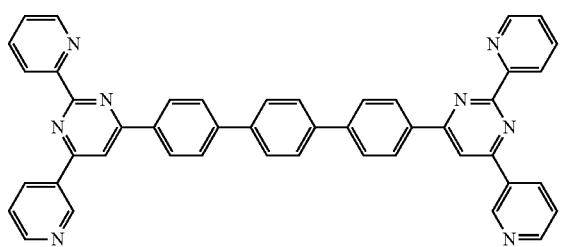
(4)-23
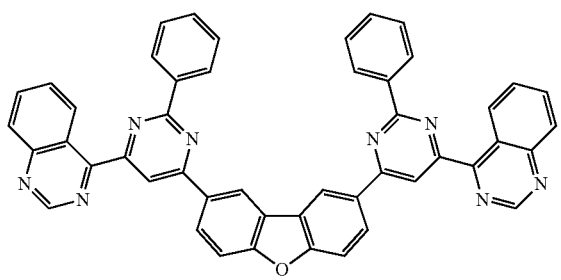
(4)-24
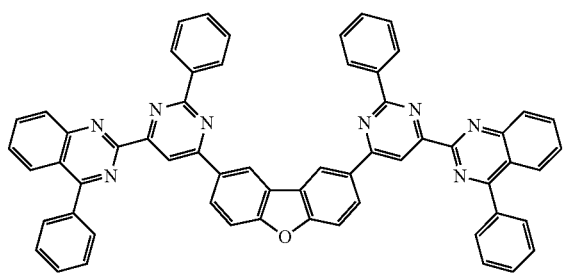
(4)-25
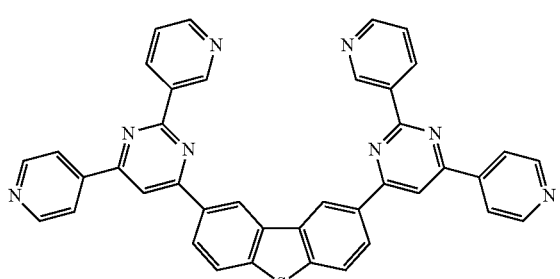
(4)-26
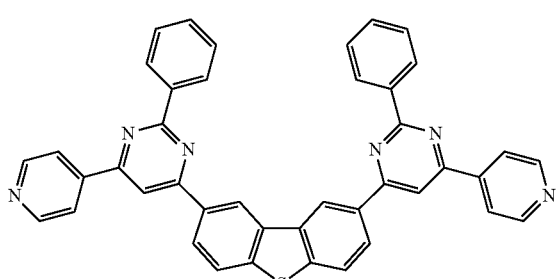

-continued
(4)-27
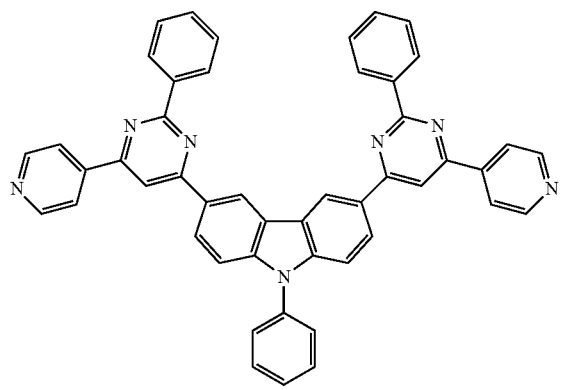
(4)-28
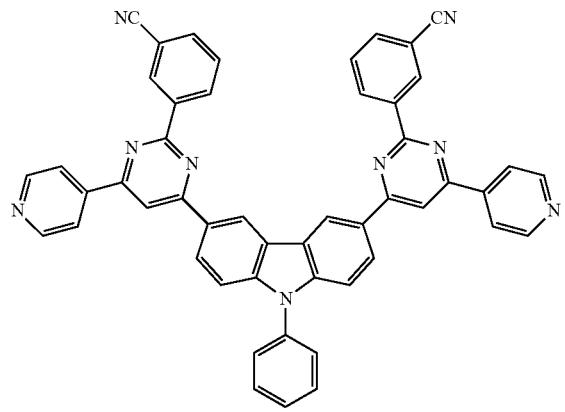
(4)-29
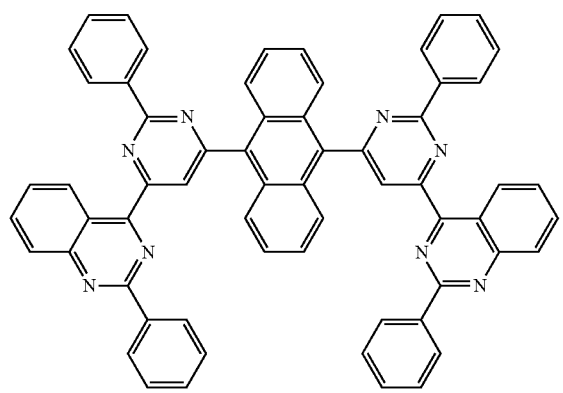
(4)-30
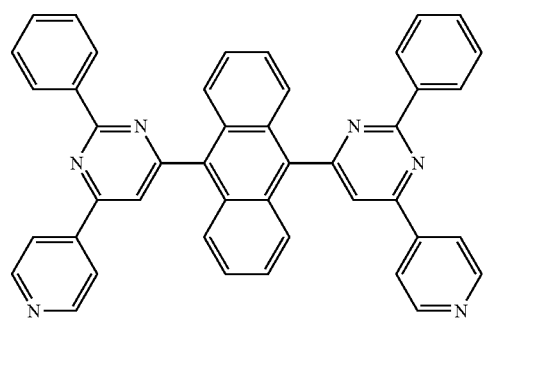
(4)-31
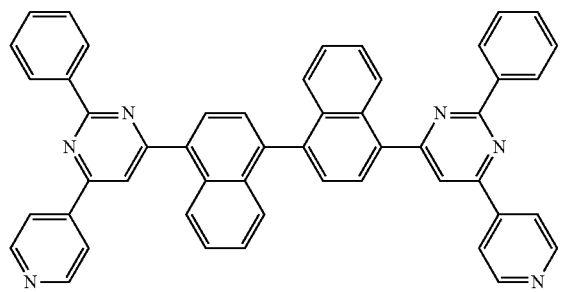
(4)-32
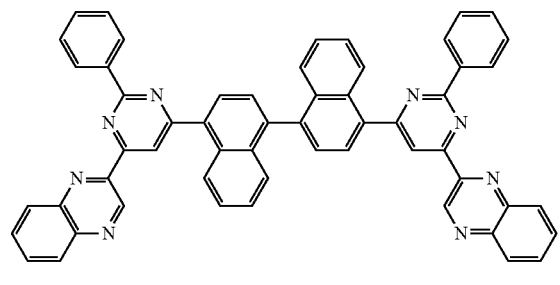
(4)-33
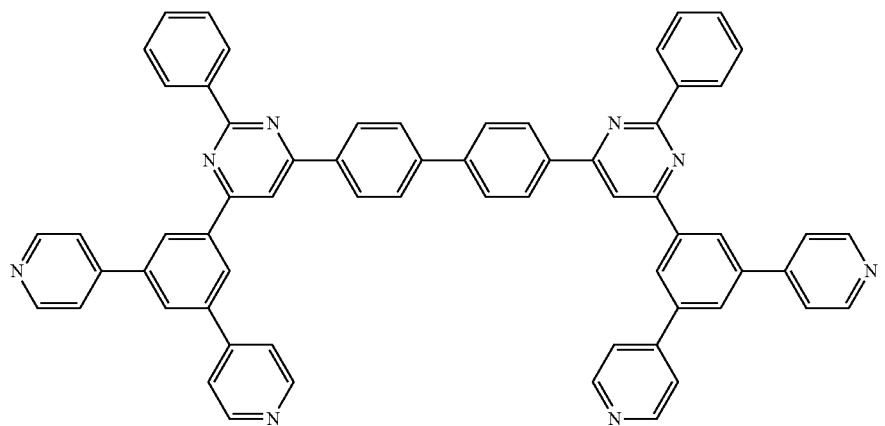

-continued
(4)-34
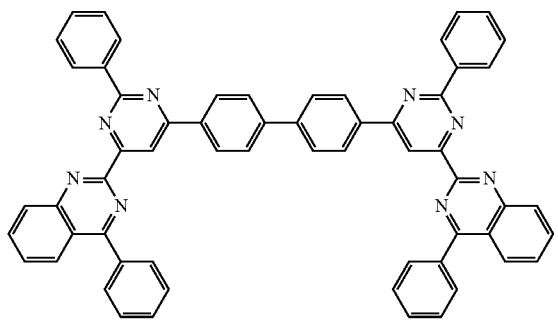
(4)-35
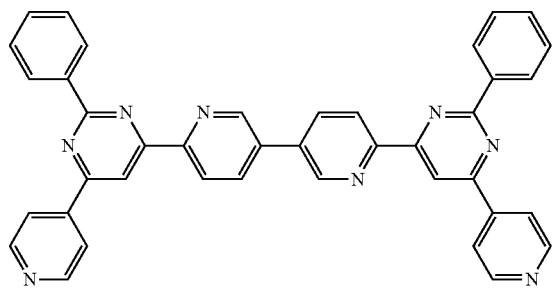
(4)-36
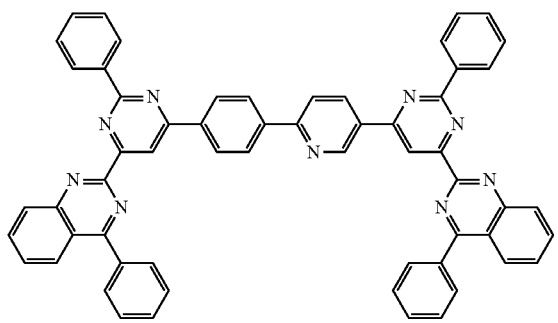
(4)-37
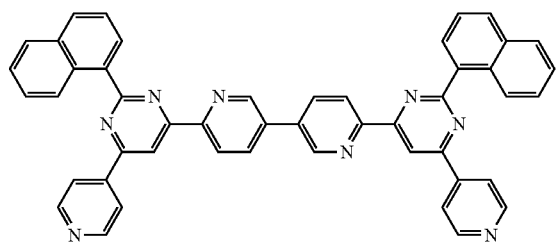
(4)-38
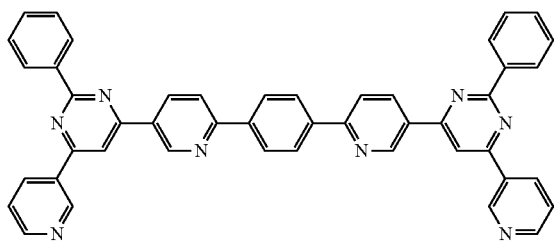
(4)-39
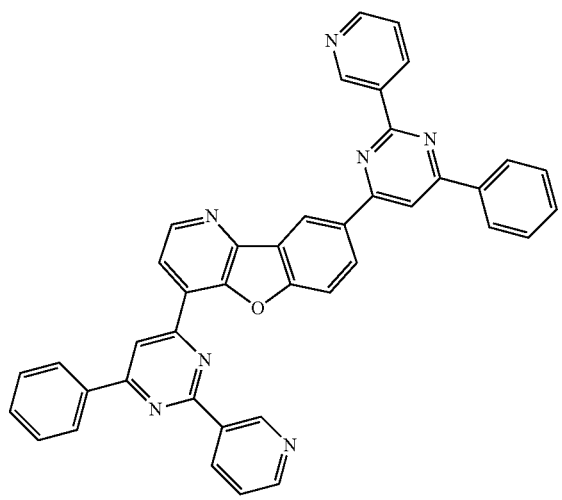

-continued
(4)-40
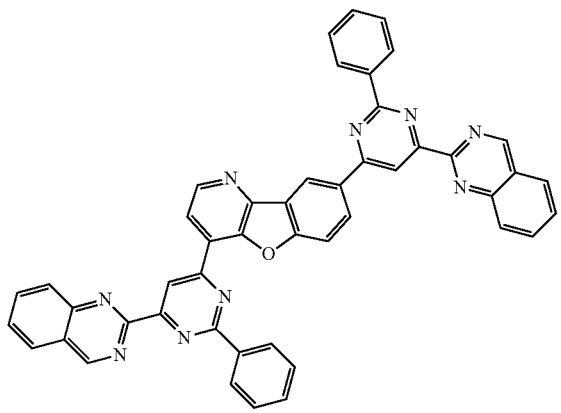
(4)-41
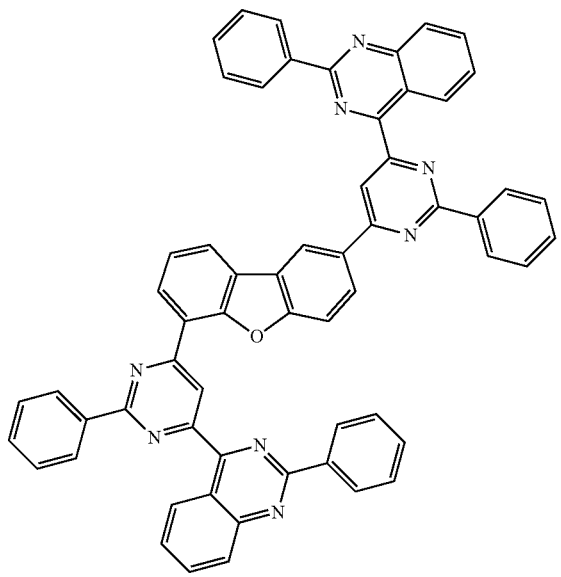
(4)-42
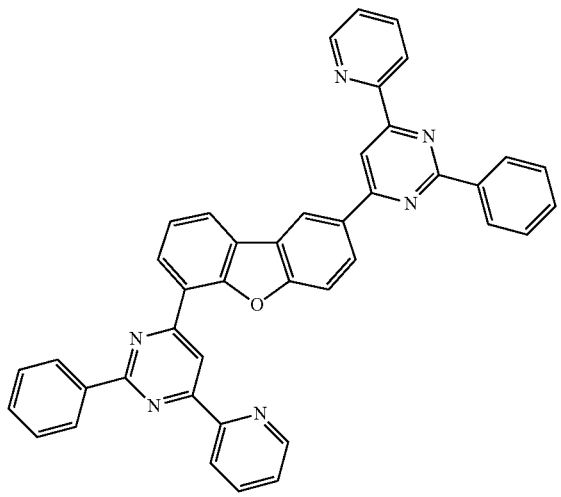
(4)-43
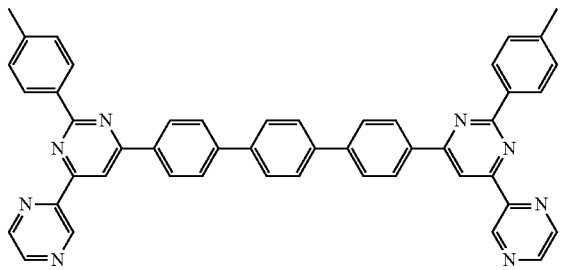
(4)-44
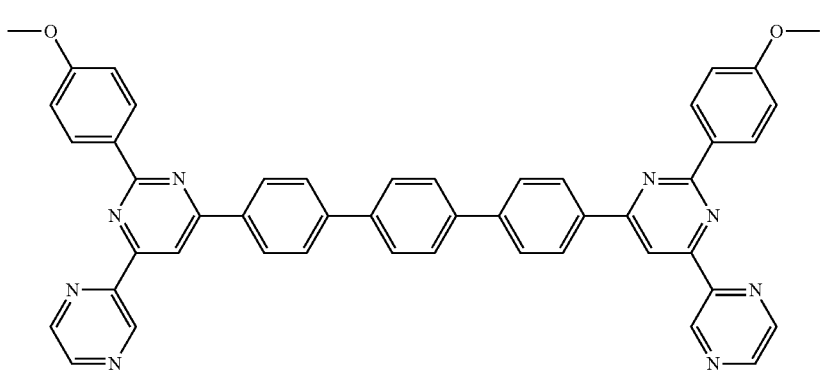

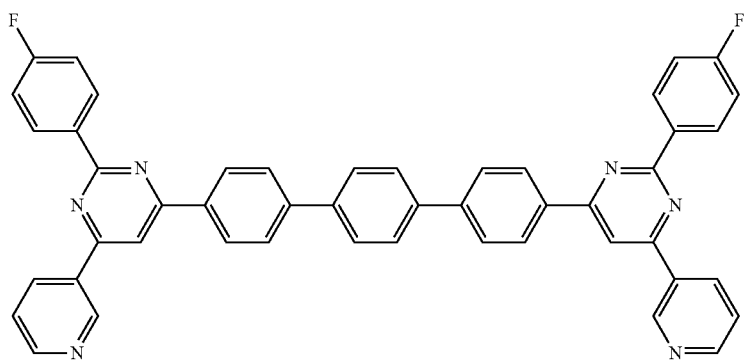
(4)-45
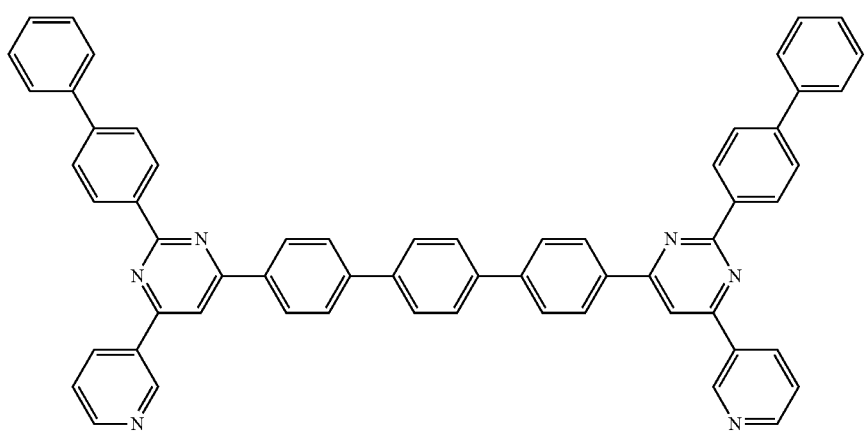
(4)-46
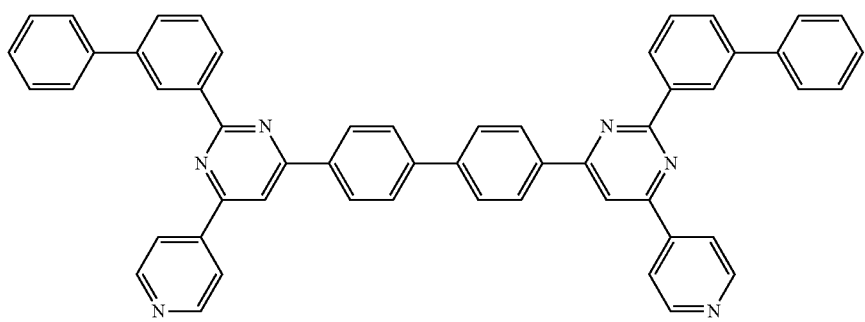
(4)-47
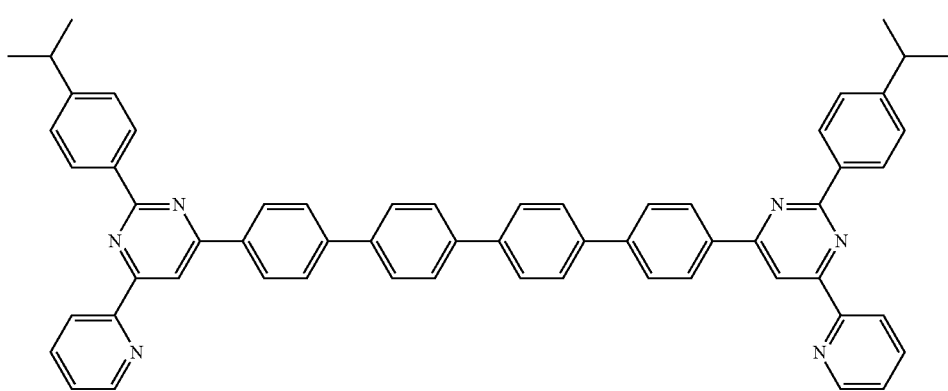
(4)-48

-continued
(5)-1
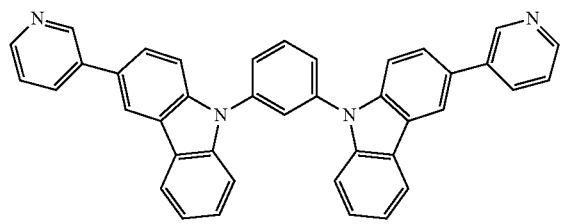
(5)-2
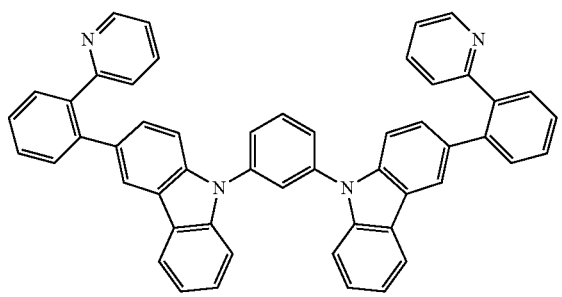
(5)-3
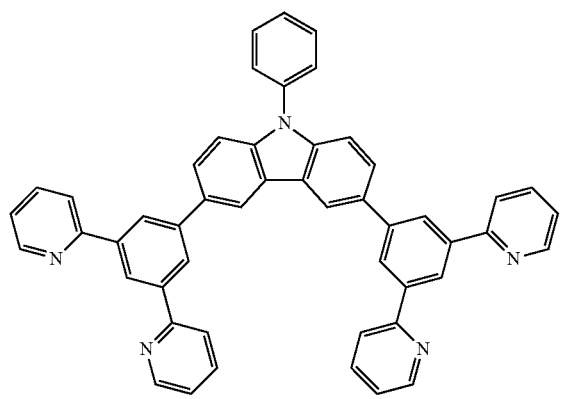
(5)-4
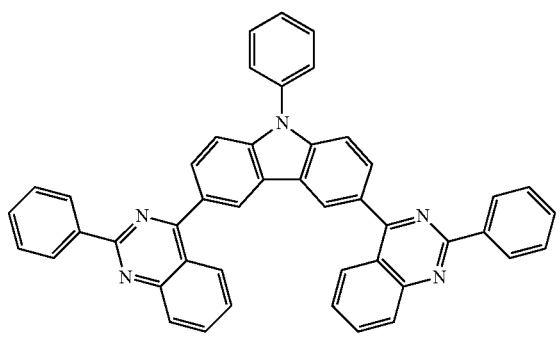
(5)-5
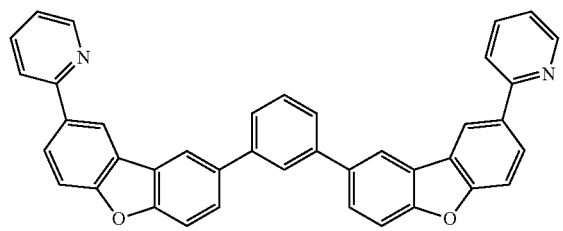
(5)-6
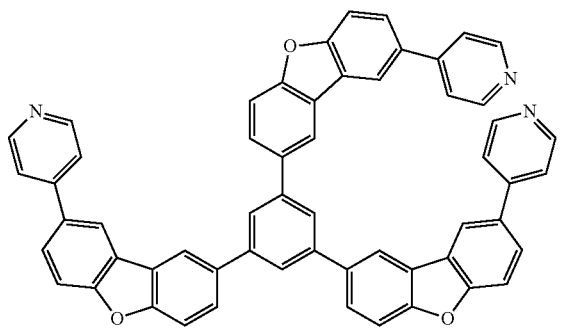
(5)-7
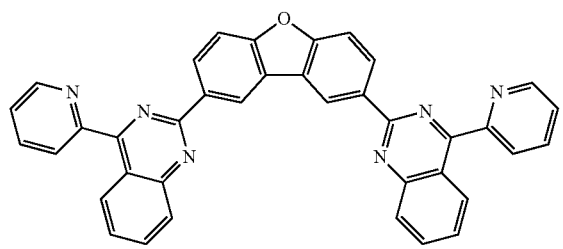
(5)-8
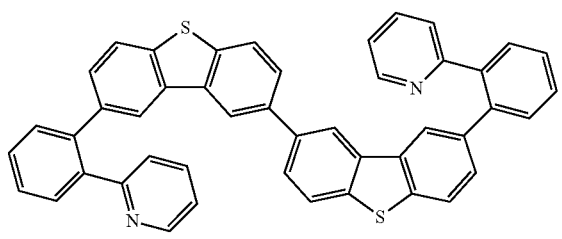

-continued
(5)-9
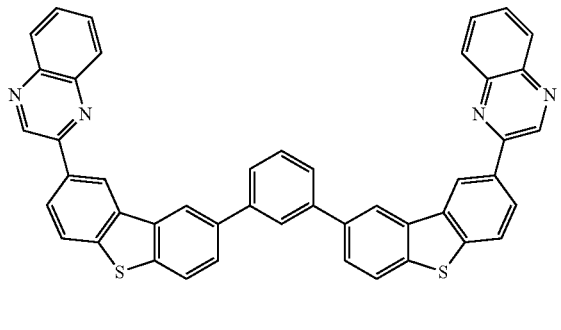
(5)-10
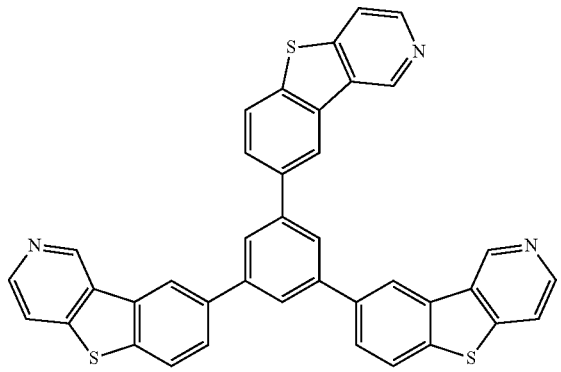
(5)-11
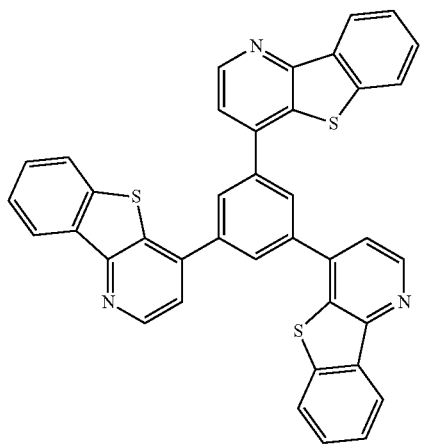
(5)-12
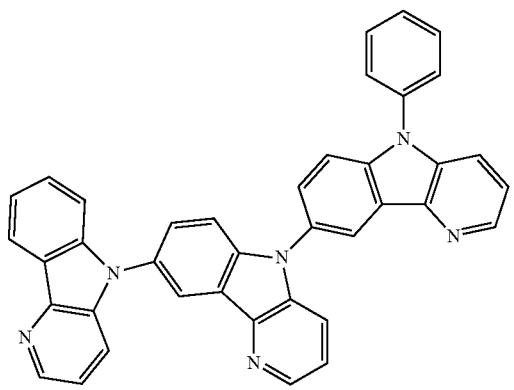
(5)-13
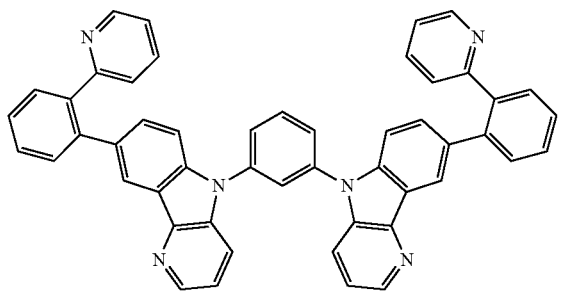
(5)-14
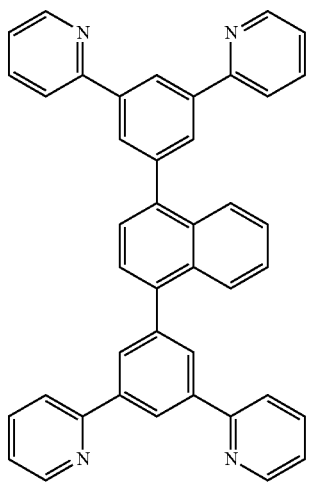

-continued
(5)-15
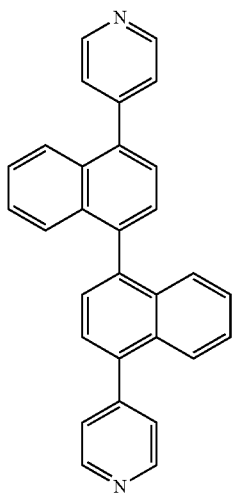
(5)-16
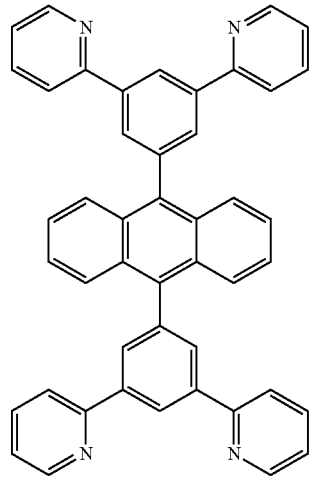
(5)-17
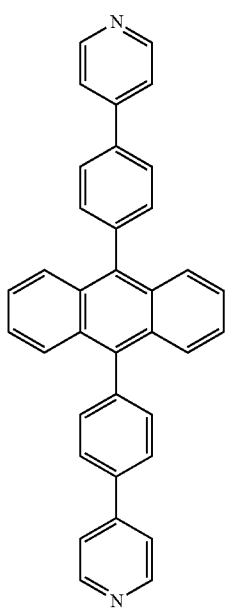
(5)-18
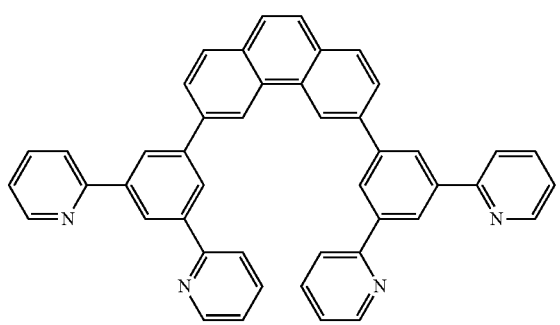
(5)-19
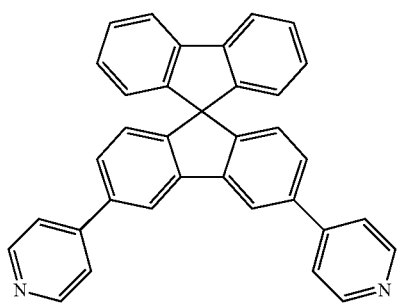
(5)-20
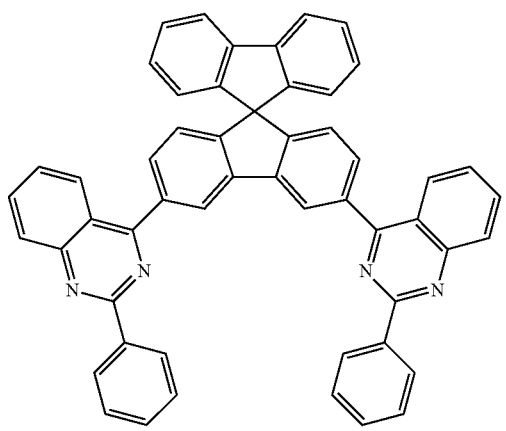

-continued
(5)-21
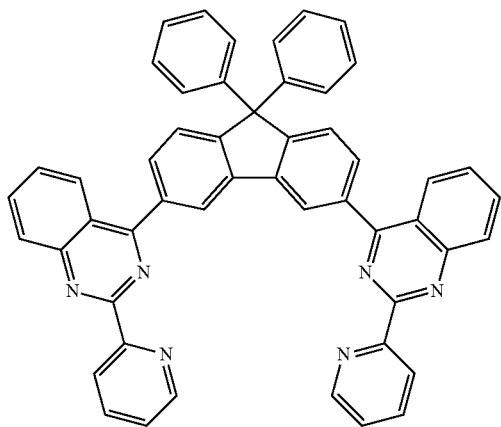
(5)-22
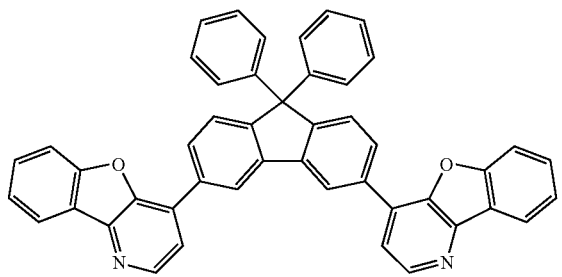
(5)-23
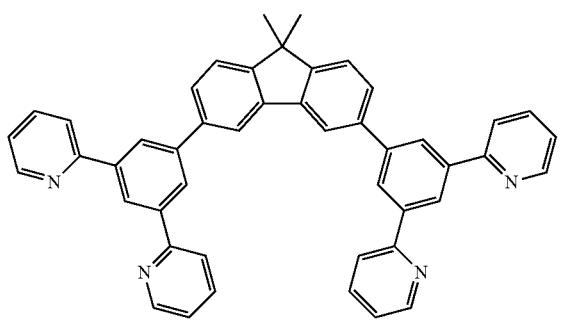
(6)-1
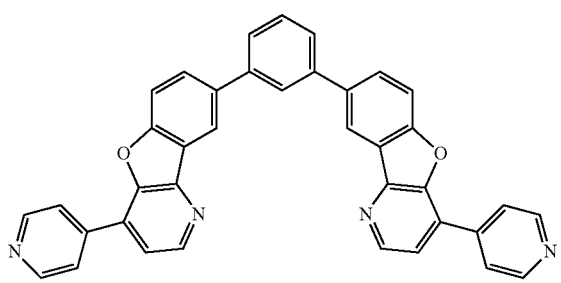
(6)-2
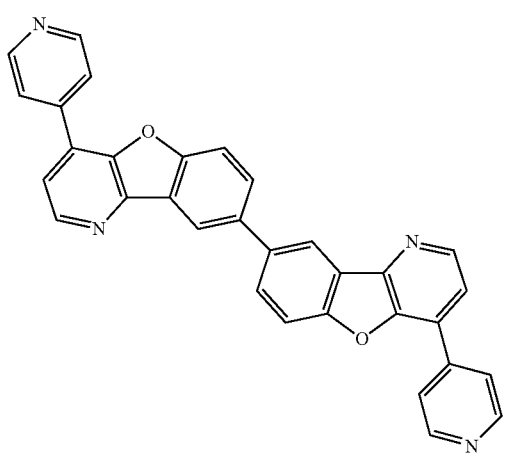
(6)-3
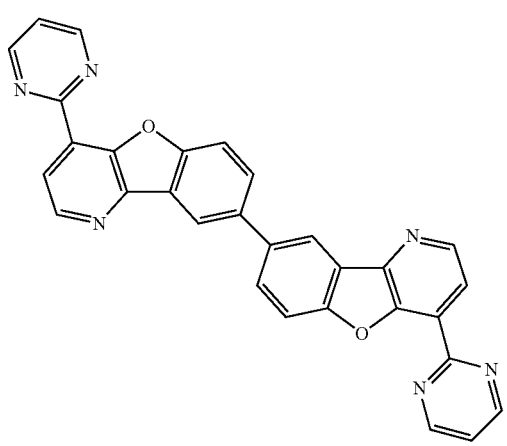

(6)-4
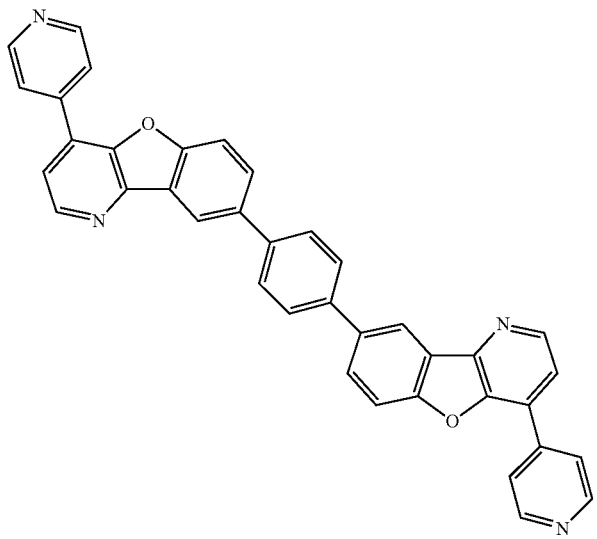
(6)-5
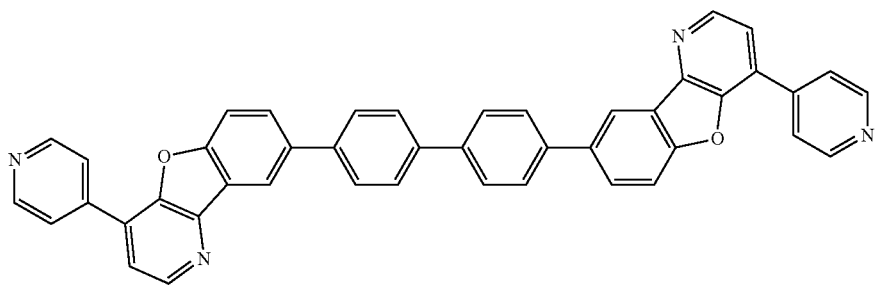
(6)-6
(6)-7
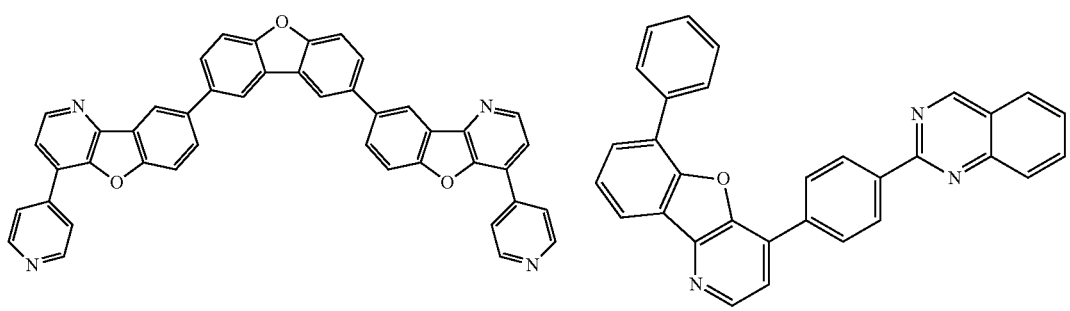
(6)-8
(6)-9
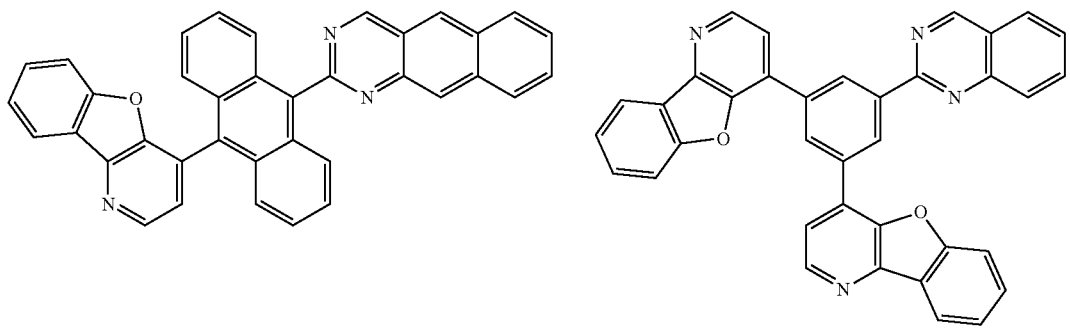

-continued
(6)-10
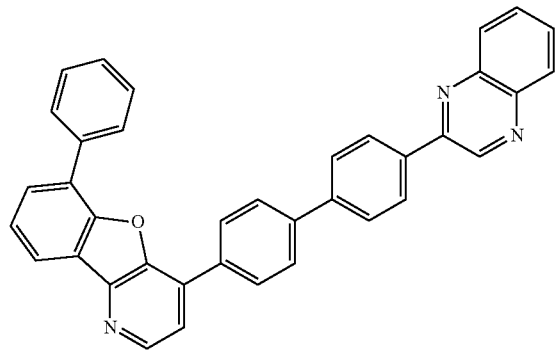
(6)-11
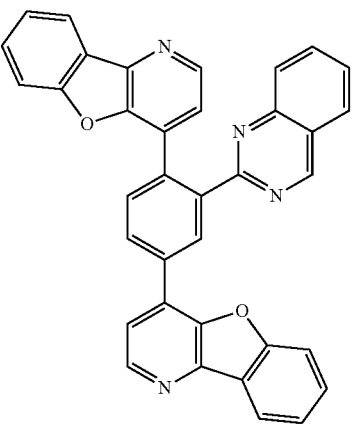
(6)-12
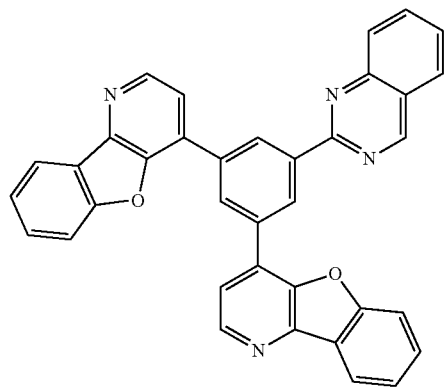
(6)-13
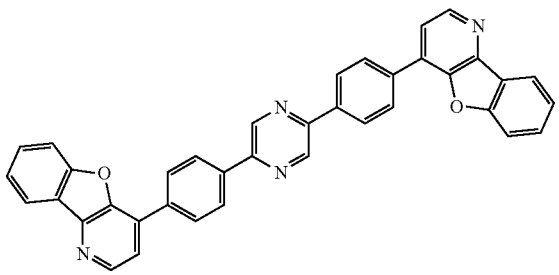
(6)-14
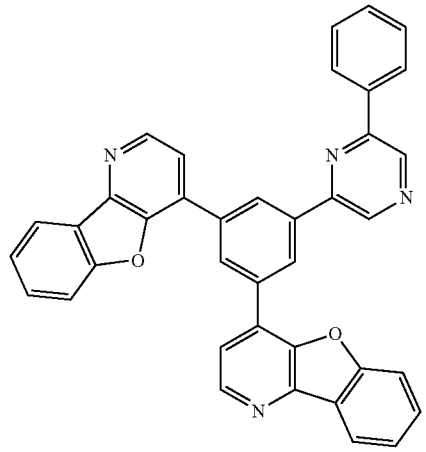
(6)-15
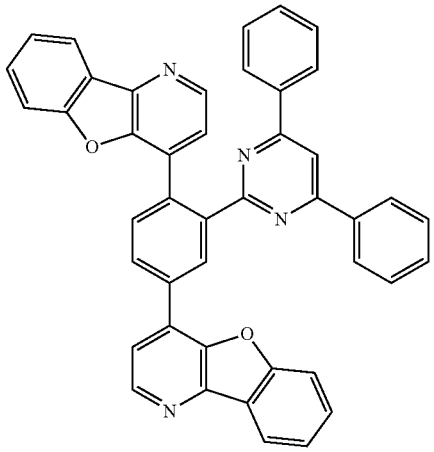
(6)-16
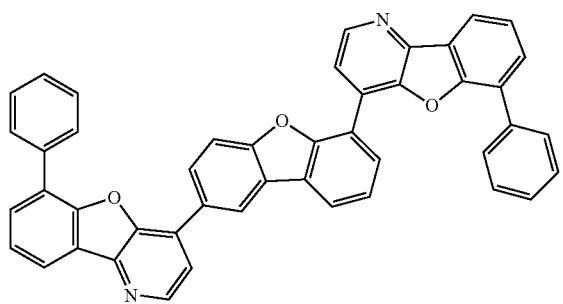
(6)-17
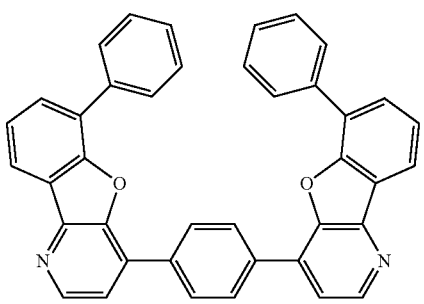

-continued
(6)-18
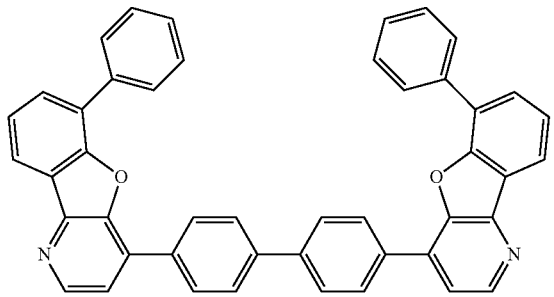
(6)-19
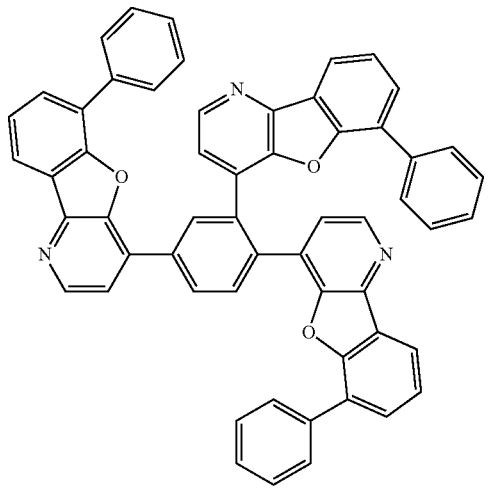
(6)-20
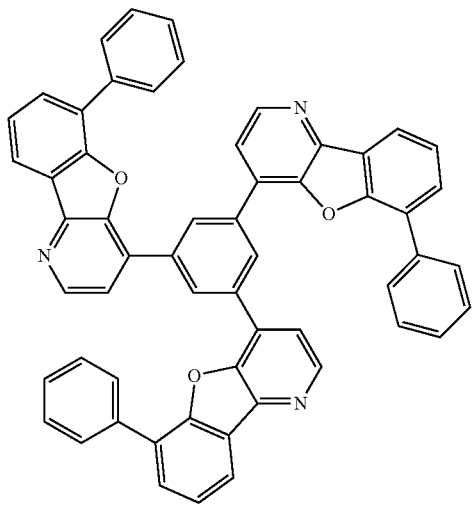
(6)-21
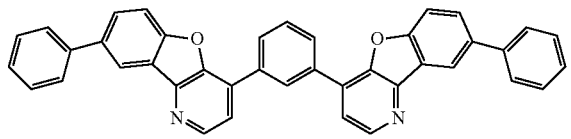
(6)-22
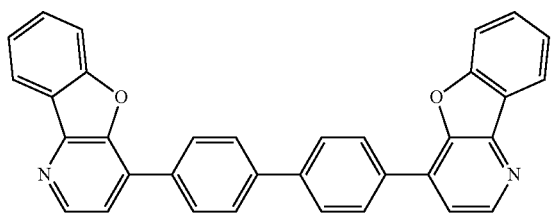
(6)-23
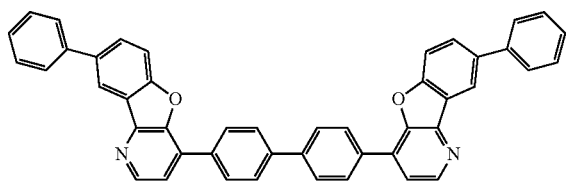
(6)-24
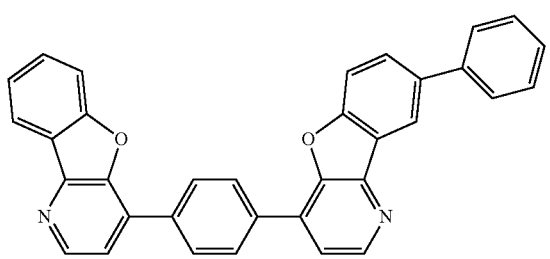
(6)-25
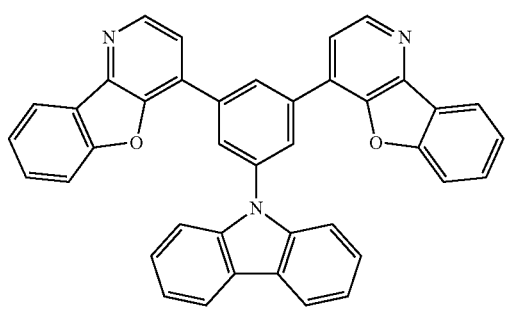

-continued
(6)-26
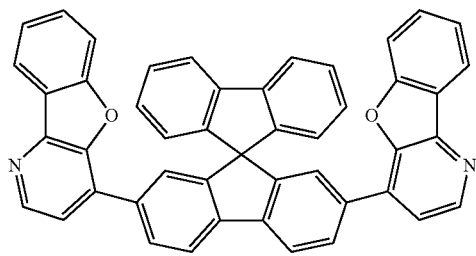
(6)-27
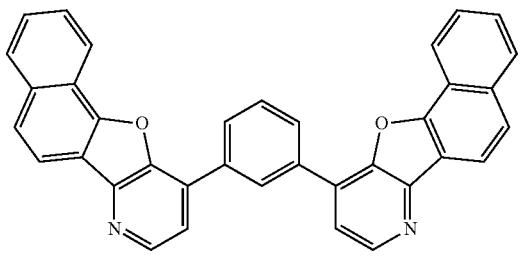
(6)-28
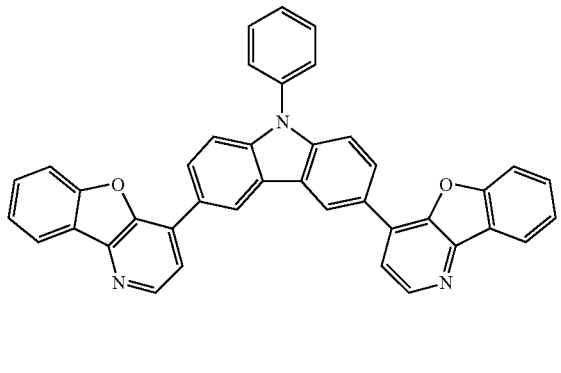
(6)-29
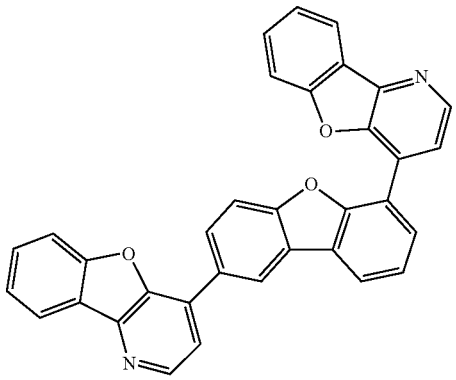
(6)-30
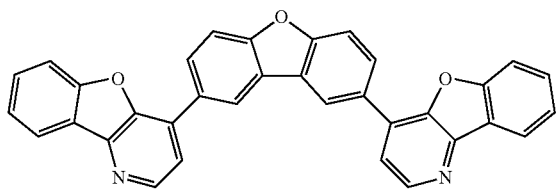
(6)-31
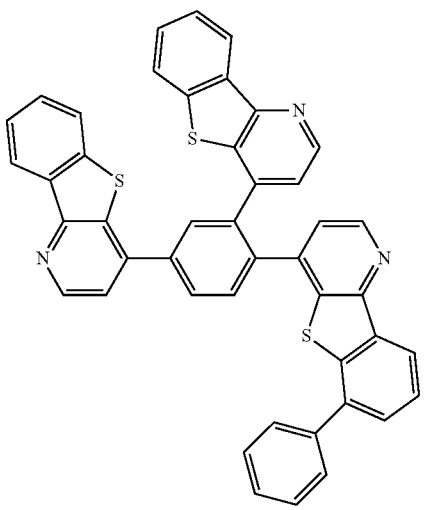

-continued
(6)-32
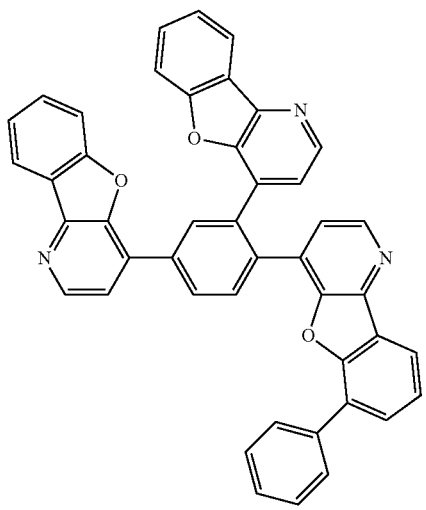
(6)-33
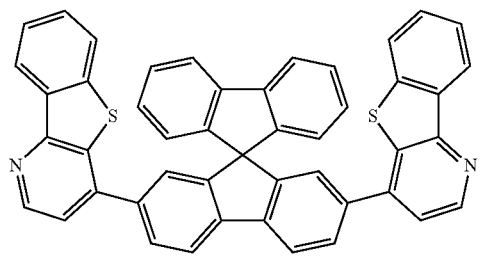
(6)-34
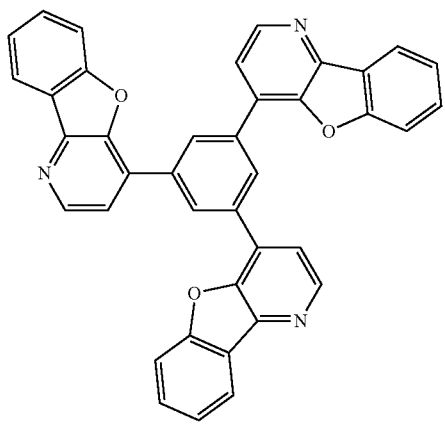
(6)-35
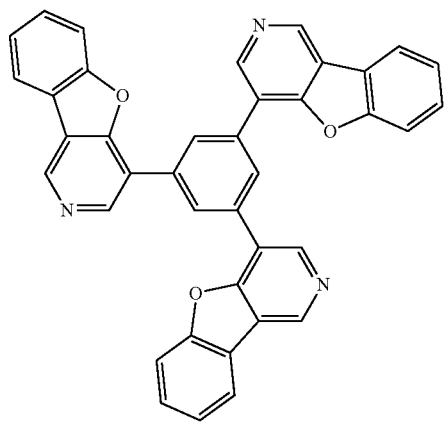
(6)-36
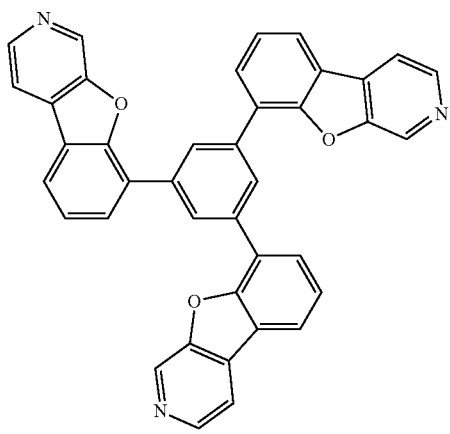
(6)-37
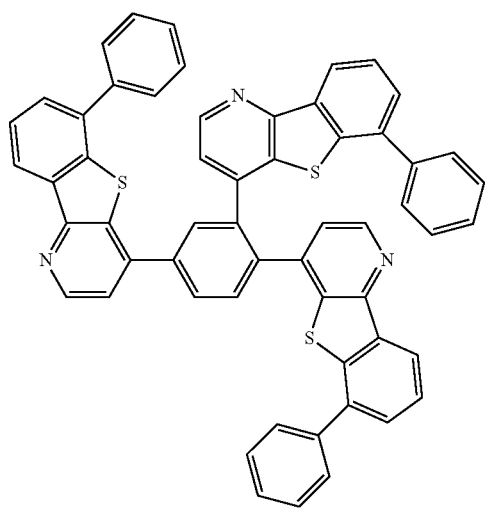

-continued
(6)-38
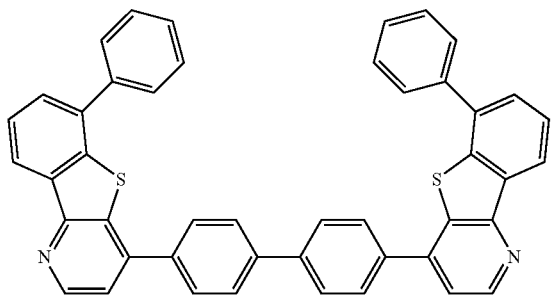
(6)-39
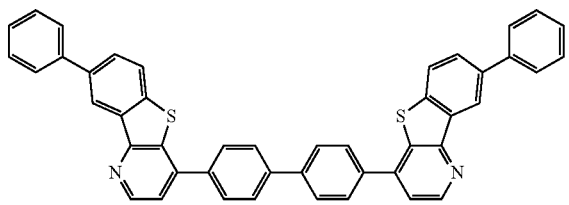
(6)-40
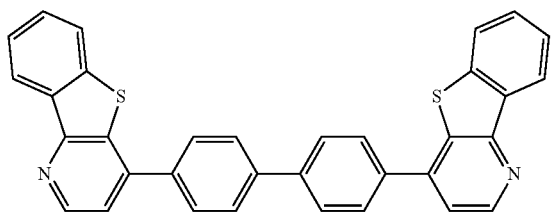
(6)-41
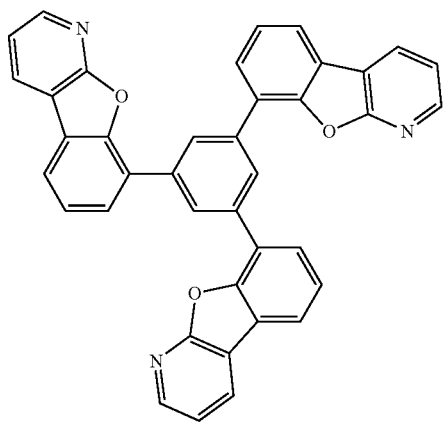
(6)-42
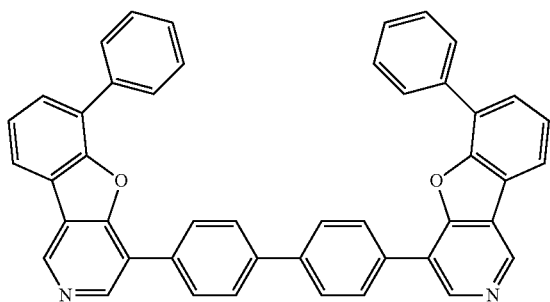
(6)-43
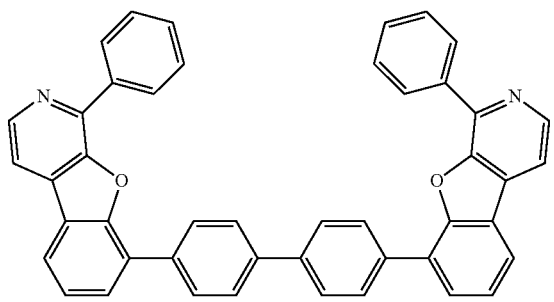
(6)-44
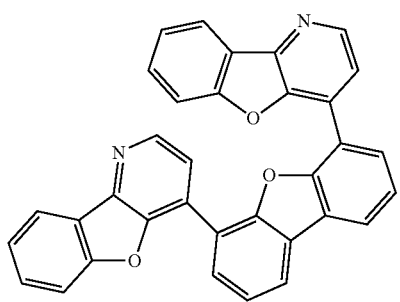
(6)-45
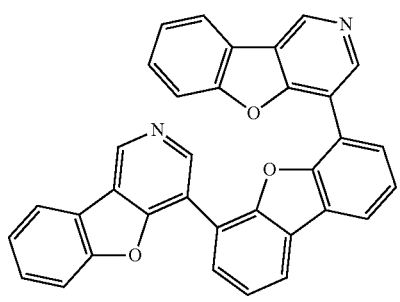

-continued

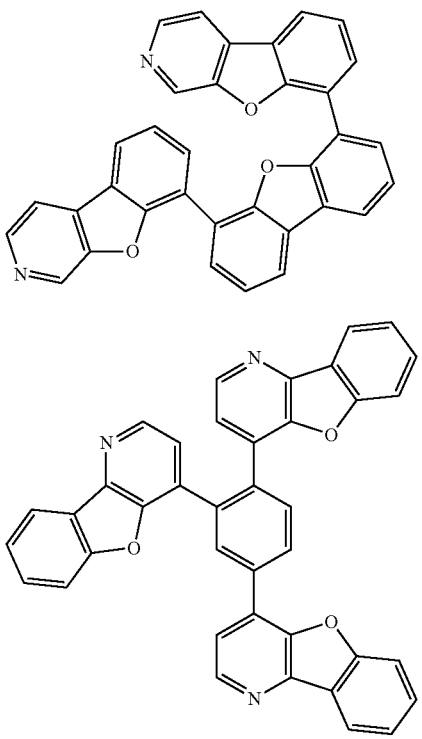

(6)-46

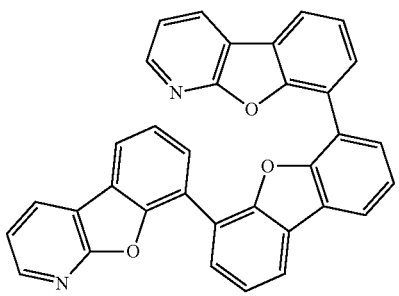

(6)-47

(6)-48

It is preferable that the organic layer according to the present invention is formed by the following method, for example. First, using a nitrogen-containing aromatic heterocyclic compound, a coating solution for forming a compound-containing layer in a solution state is prepared by dissolving it in an appropriate organic solvent. Then, the coating liquid is coated on a substrate by these wet coating methods and dried. For example, the coating liquid may be added to a solvent so that the solid concentration of the coating liquid becomes 1 to 2% by mass, and the obtained coating liquid may be applied and dried by an inkjet method to form an organic layer.

The solvents which may be used are as follows. Examples of the hydrocarbon include benzene, toluene, xylene, hexane, and cyclohexane. Examples of the alcohol include methanol, ethanol, n-propyl alcohol, isopropyl alcohol, n-butanol, 2-butanol, tert-butanol, pentanol, 2-methyl-2-butanol, and cyclohexanol. Examples of the ketone include acetone, methyl ethyl ketone, methyl isobutyl ketone, and cyclohexanone. Examples of the ester include methyl formate, ethyl formate, methyl acetate, ethyl acetate, isopropyl acetate, amyl acetate, ethyl lactate, and methyl lactate. Examples of the glycol ether (having 1 to 4 carbon atoms) include methyl cellosolve, ethyl cellosolve, propylene glycol monomethyl ether (abbreviation: PGME), propylene glycol monoethyl ether, propylene glycol mono-n-propyl ether, propylene glycol mono-isopropyl ether, propylene glycol monobutyl ether, and propylene glycol mono alkyl (1 to 4 carbon atoms) ether esters Examples of the propylene glycol mono alkyl (1 to 4 carbon atoms) alkyl ether esters include propylene glycol monomethyl ether acetate and propylene glycol monoethyl ether acetate. Other solvents include, for example, and N-methylpyrrolidone. The embodiment of the present invention is not limited thereto, and a solvent obtained by appropriately mixing these solvents is also preferably used.

Further, it is also preferable to add the nitrogen-containing aromatic heterocyclic compound to a binder resin to constitute a coating liquid. Examples of the binder resin include: cellulose derivatives such as cellulose diacetate, cellulose acetate butyrate, cellulose acetate phathalate, and cellulose nitrate; polyesters such as polyvinyl acetate, polystyrene, polycarbonate, polybutylene terephthalate, and copolybutylene tere/isophthalate; polyvinyl alcohol derivatives such as polyvinyl alcohol, polyvinyl formal, polyvinyl acetal, polyvinyl butyral, and polyvinyl benzal; a norbornene-based polymer containing a norbornene compound; acrylic resins such as poly(methyl methacrylate), poly(ethyl methacrylate), poly(propylmethyl methacrylate), poly(butyl methacrylate), and poly(methyl acrylate); and polyimide resins. The present invention is not limited to these resin materials. Among them, polyimide resins and acrylic resins are preferable in terms of heat resistance, mechanical properties such as dimensional stability, and electrical properties such as insulation properties. In this case, it is preferable to mix the nitrogen-containing aromatic heterocyclic compound with respect to the resin in a range of 1 to 30% by mass, more preferably in a range of 5 to 20% by mass, and still more preferably in a range of 5 to 10% by mass. The thickness of the organic layer is preferably within a range of 10 to 1000 nm, and more preferably within a range of 10 to 100 nm.

[2] Metal Nanowire Layer

The metal nanowire layer, which is a conductive material layer according to the present invention, preferably has a resistance value in the range of 0.01 to 150 Ω/sq. More preferably, the resistance value of the conductive material layer is in the range of 0.1 to 100 Ω/sq. When the resistance value of the conductive material layer is 0.01 Ω/sq. or more, durability against environmental fluctuations such as high temperature and high humidity may be obtained, and when the resistance value is 150 Ω/sq. or less, it is preferable from the viewpoint of curling suppression.

[2.1] Metal Nanowire

The metal nanowire is a conductive material which is made of a metal, has a needle-like shape or a thread-like shape, and has a diameter of a nanometer size. The metal nanowires may be linear or curved. When a transparent conductive layer composed of the metal nanowires is used, a transparent electrode having a small electrical resistance may be obtained by forming the metal nanowires in a mesh shape, so that even a small amount of metal nanowires may form a good electrical conduction path. Further, when the metal nanowires have a mesh shape, an opening may be formed in the gap between the meshes, and it is possible to obtain a transparent electrode having a high light transmittance.

The ratio (aspect ratio: L/d) of the diameter d to the length L of the metal nanowire is preferably in the range of 10 to 100000, more preferably in the range of 50 to 100000, and even more preferably in the range of 100 to 10000. By using the metal nanowires having a large aspect ratio in this way, the metal nanowires may be well intersected to express high conductivity by a small amount of metal nanowires. As a result, it is possible to obtain a transparent conductive film having a high light transmittance.

In the present specification, the "diameter of the metal nanowire" means the diameter of the metal nanowire when the cross section of the metal nanowire is circular, and it means the minor axis when the cross section is elliptical, and it means the longest diagonal line when the cross section is polygonal. The diameter and length of the metal nanowires may be confirmed by a scanning electron microscope or a transmission electron microscope.

The diameter of the metal nanowires is preferably less than 500 nm, more preferably less than 200 nm, still more preferably within the range of 10 to 100 nm, and most preferably within the range of 10 to 50 nm. In such a range, a transparent conductive layer having high light transmittance may be formed.

The length of the metal nanowires is preferably in the range of 1.0 to 1000 μm, more preferably in the range of 10 to 500 μm, and even more preferably in the range of 10 to 100 μm. Within such a range, a transparent conductive film having high conductivity may be obtained.

As the metal constituting the metal nanowires, any suitable metal may be used as long as it is a metal having high conductivity. Examples of the metal constituting the metal nanowire include silver, gold, copper, and nickel. Alternatively, a material u which plating process (e.g., gold plating treatment) is performed on these metals may be used. Among them, silver or copper is preferable from the viewpoint of conductivity, and silver is more preferable.

Any suitable method may be employed as the method for manufacturing the metal nanowires. For example, a method of reducing silver nitrate in a solution, a method of applying an applied voltage or an electric current from a tip portion of a probe to a surface of a precursor, drawing out metal nanowires at the tip portion of the probe, and continuously forming the metal nanowires may be given. In a method of reducing silver nitrate in solution, a silver nanowire may be synthesized by liquid phase reduction of a silver salt such as silver nitrate in the presence of a polyol such as ethylene glycol and polyvinylpyrrolidone.

A uniform-sized silver nanowire may be mass-produced according to methods described in, for example, Xia, Y. et al., Chem. Mater. (2002), 14, 4736-4745, and Xia. Y. et al., Nano letters (2003) 3(7), 955-960.

The transparent electrode may be formed by coating a transparent conductive layer forming composition containing the metal nanowires on a transparent substrate. More specifically, after a dispersion liquid in which the metal nanowires are dispersed in a solvent (a composition for forming a metal nanowire layer) is coated on the transparent substrate, the coating layer is dried to form a metal nanowire layer.

Examples of the solvent include water, an alcohol-based solvent, a ketone-based solvent, an ether-based solvent, a hydrocarbon-based solvent, and an aromatic-based solvent. From the viewpoint of reducing environmental load, water is preferably used.

The dispersion concentration of the metal nanowires in the composition for forming the metal nanowire layer is preferably in the range of 0.1 to 1% by mass. Within such a range, a transparent metal nanowire layer having excellent conductivity and light transmittance may be formed.

The above-mentioned composition for forming a metal nanowire layer may further contain any suitable additive depending on the purpose. Examples of the additive include a corrosion inhibitor for preventing corrosion of the metal nanowires, and a surfactant for preventing aggregation of the metal nanowires. The type, number and amount of additives used may be appropriately set depending on the purpose. Further, the composition for forming a metal nanowire layer may contain any suitable binder resin, if necessary, as long as the effect of the present invention is obtained.

As a method of applying the composition for forming the metal nanowire layer, any suitable method may be adopted. Examples of the coating method include spray coating, bar coating, roll coating, die coating, inkjet coating, screen coating, dip coating, relief printing, intaglio printing, and gravure printing.

As a method of drying the coating layer, any suitable drying method (e.g., natural drying, blow drying, and heat drying) may be employed. For example, in the case of heated drying, the drying temperature is typically within the range of 100 to 200° C., and the drying time is typically within the range of 1 to 10 minutes.

When the transparent conductive layer comprises metal nanowires, the thickness of the transparent conductive layer is preferably in the range of 0.01 to 10 μm, more preferably in the range of 0.05 to 3 μm, and particularly preferably in the range of 0.1 to 1 sun. In such a range, a transparent conductive film having excellent conductivity and light transmittance may be obtained.

When the transparent conductive layer contains metal nanowires, the total light transmittance of the transparent conductive layer is preferably 85% or more, more preferably 90% or more, and still more preferably 95% or more.

[2.2] Metal Mesh

A transparent conductive layer including a metal mesh is an aspect of a transparent electrode in which metal nanowires according to the present invention are formed in a lattice-like pattern on the transparent substrate. The shape of the pattern of the metal mesh is not particularly limited, and may be, for example, a stripe shape, a lattice shape, or a random network structure, but the aperture ratio is preferably 80% or more from the viewpoint of transparency.

As the metal constituting the metal mesh, any suitable metal may be used as long as it is a metal having high conductivity. Examples of the metal constituting the metal mesh include silver, gold, copper, and nickel. Alternatively, a material in which plating process (e.g., gold plating treatment) is performed on these metals may be used. Among them, silver is preferable, and the organic layer according to the present invention hardly causes a migration phenomenon, and is preferable from the viewpoint of suppression of disconnection at the time of keystroke.

The transparent conductive layer comprising the metal mesh may be formed by any suitable method. The transparent conductive layer may be obtained, for example, by coating a photosensitive composition containing a silver salt (a composition for forming a transparent conductive layer) on the laminate, followed by exposure processing and development processing to form metal nanowires in a predetermined pattern. In addition, the transparent conductive layer may be obtained by printing a paste containing fine metal particles (a composition for forming a transparent conductive layer) in a predetermined pattern.

In addition, the transparent conductive layer may be easily obtained by coating a dispersion containing metal nanowires and drying it using liquid-phase film forming methods such as a roll coating method, a bar coating method, a dip coating method, a spin coating method, a casting method, a die coating method, a blade coating method, a gravure coating method, a curtain coating method, a spray coating method, and a doctor coating method.

Details of such transparent conductive layers and methods of forming the same are described in, for example, JP-A 2012-18634, the description of which is incorporated herein by reference. Another example of a transparent conductive layer formed of a metal mesh and a method for forming the same is the transparent conductive layer and a method for forming the same described in JP-A 2003-331654.

When the transparent conductive layer comprises a metal mesh, the thickness of the transparent conductive layer is preferably in the range of 0.1 to 30 µm, more preferably in the range of 0.1 to 9 µm.

When the transparent conductive layer contains a metal mesh, the light transmittance of the transparent conductive layer is preferably 80% or more, more preferably 85% or more, and still more preferably 90% or more.

[3] Overcoat Layer

The overcoat layer is preferably a resin layer using a transparent resin. It is preferable that it contains any one of resins of a polyimide resin, an acrylic resin, a cellulose ester resin, a polycarbonate resin, a cycloolefin resin, a phenolic resin, an epoxy resin, a polyphenylene ether resin, and a polyester resin in terms of mechanical properties such as heat resistance and dimensional stability and electrical properties such as insulation.

Examples of the cellulose ester resin include triacetyl cellulose (abbreviation: TAC), diacetyl cellulose, and acetylpropionyl cellulose.

Examples of the polycarbonate resin include Panlite and Multilon (manufactured by Teijin, Ltd.).

Examples of the cycloolefin resin include Zeonor (manufactured by Nippon Zeon Co., Ltd.), Arton (manufactured by JSR Co., Ltd.), and Apel (manufactured by Mitsui Chemical Co. Ltd.).

Examples of the acrylic resin include polymethyl methacrylate, Acrylite (manufactured by Mitsubishi Rayon Co., Ltd.), and Sumipex (manufactured by Sumitomo Chemical Co., Ltd.)

Examples of the polyester resin include polyethylene terephthalate (abbreviation: PET) and polyethylene naphthalate (abbreviation: PEN).

Among the above resins, it is more preferable to contain any one of a polyimide resin, an acrylic resin, an epoxy resin, and a melamine resin, and in particular, when the resin layer is a resin film, it is preferable to contain a polyimide resin, and when the resin layer is a resist, it is preferable to contain an acrylic resin or an epoxy resin.

It is preferable that the resin layer contains a matting agent, an ultraviolet absorber, an antioxidant, and a release accelerator, if necessary.

(Matting Agent)

The resin layer may contain, for example, inorganic fine particles such as silicon dioxide, titanium dioxide, aluminum oxide, zirconium oxide, calcium carbonate, kaolin, talc, calcined calcium silicate, hydrated calcium silicate, aluminum silicate, magnesium silicate, and calcium phosphate, and a matting agent such as a crosslinked polymer. Among them, silicon dioxide is preferable because the haze of the resin layer may be reduced.

(Ultraviolet Absorber)

It is preferable to contain an ultraviolet absorber in the resin layer from the viewpoint of improving light resistance. The ultraviolet absorber is intended to improve light resistance by absorbing ultraviolet rays of 400 nm or less, and in particular, the light transmittance at a wavelength of 370 nm is preferably in the range of 0.1 to 30%, more preferably in the range of 1 to 20%, and still more preferably in the range of 2 to 10%.

(Antioxidant)

An antioxidant is also called a deterioration inhibitor. When an electronic device is placed in a state of high humidity and high temperature, degradation of the resin layer may occur.

As such an antioxidant, a hindered phenol-based compound is preferably used. Examples thereof include 2,6-di-t-butyl-p-cresol, pentaerythrityl-tetrakis[3-(3,5-di-t-butyl-4-hydroxyphenyl)propionate], triethyleneglycol-bis[3-(butyl-5-methyl-4-hydroxyphenyl)propionate], 1,6-hexanediol-bis[3-(3,5-di-t-butyl-4-hydroxyphenyl)propionate,2,4-bis-(n-octylthio)-6-(4-hydroxy-3,5-di-t-butylanilino)-1,3,5-triazine, 2,2-thio-diethylenebis[3-(3,5-di-t-butyl-4-hydroxyphenyl)propionate], octadecyl-3-(3,5-di-t-butyl-4-hydroxyphenyl)propionate, N,N'-hexamethylenebis(3,5-di-t-butyl-4-hydroxy-cinnamamide), 1,3,5-trimethyl-2,4,6-tris (3,5-di-t-butyl-4-hydroxybenzyl)benzene, and tris-(3,5-di-t-butyl-4-hydroxybenzyl)-isocyanurate.

In particular, 2,6-di-t-butyl-p-cresol, pentaerythrityl-tetrakis[3-(3,5-di-t-butyl-4-hydroxyphenyl)propionate], triethyleneglycol-bis[3-(butyl-5-methyl-4-hydroxyphenyl)propionate] are preferable. Further, for example, a hydrazine-based metal inert agent such as N,N'-bis[3-(3,5-di-t-butyl-4-hydroxyphenyl)propionyl]hydrazine or a phosphorus-based processing stabilizer such as tris(2,4-di-t-butylphenyl) phosphite may be used in combination.

It is also preferable to form a conductive polymer layer made of a conductive polymer on the metal nanowire layer as the overcoat layer. Thus, it is possible to obtain a uniform conductivity over the entire electrode surface. Further, by smoothing the unevenness on the metal nanowire layer, it is possible to suppress the current leak-age of the electrode.

It is preferable that the conductive polymer layer contains a conductive polymer, and the conductive polymer has a π-conjugated conductive polymer and a polyanion. Examples of the π-conjugated conductive polymer containing a polyanion used in the present invention include polythiophenes, polypyrroles, polyindoles, polycarbazoles, polyanilines, polyacetylenes, polyfurans, polyparaphenylenevinylenes, polyazulenes, polyparaphenylenes, polyparaphenylenesulfides, polyisothianaphtlenes, and polythiaziles. Of these, polythiophenes or polyanilines are preferred from the viewpoint of enhancing conductivity, transparency, and stability. Further, polyethylenedioxythiophene is more preferred.

The π-conjugated conductive polymer may be easily produced by chemical oxidation polymerization of a precursor monomer forming a π-conjugated conductive polymer in the presence of an oxidizing agent, an oxidation catalyst and a polyanion. A precursor monomer used for forming a π-conjugated conductive polymer has a π-conjugated system in a molecule, and also has a π-conjugated system in a main chain when polymerized by the effect of an oxidizing agent. Such precursor monomers include, for example, pyrroles, thiophenes, anilines, and derivatives thereof.

[4] Application

The transparent electrode of the present invention has both low resistance and high optical transparency, and may be suitably used in various optoelectronic devices such as liquid crystal display elements, organic light-emitting elements, inorganic electroluminescent devices, electronic papers, organic solar cells, and inorganic solar cells, as well as in the fields of electromagnetic wave shielding and touch panels. Among them, it may be used particularly preferably as a transparent electrode for an organic electronic device such as an organic electroluminescence (EL) element or an organic thin-film solar cell element in which the smoothness of the surface of the transparent electrode is strictly required.

The organic electronic device basically includes a first electrode, a second electrode, and an organic functional layer, the second electrode is disposed opposite to the first electrode, and the organic functional layer is provided between the first electrode and the second electrode.

An organic EL element or an organic thin film solar cell element is used as an example of such an organic electronic device. In particular, the transparent electrode described above is used as the first electrode.

For example, in an organic EL element, it is preferable to use the transparent electrode of the present invention as an anode, and as an organic functional layer (such as an organic light-emitting layer) and a second electrode (cathode), any materials and configurations commonly used in organic EL elements may be used.

As the element configuration of the organic EL element, the following configuration may be mentioned:

Anode/organic light-emitting layer/cathode.

Anode/hole transport layer/organic light-emitting layer/electron transport layer/cathode.

Anode/hole injection layer/hole transport layer/organic light-emitting layer/electron transport layer/cathode, Anode/hole injection layer/organic light-emitting layer/electron transport layer/electron injection layer/cathode, Anode/hole injection layer/organic light-emitting layer/electron injection layer/cathode.

Examples of the outline of the organic EL element applicable to the present invention are the configurations described in the following: JP-A 2013-157634, JP-A 2013-168552, JP-A 2013-177361, JP-A 2013-187211, JP-A 2013-191644, JP-A 2013-191804, JP-A 2013-225678, JP-A 2013-235994, JP-A 2013-243234, JP-A 2013-243236, JP-A 2013-242366, JP-A 2013-243371, JP-A 2013-245179, JP-A 2014-003249, JP-A 2014-003299. JP-A 2014013910, JP-A 2014-017493, and JP-A 2014017494.

The FIGURE is a cross-sectional view showing an example of an organic EL element having a transparent electrode of the present invention.

An organic EL element 10 has a metal nanowire layer 4 and an organic layer 6 on a resin substrate 2, and a transparent electrode 1 is formed. The transparent electrode 1 is connected to a take-out electrode 12. An organic functional layer 14 is provided between the transparent electrode 1 and a counter electrode 16, and the entire device is sealed by a sealing member 18. The organic layer 6 may be formed in the lower layer, or the upper layer, or it may be formed in both of the lower layer and the upper layer of the metal nanowire layer 4.

EXAMPLES

Hereinafter, the present invention will be specifically described with reference to Examples, but the present invention is not limited thereto. In the examples, "parts" or "%" is used, but unless otherwise specified, it indicates "parts by mass" or "% by mass".

Example 1

<Preparation of Transparent Electrode 101>
(Preparation of Transparent Substrate)

A substrate made of transparent alkali-free glass (denoted as "glass" in the table) having a thickness of 0.7 mm was used as a transparent substrate.

(Formation of Ag Nanowire Layer (Denoted as "AgNW" in the Table)

<Conductive Materials>

Conductive materials used in Examples and Comparative Examples are shown below.

As a conductive material A "silver nanowire", a silver nanowire dispersion liquid (ClearOhm™ Ink-A AQ manufactured by Cambrios Corporation. U.S.A.) obtained by dispersing a silver nanowire conductive material (short axis (diameter): 50 to 100 in, long axis (length): 20 to 40 μm) prepared by the method described in Example 1 (Synthesis of Silver Nanowires) of JP-A 2009-505358 was used, and the silver nanowire dispersion liquid was diluted so that the silver nanowire density was 0.055% by mass.

<Preparation of Silver-Containing Composition and Liquid Containing Silver-Containing Composition>

(1) Synthesis of Silver Acetone Dicarboxylate (Silver Salt A)

After weighing 43.8 g of acetone dicarboxylic acid into a 1000 mL beaker, 600 g of ion-exchanged water was added to dissolve and ice-cooled, and 102 g of silver nitrate was further dissolved. To this, 48 g of n-hexylamine was charged and then stirred for 30 min. The resulting white solid was collected by filtration, washed with acetone, and dried under reduced pressure to obtain 88.2 g of silver acetone dicarboxylate as a white solid (yield: 82%). The infrared absorption spectrum of the obtained silver acetone dicarboxylate showed IR absorption bands: 1,372.10 cm$^{-1}$, 1,581.34 cm$^{-1}$. The TGA analysis of the obtained silver acetone dicarboxylate was performed using a thermogravimetric analyzer (manufactured by SII Nanotechnology Inc.). The analysis conditions were a temperature rising rate of 10° C./minute and a measurement atmosphere in air. As a result, the pyrolysis temperature was 175° C. The residue after the thermogravimetric analysis was 59.7% by mass, which was consistent with the theoretical residue ratio (59.4% by mass).

(2) Preparation of Silver-Containing Composition

In a light-shielding bottle, 400 mg of silver acetone dicarboxylate prepared in the above synthesis was dissolved in a mixture of 200 mg of 2-ethylhexylamine (2-EHA) and 400 mg of isoamylamine to obtain a silver-containing composition.

In a light-shielding bottle, 30 g of silver acetone dicarboxylate containing amine solution obtained from the above silver-containing composition was added to 70 g of water to prepare a liquid containing a silver-containing composition.

<Formation of Silver Nanowire Layer>

The conductive material A was applied to one surface of a substrate using a slit die coater (coating width: 550 mm) to which a shim (shim thickness: 50 μm) made of stainless steel (sus) was attached, followed by drying, and a conductive component was laminated and formed. Further, a liquid containing the silver-containing composition obtained by using the slit die coating was applied to the side on which the silver nanowires were applied, and the liquid was dried to form an Ag nanowire layer containing silver salt and metallic silver.

<Preparation of Transparent Electrode 102>

In the preparation of the transparent electrode 101, a transparent electrode 102 was prepared in the same manner except that a layer containing a polyimide resin was formed on a substrate as a lower layer and then an Ag nanowire layer was formed.

The polyimide used in the examples was prepared by the following procedure.

<Synthesis of Polyimide A>

In a 500 mL separable four-necked flask equipped with a stainless steel anchor stirrer, nitrogen inlet tube, and a Dean-Stark apparatus were added 56.11 g (0.18 mol) of 4,4'-oxydiphthalic anhydride (ODPA), 32.09 g (0.18 mol) of diethyltoluenediamine (DETDA), 326.87 g of gamma-butyrolactone (GBL), 2.85 g of pyridine, and 33 g of toluene. Then, the inside of the reaction system was nitrogen-substituted. ODPA was dissolved by stirring at 80° C. under a stream of nitrogen for 30 minutes, then heated to increase the temperature to 180° C. and stirred for 6 hours.

The water formed during the reaction was excluded from the reaction system as an azeotrope with toluene and pyridine. After completion of the reaction, the mixture was cooled to room temperature to obtain a polyimide solution having a concentration of 20% by mass. The structure of the obtained polyimide is as follows.

Isopropanol was charged into this polyimide solution and cooled after stirring to obtain a solid of polyimide A.

were added and stirred to dissolve the mixture to prepare a polyimide resin-containing liquid.

(Composition of Polyimide Resin-Containing Liquid)

Dichloromethane: 350 parts by mass

Polyimide A: 100 parts by mass

Then, the polyimide resin-containing liquid was uniformly cast on an alkali-free glass substrate at a temperature of 30° C. As a drying time of 15 minutes, the mixture was dried at a drying temperature at which the residual solvent amount was less than 0.1% by mass to obtain a polyimide resin-containing layer having a dry film thickness of 50 μm.

<Preparation of Transparent Electrode 103>

In the preparation of the transparent electrode 101, a transparent electrode 103 was prepared in the same manner except that an Ag nanowire layer was formed after a layer containing an acrylic resin was formed as a lower layer on a substrate <Formation of an Acrylic Resin-Containing Layer>

Dichloromethane (boiling point 40° C.) was added to a pressurized dissolution tank. To the pressurized dissolution tank containing a solvent, the acrylic resin prepared above was charged while stirring. This was heated and stirred while being completely dissolved, and this was filtered using an Azumi filtration paper No. 244 manufactured by Azumi Filter Paper Co., Ltd., and then the remaining components were added and stirred to dissolve the mixture to prepare an acrylic resin-containing liquid.

(Composition of Acrylic Resin-Containing Liquid)

Dichloromethane: 350 parts by mass

Acrylic resin (Hitaroid 7927, Hitachi Chemical Co., Ltd.): 100 parts by mass

An acrylic resin-containing liquid having the above composition was cast on a glass substrate to form a coating film, and after drying at 70° C., while purging with nitrogen to an atmosphere having an oxygen concentration of 1.0% by volume or less, and the coating film was cured by using an ultraviolet lamp with an illuminance of 300 mW/cm$^2$ and an irradiation amount of 0.3 J/cm$^2$ to obtain an acrylic resin-containing layer.

<Preparation of Transparent Electrodes 104-113>

In the preparation of the transparent electrode 101, a transparent electrode 104 was prepared in the same manner except that a layer containing a nitrogen-containing aromatic heterocyclic compound according to the present invention

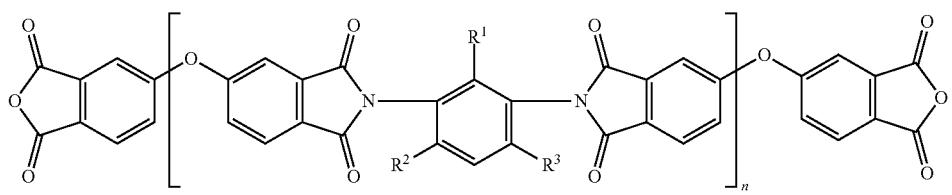

In the formula, one of $R^1$ to $R^3$ represents a methyl group and two represent an ethyl group.

<Formation of Polyimide Resin-Containing Layer>

Dichloromethane (boiling point 40° C.) was added to a pressurized dissolution tank. To the pressurized dissolution tank containing a solvent, the above-prepared polyimide A was charged while stirring. This was heated and stirred while being completely dissolved, and this was filtered using an Azumi filtration paper No. 244 manufactured by Azumi Filter Paper Co., Ltd., and then the remaining components was provided on a substrate as an adjacent lower layer and then an Ag nanowire layer was formed.

Using Exemplified Compound (2)-2 which is a nitrogen-containing aromatic heterocyclic compound according to the present invention, and employing propylene glycol monomethyl ether as a solvent and mixing at a stirring speed of 500 rpm for 10 minutes so that the solid content concentration of the coating liquid becomes 1.5% by mass, the coating liquid was prepared. The liquid was filtered with a hydrophobic PVDF 0.2 μm filter (manufactured by Whatman Corporation) to obtain a coating liquid of an organic layer.

The obtained coating liquid was applied to a glass plate by an inkjet method. Then, simple drying was carried out at a temperature of 80° C. for 2 minutes, and further drying was carried out at a temperature of 120° C. for 6 minutes to form a lower layer which is an organic layer. The layer thickness of the lower layer was 50 un.

In the same manner, transparent electrodes 105 to 113 were prepared using the exemplified compounds described in Table I instead of Exemplified Compound (2)-2.

<Preparation of Transparent Electrodes 114-123>

A transparent electrode 114 was prepared in the same manner as in the preparation of the transparent electrode 102 except that a polyimide resin-containing liquid containing the following exemplified compound was prepared and used.

(Composition of Polyimide Resin-Containing Liquid)
Dichloromethane: 350 parts by mass
Polyimide A: 100 parts by mass
Exemplified Compound (2)-2: 5.0 parts by mass In the same manner, transparent electrodes 115 to 123 were prepared using the exemplified compounds described in Table I instead of Exemplified Compound (2)-2.

<Preparation of Transparent Electrodes 124-138>

A transparent electrode 114 was prepared in the same manner as in the preparation of the transparent electrode 103 except that an acrylic resin-containing liquid containing the following exemplified compound was prepared and used.

(Composition of Acrylic Resin-Containing Liquid)
Dichloromethane: 350 parts by mass
Acrylic resin (Hitaroid 7927, Hitachi Chemical Co., Ltd.): 100 parts by mass
Exemplified Compound (2)-2: 5.0 parts by mass In the same manner, transparent electrodes 125 to 138 were prepared using the exemplified compounds the added amount described in Table I instead of Exemplified Compound (2)-2.

<<Evaluation>>

Using the transparent electrodes 101 to 138 thus obtained, the following evaluation was carried out.

(1) Measurement of Sheet Resistance Value

For each transparent electrode prepared, the sheet resistance value [Ω/sq.] was measured. The sheet resistance value was measured by an eddy current method using a resistivity meter (EC-80 manufactured by Napson Corporation).

(2) Measurement of Light Transmittance

For each transparent electrode prepared, light transmittance of the substrate, the lower layer, and the entire Ag nanowire layer (%) were measured. The light transmittance was measured using a spectrophotometer (U-3300 manufactured by Hitachi High-Tech Science Corporation).

(3) Change in Sheet Resistance Value Before and After Driving Under High Temperature and High Humidity Storage For the prepared transparent electrodes on respective glass substrates, by using a laser oscillator HSL-4000III (manufactured by HOYA CANDEO OPTRONICS Corporation), a lime having a width of 100 μM was formed in the center of the glass substrate, and the Ag nanowire electrode layer was divided into two. Thereafter, the resistance value change rate between the electrode layers before and after 300 hours of the 5-V drive at a temperature 80° C. and humidity 85% RH was evaluated based on the following evaluation criteria. Levels A to C of the following evaluations were set to practically no problem.

A: Change rate of resistance value after storage at high temperature and high humidity is less than ±100%.
B: Change rate of resistance value after storage at high temperature and high humidity is +100% or more and less than ±1,000%.
C: Change rate of resistance value after storage at high temperature and high humidity is ±1,000% or more and ±less than 10,000%.
D: Change rate of resistance value after storage at high temperature and high humidity is ±10.000% or more.

The configuration and evaluation results of the transparent electrodes are shown in Table I below.

TABLE I

| Transparent electrode No. | Substrate | Underlying organic layer (Resin type, Exemplified compound No.) | Added amount of Exemplified compound [% by mass] | Nanowire (NW) layer | Upper organic layer (Resin type, Exemplified compound No.) | Added amount of Exemplified compound [% by mass] | Sheet resistance value [Ω/sq.] | Optical transmittance [%] | *1 | Remarks |
|---|---|---|---|---|---|---|---|---|---|---|
| 101 | Glass | — | — | AgNW | — | — | 120 | 70.4 | D | Comparative Example |
| 102 | Glass | Polyimide resin | — | AgNW | — | — | 106 | 29.5 | D | Comparative Example |
| 103 | Glass | Acrylic resin | — | AgNW | — | — | 129 | 61.5 | D | Comparative Example |
| 104 | Glass | (2) – 2 | — | AgNW | — | — | 80 | 79.1 | B | Present Invention |
| 105 | Glass | (2) – 3 | — | AgNW | — | — | 84 | 75.2 | B | Present Invention |
| 106 | Glass | (2) – 22 | — | AgNW | — | — | 85 | 76.2 | B | Present Invention |
| 107 | Glass | (2) – 46 | — | AgNW | — | — | 79 | 78.8 | B | Present Invention |
| 108 | Glass | (2) – 60 | — | AgNW | — | — | 79 | 79.2 | B | Present Invention |
| 109 | Glass | (3) – 12 | — | AgNW | — | — | 77 | 78.0 | B | Present Invention |
| 110 | Glass | (4) – 25 | — | AgNW | — | — | 92 | 72.4 | B | Present Invention |
| 111 | Glass | (6) – 20 | — | AgNW | — | — | 85 | 75.1 | B | Present Invention |
| 112 | Glass | (6) – 32 | — | AgNW | — | — | 86 | 76.3 | B | Present Invention |
| 113 | Glass | (6) – 48 | — | AgNW | — | — | 83 | 77.9 | B | Present Invention |
| 114 | Glass | Polyimide resin + (2) – 2 | 5.0 | AgNW | — | — | 72 | 38 4 | B | Present Invention |
| 115 | Glass | Polyimide resin + (2) – 3 | 5.0 | AgNW | — | — | 76 | 34.1 | B | Present Invention |
| 116 | Glass | Polyimide resin + (2) – 22 | 5.0 | AgNW | — | — | 75 | 33.6 | B | Present Invention |
| 117 | Glass | Polyimide resin + (2) – 46 | 5.0 | AgNW | — | — | 73 | 40.3 | B | Present Invention |
| 118 | Glass | Polyimide resin + (2) – 60 | 5.0 | AgNW | — | — | 73 | 39.1 | B | Present Invention |
| 119 | Glass | Polyimide resin + (3) – 12 | 5.0 | AgNW | — | — | 77 | 40.2 | B | Present Invention |
| 120 | Glass | Polyimide resin + (4) – 25 | 5.0 | AgNW | — | — | 84 | 30.6 | B | Present Invention |
| 121 | Glass | Polyimide resin + (6) – 20 | 5.0 | AgNW | — | — | 80 | 36.0 | B | Present Invention |
| 122 | Glass | Polyimide resin + (6) – 32 | 5.0 | AgNW | — | — | 78 | 36.2 | B | Present Invention |

TABLE I-continued

| Transparent electrode No. | Substrate | Underlying organic layer (Resin type, Exemplified compound No.) | Added amount of Exemplified compound [% by mass] | Nanowire (NW) layer | Upper organic layer (Resin type, Exemplified compound No.) | Added amount of Exemplified compound [% by mass] | Sheet resistance value [Ω/sq.] | Optical transmittance [%] | *1 | Remarks |
|---|---|---|---|---|---|---|---|---|---|---|
| 123 | Glass | Polyimide resin + (6) – 48 | 5.0 | AgNW | — | — | 77 | 35.9 | B | Present Invention |
| 124 | Glass | Acrylic resin + (2) – 2 | 5.0 | AgNW | — | — | 81 | 14.0 | B | Present Invention |
| 125 | Glass | Acrylic resin + (2) – 3 | 5.0 | AgNW | — | — | 85 | 68.0 | B | Present Invention |
| 126 | Glass | Acrylic resin + (2) – 22 | 5.0 | AgNW | — | — | 86 | 67.0 | B | Present Invention |
| 127 | Glass | Acrylic resin + (2) – 46 | 5.0 | AgNW | — | — | 82 | 68.0 | B | Present Invention |
| 128 | Glass | Acrylic resin + (2) – 60 | 5.0 | AgNW | — | — | 79 | 70.2 | B | Present Invention |
| 129 | Glass | Acrylic resin + (3) – 12 | 5.0 | AgNW | — | — | 81 | 69.6 | B | Present Invention |
| 130 | Glass | Acrylic resin + (4) – 25 | 5.0 | AgNW | — | — | 91 | 61.6 | B | Present Invention |
| 131 | Glass | Acrylic resin + (6) – 20 | 5.0 | AgNW | — | — | 81 | 65.6 | B | Present Invention |
| 132 | Glass | Acrylic resin + (6) – 32 | 5.0 | AgNW | — | — | 84 | 66.8 | B | Present Invention |
| 133 | Glass | Acrylic resin + (6) – 48 | 5.0 | AgNW | — | — | 86 | 67.3 | B | Present Invention |
| 134 | Glass | Acrylic resin + (2) – 60 | 0.5 | AgNW | — | — | 88 | 65.3 | C | Present Invention |
| 135 | Glass | Acrylic resin + (2) – 60 | 1.0 | AgNW | — | — | 85 | 70.9 | B | Present Invention |
| 136 | Glass | Acrylic resin + (2) – 60 | 2.5 | AgNW | — | — | 81 | 71.3 | B | Present Invention |
| 137 | Glass | Acrylic resin + (2) – 60 | 10.0 | AgNW | — | — | 81 | 69.5 | B | Present Invention |
| 138 | Glass | Acrylic resin + (2) – 60 | 20.0 | AgNW | — | — | 88 | 68.1 | C | Present Invention |

*1: Resistance value after driving at 85° C./85% RH

From the results shown in Table I it was found that by forming an organic layer containing a nitrogen-containing aromatic heterocyclic compound according to the present invention to an Ag nanowire layer of the present invention, both low resistance and high light transmittance were achieved, and a transparent electrode having high storage stability was obtained even under high temperature and high humidity.

Example 2

In the transparent electrodes 103, 104, and 124 prepared in Example 1 the transparent electrodes 201 to 226 were prepared in the same manner except that the organic layer formed as the lower layer was formed as the upper layer as shown in Table II, and the same evaluation as in Example 1 was performed.

The composition and evaluation results of the transparent electrodes are shown in Table II below.

TABLE II

| Transparent electrode No. | Substrate | Underlying organic layer (Resin type, Exemplified compound No.) | Added amount of Exemplified compound [% by mass] | Nanowire (NW) layer | Upper organic layer (Resin type, Exemplified compound No.) | Added amount of Exemplified compound [% by mass] | Sheet resistance value [Ω/sq.] | Optical transmittance [%] | *1 | Remarks |
|---|---|---|---|---|---|---|---|---|---|---|
| 101 | Glass | — | — | AgNW | — | — | 120 | 70.4 | D | Comparative Example |
| 201 | Glass | — | — | AgNW | Acrylic resin | — | 121 | 66.8 | D | Comparative Example |
| 202 | Glass | — | — | AgNW | (2) – 4 | — | 121 | 68.5 | A | Present Invention |
| 203 | Glass | — | — | AgNW | (2) – 8 | — | 116 | 71.4 | A | Present Invention |
| 204 | Glass | — | — | AgNW | (2) – 21 | — | 119 | 67.8 | A | Present Invention |
| 205 | Glass | — | — | AgNW | (2) – 44 | — | 118 | 68.1 | A | Present Invention |
| 206 | Glass | — | — | AgNW | (2) – 62 | — | 114 | 72.1 | A | Present Invention |
| 207 | Glass | — | — | AgNW | (3) – 8 | — | 112 | 64.1 | A | Present Invention |
| 208 | Glass | — | — | AgNW | (3) – 15 | — | 111 | 69.3 | A | Present Invention |
| 209 | Glass | — | — | AgNW | (4) – 6 | — | 110 | 71.1 | A | Present Invention |
| 210 | Glass | — | — | AgNW | (4) – 19 | — | 113 | 68.5 | A | Present Invention |
| 211 | Glass | — | — | AgNW | (6) – 48 | — | 109 | 70.5 | A | Present Invention |
| 212 | Glass | — | — | AgNW | Acrylic resin + (2) – 4 | 5.0 | 108 | 68.5 | A | Present Invention |
| 213 | Glass | — | — | AgNW | Acrylic resin + (2) – 8 | 5.0 | 106 | 70.3 | A | Present Invention |
| 214 | Glass | — | — | AgNW | Acrylic resin + (2) – 21 | 5.0 | 108 | 67.3 | A | Present Invention |
| 215 | Glass | — | — | AgNW | Acrylic resin + (2) – 44 | 5.0 | 106 | 68.0 | A | Present Invention |
| 216 | Glass | — | — | AgNW | Acrylic resin + (2) – 62 | 5.0 | 118 | 71.0 | A | Present Invention |
| 217 | Glass | — | — | AgNW | Acrylic resin + (3) – 8 | 5.0 | 117 | 64.8 | A | Present Invention |
| 218 | Glass | — | — | AgNW | Acrylic resin + (3) – 15 | 5.0 | 113 | 71.7 | A | Present Invention |
| 219 | Glass | — | — | AgNW | Acrylic resin + (4) – 6 | 5.0 | 107 | 69.9 | A | Present Invention |
| 220 | Glass | — | — | AgNW | Acrylic resin + (4) – 19 | 5.0 | 114 | 10.4 | A | Present Invention |
| 221 | Glass | — | — | AgNW | Acrylic resin + (6) – 48 | 5.0 | 112 | 69.4 | A | Present Invention |
| 222 | Glass | — | — | AgNW | Acrylic resin + (6) – 48 | 0.5 | 116 | 66.2 | A | Present Invention |
| 223 | Glass | — | — | AgNW | Acrylic resin + (6) – 48 | 1.0 | 114 | 69.0 | A | Present Invention |
| 224 | Glass | — | — | AgNW | Acrylic resin + (6) – 48 | 2.5 | 111 | 69.3 | A | Present Invention |

TABLE II-continued

| Transparent electrode No. | Substrate | Underlying organic layer (Resin type, Exemplified compound No.) | Added amount of Exemplified compound [% by mass] | Nano-wire (NW) layer | Upper organic layer (Resin type, Exemplified compound No.) | Added amount of Exemplified compound [% by mass] | Sheet resistance value [Ω/sq.] | Optical transmittance [%] | *1 | Remarks |
|---|---|---|---|---|---|---|---|---|---|---|
| 225 | Glass | — | — | AgNW | Acrylic resin + (6) – 48 | 10.0 | 113 | 67.9 | A | Present Invention |
| 226 | Glass | — | — | AgNW | Acrylic resin + (6) – 48 | 20.0 | 112 | 67.4 | A | Present Invention |

*1: Resistance value after driving at 85° C./85% RH

From the results in Table II, it was found that by forming an organic layer containing a nitrogen-containing aromatic heterocyclic compound according to the present invention as an upper layer to an Ag nanowire layer of the present invention, both low resistance and high light transmission were achieved, and a transparent electrode having higher storage stability was obtained even under high temperature and high humidity.

Example 3

In the transparent electrodes 102, 103, 104, 114 and 124 produced in Example 1, transparent electrodes 301 to 330 were prepared in the same manner and evaluated in the same manner as in Example 1, except that the organic layer formed as the lower layer was formed as the lower layer and the upper layer as shown in Table III.

The composition and evaluation results of the transparent electrodes are shown in Table III below.

TABLE III

| Transparent electrode No. | Substrate | Underlying organic layer (Resin type, Exemplified compound No.) | Added amount of Exemplified compound [% by mass] | Nano-wire (NW) layer | Upper organic layer (Resin type, Exemplified compound No.) | Added amount of Exemplified compound [% by wire] | Sheet resistance value [Ω/sq.] | Optical transmittance [%] | *1 | Remarks |
|---|---|---|---|---|---|---|---|---|---|---|
| 101 | Glass | — | — | AgNW | — | — | 120 | 70.4 | D | Comparative Example |
| 301 | Gass | Polyimide resin | — | AgNW | Acrylic resin | — | 108 | 29.8 | D | Comparative Example |
| 302 | Glass | Acrylic resin | — | AgNW | Acrylic resin | — | 130 | 63.2 | D | Comparative Example |
| 303 | Glass | (2) – 61 | — | AgNW | Acrylic resin | — | 76 | 80.2 | B | Present Invention |
| 304 | Glass | (3) – 8 | — | AgNW | Acrylic resin | — | 88 | 70.2 | B | Present Invention |
| 305 | Glass | (4) – 20 | — | AgNW | Acrylic resin | — | 79 | 75.3 | B | Present Invention |
| 306 | Glass | (6) – 48 | — | AgNW | Acrylic resin | — | 75 | 79.3 | B | Present Invention |
| 307 | Glass | (2) – 61 | — | AgNW | (6) – 48 | — | 75 | 80.2 | A | Present Invention |
| 308 | Glass | (3) – 8 | — | AgNW | (6) – 48 | — | 85 | 71.0 | A | Present Invention |
| 309 | Glass | (4) – 20 | — | AgNW | (6) – 48 | — | 80 | 76.4 | A | Present Invention |
| 310 | Glass | (6) – 48 | — | AgNW | (6) – 48 | — | 73 | 79.9 | A | Present Invention |
| 311 | Glass | (2) – 61 | — | AgNW | Acrylic resin + (4) – 22 | 5.0 | 72 | 79.3 | A | Present Invention |
| 312 | Glass | (3) – 8 | — | AgNW | Acrylic resin + (4) – 22 | 5.0 | 87 | 70.9 | A | Present Invention |
| 313 | Glass | (4) – 20 | — | AgNW | Acrylic resin + (4) – 22 | 5.0 | 79 | 75.5 | A | Present Invention |
| 314 | Glass | (6) – 48 | — | AgNW | Acrylic resin + (4) – 22 | 5.0 | 73 | 79.2 | A | Present Invention |
| 315 | Glass | Polyimide resin + (3) – 13 | 5.0 | AgNW | (6) – 48 | — | 75 | 33.2 | A | Present Invention |
| 316 | Glass | Polyimide resin + (4) – 42 | 5.0 | AgNW | (6) – 48 | — | 76 | 32.6 | A | Present Invention |
| 317 | Glass | Polvirnide resin + (5) – 11 | 5.0 | AgNW | (6) – 48 | — | 81 | 31.1 | A | Present Invention |
| 318 | Glass | Polyimide resin + (6) – 29 | 5.0 | AgNW | (6) – 48 | — | 73 | 34.4 | A | Present Invention |
| 319 | Glass | Polyimide resin + (3) – 13 | 5.0 | AgNW | Acrylic resin + (4) – 22 | 5.0 | 72 | 33.5 | A | Present Invention |
| 320 | Glass | Polyimide resin + (4) – 42 | 5.0 | AgNW | Acrylic resin + (4) – 22 | 5.0 | 80 | 32.6 | A | Present Invention |
| 321 | Glass | Polyimide resin + (5) – 11 | 5.0 | AgNW | Acrylic resin + (4) – 22 | 5.0 | 83 | 30.4 | A | Present Invention |
| 322 | Glass | Polyimide resin + (6) – 29 | 5.0 | AgNW | Acrylic resin + (4) – 22 | 5.0 | 73 | 35.5 | A | Present Invention |
| 323 | Glass | Acrylic resin + (2) – 93 | 5.0 | AgNW | (6) – 48 | — | 74 | 82.9 | A | Present Invention |
| 324 | Glass | Acrylic resin + (3) – 8 | 5.0 | AgNW | (6) – 48 | — | 83 | 74.3 | A | Present Invention |
| 325 | Glass | Acrylic resin + (3) – 10 | 5.0 | AgNW | (6) – 48 | — | 81 | 78.6 | A | Present Invention |
| 326 | Glass | Acrylic resin + (4) – 15 | 5.0 | AgNW | (6) – 48 | — | 77 | 81.4 | A | Present Invention |
| 327 | Glass | Acrylic resin + (2) – 93 | 5.0 | AgNW | Acrylic resin + (4) – 22 | 5.0 | 74 | 80.4 | A | Present Invention |
| 328 | Glass | Acrylic resin + (3) – 8 | 5.0 | AgNW | Acrylic resin + (4) – 22 | 5.0 | 85 | 73.7 | A | Present Invention |

TABLE III-continued

| Transparent electrode No. | Substrate | Underlying organic layer (Resin type, Exemplified compound No.) | Added amount of Exemplified compound [% by mass] | Nanowire (NW) layer | Upper organic layer (Resin type, Exemplified compound No.) | Added amount of Exemplified compound [% by wire] | Sheet resistance value [Ω/sq.] | Optical transmittance [%] | *1 | Remarks |
|---|---|---|---|---|---|---|---|---|---|---|
| 329 | Glass | Acrylic resin + (3) – 10 | 5.0 | AgNW | Acrylic resin + (4) – 22 | 5.0 | 81 | 75.8 | A | Present Invention |
| 330 | Glass | Acrylic resin + (4) – 15 | 5.0 | AgNW | Acrylic resin + (4) – 22 | 5.0 | 74 | 79.1 | A | Present Invention |

*1: Resistance value after driving at 85° C./85% RH

From the results of Table III, it was found that by forming an organic layer containing a nitrogen-containing aromatic heterocyclic compound of the present invention as a lower layer and an upper layer to an Ag nanowire layer of the present invention, both low resistance and high light transmittance were achieved, and a transparent electrode having higher stodge stability even under high temperature and high humidity was obtained.

Example 4

In the transparent electrodes 101 and 104 prepared in Example 1, the transparent electrodes 401 to 433 were prepared in the same manner except that the substrate was changed from glass to the following resin film and the organic layer formed as the lower layer was formed as the lower layer and the upper layer as shown in the surface IV, and the following bending resistance was added to carry out the same evaluation as in Example 1.

Note that the resin film used is as follows.

As the polyethylene terephthalate (PET) film, a Teleflex FT3 manufactured by Teijin Film Solution Co., Ltd., and a film thickness of 25 μm were used.

As the polyethylene naphthalate (PEN) film, Teonex Q51 manufactured by Teijin Film Solution Co., Ltd. and a film thickness of 25 μm were used.

As the poly imide (PI) film, TOMED Type S manufactured by I.S.T., Ltd., a film thickness of 25 μm was used.

(4) Change in Sheet Resistance Value Before and After Bending

The produced transparent electrode is wound around a plastic roller having a curvature of 6 mmφ so that the Ag nanowire layer or the upper layer forming surface is on the outside, and stored in an environment of 85° C. and 85% RH for 500 hours. The change in sheet resistance value before and after bending were evaluated based on the following evaluation criteria Levels A to C of the following evaluations were set to practically no problem.

A: Change rate of sheet resistance value after bending storage is less than ±5.0%.
B: Change rate of sheet resistance value after bending storage of ±5.0% or more and less than ±10%.
C: Change rate of sheet resistance value after bending storage of ±10% or more and less than ±20%.
D: Change rate of sheet resistance value after bending and storage is ±20% or more.

The composition and evaluation results of the transparent electrodes are shown in Table IV below.

TABLE IV

| Transparent electrode No. | Substrate (Film) | Underlying organic layer (Exemplified compound No.) | Nanowire (NW) layer | Upper organic layer (Exemplified compound No.) | Sheet resistance value [Ω/sq.] | Optical transmittance [%] | *1 | Change in resistance value before and after bending | Remarks |
|---|---|---|---|---|---|---|---|---|---|
| 401 | PET | — | AgNW | — | 140 | 68.1 | D | D | Comparative Example |
| 402 | PEN | — | AgNW | — | 139 | 68.3 | D | D | Comparative Example |
| 403 | PI | — | AgNW | — | 133 | 66.9 | C | C | Comparative Example |
| 404 | PET | (2) – 8 | AgNW | — | 87 | 70.2 | B | A | Present Invention |
| 405 | PEN | (2) – 8 | AgNW | — | 88 | 69.9 | B | A | Present Invention |
| 406 | PI | (2) – 8 | AgNW | — | 84 | 68.0 | B | A | Present Invention |
| 407 | PET | (2) – 20 | AgNW | — | 92 | 70.1 | B | A | Present Invention |
| 408 | PEN | (2) – 20 | AgNW | — | 94 | 70.0 | B | A | Present Invention |
| 409 | PI | (2) – 20 | AgNW | — | 95 | 68.5 | B | A | Present Invention |
| 410 | PET | (4) – 26 | AgNW | — | 103 | 68.2 | B | A | Present Invention |
| 411 | PEN | (4) – 26 | AgNW | — | 99 | 68.0 | B | A | Present Invention |
| 412 | PI | (4) – 26 | AgNW | — | 98 | 67.5 | B | A | Present Invention |
| 413 | PET | — | AgNW | (4) – 35 | 120 | 74.2 | A | B | Present Invention |
| 414 | PEN | — | AgNW | (4) – 35 | 121 | 74.2 | A | B | Present Invention |
| 415 | PI | — | AgNW | (4) – 35 | 111 | 71.1 | A | A | Present Invention |
| 416 | PET | — | AgNW | (4) – 41 | 121 | 71.4 | A | B | Present Invention |
| 417 | PEN | — | AgNW | (4) – 41 | 114 | 70.8 | A | B | Present Invention |
| 418 | PI | — | AgNW | (4) – 41 | 117 | 69.8 | A | B | Present Invention |
| 419 | PET | — | AgNW | (5) – 10 | 113 | 68.8 | A | B | Present Invention |
| 420 | PEN | — | AgNW | (5) – 10 | 116 | 69.4 | A | B | Present Invention |
| 421 | PI | — | AgNW | (5) – 10 | 113 | 68.1 | A | B | Present Invention |
| 422 | PET | (5) – 21 | AgNW | (3) – 9 | 82 | 68.6 | A | A | Present Invention |
| 423 | PEN | (5) – 21 | AgNW | (3) – 9 | 83 | 68.6 | A | A | Present Invention |
| 424 | PI | (5) – 21 | AgNW | (3) – 9 | 81 | 66.1 | A | A | Present Invention |
| 425 | PET | (6) – 11 | AgNW | (3) – 9 | 98 | 70.0 | A | A | Present Invention |
| 426 | PEN | (6) – 11 | AgNW | (3) – 9 | 96 | 69.3 | A | A | Present Invention |
| 427 | PI | (6) – 11 | AgNW | (3) – 9 | 98 | 66.9 | A | A | Present Invention |

TABLE IV-continued

| Transparent electrode No. | Substrate (Film) | Underlying organic layer (Exemplified compound No.) | Nanowire (NW) layer | Upper organic layer (Exemplified compound No.) | Sheet resistance value [Ω/sq.] | Optical transmittance [%] | *1 | Change in resistance value before and after bending | Remarks |
|---|---|---|---|---|---|---|---|---|---|
| 428 | PET | (5) – 21 | AgNW | (4) – 42 | 85 | 69.0 | A | A | Present Invention |
| 429 | PEN | (5) – 21 | AgNW | (4) – 42 | 86 | 67.9 | A | A | Present Invention |
| 430 | PI | (5) – 21 | AgNW | (4) – 42 | 82 | 67.9 | A | A | Present Invention |
| 431 | PET | (6) – 11 | AgNW | (4) – 42 | 101 | 68.5 | A | A | Present Invention |
| 432 | PEN | (6) – 11 | AgNW | (4) – 42 | 99 | 69.4 | A | A | Present Invention |
| 433 | PI | (6) – 11 | AgNW | (4) – 42 | 97 | 66.2 | A | A | Present Invention |

*1: Resistance value after driving at 85° C./85% RH

From the results in Table IV, it was found that by using a flexible resin film as a substrate and forming an organic layer containing a nitrogen-containing aromatic heterocyclic compound as a lower layer and an upper layer to an Ag nanowire layer of the present invention, both low resistance and high light transmission were achieved, and a transparent electrode having high stability even wider high temperature and high humidity, was obtained. Further, by using a resin substrate, a transparent electrode having flexibility was obtained, and by providing a transparent electrode, an electronic device having flexibility was manufactured.

INDUSTRIAL APPLICABILITY

The transparent electrode of the present invention has both low resistance and high optical transparency, and may be suitably used in various optoelectronic devices such as liquid crystal display elements, organic light-emitting elements, inorganic electroluminescent devices, electronic papers, organic solar cells, and inorganic solar cells, as well as in the fields of electromagnetic wave shielding, and touch panels.

DESCRIPTION OF SYMBOLS

1: Transparent electrode
2: Resin substrate
4: Metal nanowire layer
6: Organic layer
10: Organic EL element
12: Take-out electrode
14: Organic functional layer
16: Counter electrode
18: Sealing member

What is claimed is:

1. A transparent electrode having at least a conductive material layer on a transparent substrate,
wherein the conductive material layer is a metal nanowire layer, the metal nanowire layer is in contact with the transparent substrate, and the metal nanowire layer is formed intermittently on the transparent substrate; and
the transparent electrode has an organic layer containing a nitrogen-containing aromatic heterocyclic compound having a structure represented by the following Formula (1) adjacent to the metal nanowire layer,

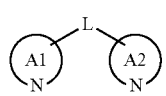

Formula (1)

in Formula (1), A1 and A2 represent a reside that forms a 6-membered nitrogen-containing aromatic heterocycle together with a nitrogen atom, and the 6-membered nitrogen-containing aromatic heterocycle may form a fused ring, L represents a single bond or a linking group derived from an aromatic hydrocarbon ring, an aromatic heterocycle or an alkyl group.

2. The transparent electrode described in claim 1, wherein the metal nanowire layer comprises a silver nanowire.

3. The transparent electrode described in claim 1, wherein a wire length of the metal nanowire layer is 1.0 μm or more.

4. The transparent electrode described in claim 1, wherein a wire diameter of the metal nanowire layer is 100 nm or less.

5. The transparent electrode described in claim 1, wherein an aspect ratio of the wire of the metal nanowire layer is 100 or more.

6. The transparent electrode described in claim 1, wherein the nitrogen-containing aromatic heterocyclic compound has a structure represented by the following Formula (2),

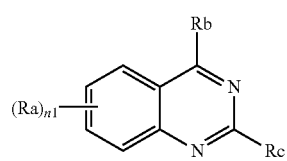

Formula (2)

in Formula (2), Ra, Rb and Rc each independently represents a hydrogen atom or a substituent, n1 represents an integer of 1 to 4, provided that a linking position with the linking group L in the above Formula (1) is a substitutable position on a substituent represented by Ra, Rb and Rc, or a substitutable position other than a position where Ra, Rb and Rc are present as a substituent in a quinazoline ring.

7. The transparent electrode described in claim 1, wherein the nitrogen-containing aromatic heterocyclic compound has a structure represented by the following Formula (3),

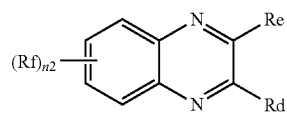

Formula (3)

in Formula (3), Re, Rd and Rf each independently represents a hydrogen atom or a substituent, n2 represents an integer of 1 to 4, provided that a linking position with the linking group L in the above Formula (1) is a substitutable position on a substituent represented by Re, Rd and Rf, or a substitutable position other than a position where Re, Rd and Rf are present as a substituent in a quinoxaline ring.

8. The transparent electrode described in claim 1, wherein the nitrogen-containing aromatic heterocyclic compound has a structure represented by the following Formula (4),

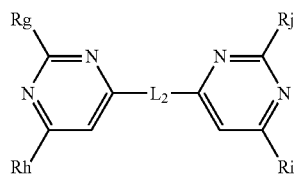

Formula (4)

in Formula (4), Rg, Rh, Ri and Rj each independently represents a hydrogen atom or a substituent, at least one of Rg, Rh, Ri or Rj represents a 6-membered aromatic heterocycle, and the 6-membered aromatic heterocycle may form a fused ring, $L_2$ represents a single bond or a linking group derived from an aromatic hydrocarbon ring, an aromatic heterocycle or an alkyl group.

9. The transparent electrode described in claim 1, wherein the nitrogen-containing aromatic heterocyclic compound has a structure represented by the following Formula (5), Ar-(Rk)$_{n3}$   Formula (5)

in Formula (5), Ar represents a residue of carbazole, dibenzofuran, azadibenzofuran, dibenzothiophene, azadibenzothiophene, azacarbazole, naphthalene, anthracene, phenanthrene or fluorene, Rk represents a hydrogen atom or a substituent, at least 2 of Rks represent a 6-membered aromatic heterocycle, and the 6-membered aromatic heterocycle may form a fused ring, n3 represents 2 or more.

10. The transparent electrode described in claim 1, wherein the nitrogen-containing aromatic heterocyclic compound has a structure represented by the following Formula (6),

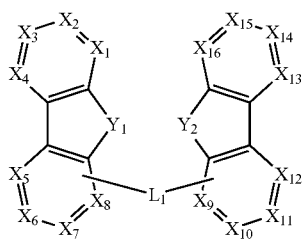

Formula (6)

in Formula (6), $Y_1$ and $Y_2$ represent O, S or N—$R_1$, $X_1$ to $X_{16}$ represent C—$R_2$ or N, at least 2 of $X_1$ to $X_{16}$ represent N, $L_1$ represents a single bond, an aromatic hydrocarbon ring, an aromatic heterocycle or an alkyl group, $R_1$ and $R_2$ represent an aromatic hydrocarbon ring, an aromatic heterocycle or an alkyl group.

11. An electronic device comprising the transparent electrode described in claim 1.

* * * * *